US011670605B2

(12) United States Patent
Noori et al.

(10) Patent No.: US 11,670,605 B2
(45) Date of Patent: Jun. 6, 2023

(54) RF AMPLIFIER DEVICES INCLUDING INTERCONNECT STRUCTURES AND METHODS OF MANUFACTURING

(71) Applicant: Wolfspeed, Inc., Durham, NC (US)

(72) Inventors: Basim Noori, San Jose, CA (US); Marvin Marbell, Morgan Hill, CA (US); Scott Sheppard, Chapel Hill, NC (US); Kwangmo Chris Lim, San Jose, CA (US); Alexander Komposch, Morgan Hill, CA (US); Qianli Mu, San Jose, CA (US)

(73) Assignee: Wolfspeed, Inc., Durham, NC (US)

( * ) Notice: Subject to any disclaimer, the term of this patent is extended or adjusted under 35 U.S.C. 154(b) by 267 days.

(21) Appl. No.: 16/906,610

(22) Filed: Jun. 19, 2020

(65) Prior Publication Data

US 2021/0313282 A1    Oct. 7, 2021

Related U.S. Application Data

(60) Provisional application No. 63/004,765, filed on Apr. 3, 2020.

(51) Int. Cl.
    *H01L 23/66*    (2006.01)
    *H03F 1/08*    (2006.01)
    *H03F 3/195*    (2006.01)

(52) U.S. Cl.
    CPC .............. *H01L 23/66* (2013.01); *H03F 1/086* (2013.01); *H03F 3/195* (2013.01);
    (Continued)

(58) Field of Classification Search
    CPC ............. H01L 23/66; H01L 2223/6616; H01L 2223/6655; H01L 29/41758;
    (Continued)

(56) References Cited

U.S. PATENT DOCUMENTS

| 4,946,547 A | 8/1990 | Palmour et al. |
| 5,192,987 A | 3/1993 | Khan et al. |

(Continued)

FOREIGN PATENT DOCUMENTS

| CA | 2511005 C | 5/2016 |
| CN | 1757119 B | 2/2011 |

(Continued)

OTHER PUBLICATIONS

"Notification of Transmittal of the International Search Report and the Written Opinion of the International Searching Authority, or the Declaration for corresponding International Application No. PCT/US2021/034231, dated Oct. 8, 2021, (15 pages)".

(Continued)

*Primary Examiner* — Duy T Nguyen
(74) *Attorney, Agent, or Firm* — Myers Bigel, P.A.

(57) ABSTRACT

A transistor amplifier includes a group III-nitride based amplifier die including a gate terminal, a drain terminal, and a source terminal on a first surface of the amplifier die and an interconnect structure electrically bonded to the gate terminal, drain terminal and source terminal of the amplifier die on the first surface of the amplifier die and electrically bonded to an input path and output path of the transistor amplifier.

21 Claims, 30 Drawing Sheets

(52) U.S. Cl.
CPC .............. *H01L 2223/6616* (2013.01); *H01L 2223/6655* (2013.01); *H03F 2200/451* (2013.01)

(58) Field of Classification Search
CPC .......... H01L 23/4334; H01L 23/49531; H01L 23/142; H01L 23/13; H01L 2223/6644; H01L 24/10; H01L 25/16; H01L 23/047; H01L 24/16; H01L 24/17; H01L 24/32; H01L 24/73; H01L 2224/0401; H01L 2224/04105; H01L 2224/0603; H01L 2224/06181; H01L 2224/16225; H01L 2224/16235; H01L 2224/17107; H01L 2224/32245; H01L 2224/48091; H01L 2224/73259; H01L 2224/73265; H01L 2924/19105; H01L 2924/19107; H01L 2924/15192; H01L 2924/15313; H01L 2924/1533; H01L 2924/16251; H01L 2224/73253; H01L 2924/1532; H01L 2924/181; H01L 2924/18161; H03F 1/086; H03F 3/195; H03F 2200/451
USPC .......................................................... 257/728
See application file for complete search history.

(56) References Cited

U.S. PATENT DOCUMENTS

| | | | |
|---|---|---|---|
| 5,200,022 A | 4/1993 | Kong et al. | |
| 5,210,051 A | 5/1993 | Carter, Jr. | |
| 5,296,395 A | 3/1994 | Khan et al. | |
| 5,393,993 A | 2/1995 | Edmond et al. | |
| 5,523,589 A | 6/1996 | Edmond et al. | |
| 6,218,680 B1 | 4/2001 | Carter, Jr. et al. | |
| 6,316,793 B1 | 11/2001 | Sheppard et al. | |
| 6,426,525 B1* | 7/2002 | Brindle ............. | H01L 29/41758 257/E29.127 |
| 6,548,333 B2 | 4/2003 | Smith | |
| 6,825,559 B2 | 11/2004 | Mishra et al. | |
| 7,030,428 B2 | 4/2006 | Saxler | |
| 7,135,766 B1 | 11/2006 | Costa et al. | |
| 7,354,782 B2 | 4/2008 | Mishra et al. | |
| 7,544,963 B2 | 6/2009 | Saxler | |
| 7,548,112 B2 | 6/2009 | Sheppard | |
| 7,592,211 B2 | 9/2009 | Sheppard et al. | |
| 7,615,774 B2 | 11/2009 | Saxler | |
| 7,709,269 B2 | 5/2010 | Smith et al. | |
| 7,851,909 B2 | 12/2010 | Mishra et al. | |
| 7,906,799 B2 | 3/2011 | Sheppard et al. | |
| 8,274,159 B2 | 9/2012 | Mishra et al. | |
| 8,803,313 B2 | 8/2014 | Mishra et al. | |
| 9,226,383 B2 | 12/2015 | Mishra et al. | |
| 9,515,011 B2 | 12/2016 | Wood et al. | |
| 9,947,616 B2 | 4/2018 | Wood et al. | |
| 34,861 A1 | 7/2018 | Kehler et al. | |
| 10,147,686 B1* | 12/2018 | Lessard ................... | H03F 3/195 |
| 10,483,352 B1 | 11/2019 | Mokhti et al. | |
| 2001/0038310 A1 | 11/2001 | Olofsson et al. | |
| 2002/0066908 A1 | 6/2002 | Smith | |
| 2002/0167023 A1 | 11/2002 | Chavarkar et al. | |
| 2003/0102482 A1 | 6/2003 | Saxler | |
| 2004/0061129 A1 | 4/2004 | Saxler et al. | |
| 2006/0081985 A1 | 4/2006 | Beach et al. | |
| 2006/0226498 A1 | 10/2006 | Davies | |
| 2009/0256266 A1 | 10/2009 | Lao et al. | |
| 2010/0059791 A1 | 3/2010 | Takagi | |
| 2010/0059879 A1 | 3/2010 | Bielen | |
| 2012/0063097 A1 | 3/2012 | Reza et al. | |
| 2012/0104577 A1* | 5/2012 | Fukumura ........... | H01L 23/4951 257/666 |
| 2012/0168928 A1 | 7/2012 | Lao et al. | |
| 2012/0280755 A1 | 11/2012 | Wright | |
| 2014/0312458 A1 | 10/2014 | Ashrafzadeh et al. | |
| 2014/0346569 A1* | 11/2014 | Vielemeyer ......... | H01L 27/0281 257/195 |
| 2016/0087588 A1 | 3/2016 | Szymanowski et al. | |
| 2017/0271497 A1* | 9/2017 | Fayed ................... | H01L 29/205 |
| 2018/0090475 A1 | 3/2018 | Zuo et al. | |
| 2018/0122750 A1 | 5/2018 | Lu | |
| 2019/0057924 A1 | 2/2019 | Kim et al. | |
| 2019/0110358 A1 | 4/2019 | Mu et al. | |
| 2019/0149098 A1 | 5/2019 | Tanomura | |
| 2019/0181099 A1* | 6/2019 | Then ................... | H01L 29/2003 |
| 2019/0304887 A1 | 10/2019 | Ganesan et al. | |
| 2020/0075479 A1 | 3/2020 | Khalil et al. | |
| 2020/0219866 A1 | 7/2020 | Cabahug et al. | |
| 2020/0328721 A1 | 10/2020 | Nanan et al. | |
| 2021/0313293 A1 | 10/2021 | Noori et al. | |
| 2021/0376807 A1 | 12/2021 | Lim et al. | |
| 2022/0084950 A1 | 3/2022 | Noori et al. | |

FOREIGN PATENT DOCUMENTS

| | | |
|---|---|---|
| CN | 204946885 U | 1/2016 |
| EP | 2518764 A2 | 10/2012 |
| EP | 2947472 A1 | 11/2015 |
| EP | 3629373 A1 | 4/2020 |
| EP | 3855486 A1 | 7/2021 |
| JP | 4830092 B2 | 9/2011 |
| JP | 2020507230 A | 3/2020 |
| KR | 101288153 B1 | 7/2013 |
| KR | 101371907 B1 | 3/2014 |
| TW | I333278 B | 11/2010 |
| WO | 9954935 A1 | 10/1999 |
| WO | 2004061973 A1 | 7/2004 |
| WO | 2009097564 A1 | 8/2009 |
| WO | 2019097564 A1 | 5/2019 |
| WO | 2020100219 A1 | 5/2020 |

OTHER PUBLICATIONS

A schematic of Yole development vertical packaging (1 page) (2014).
Dumé, Isabelle "Nanowires give vertical transistors a boost" Physics World, Semiconductors and Electronics Research Update (2 pages) (Aug. 2, 2012).
Ramesh, S. "Laying Foundations For Vertical Transistor Manufacture" Compound Semiconductor (12 pages) (Sep. 20, 2018).
The definition of Redistribution Layers (RDLs), https://semiengineering.com/knowledge_centers/packaging/redistribution-layers-rdls/ (2022).
U.S. Appl. No. 63/004,985, filed Apr. 3, 2020.

* cited by examiner

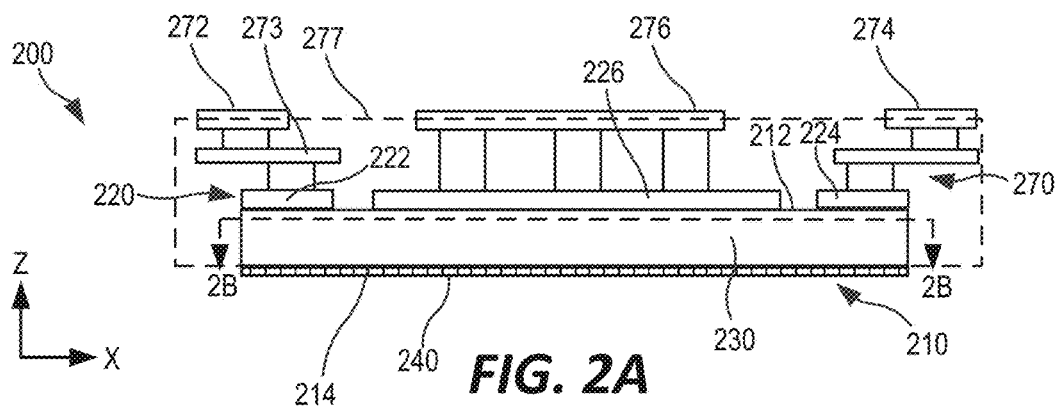
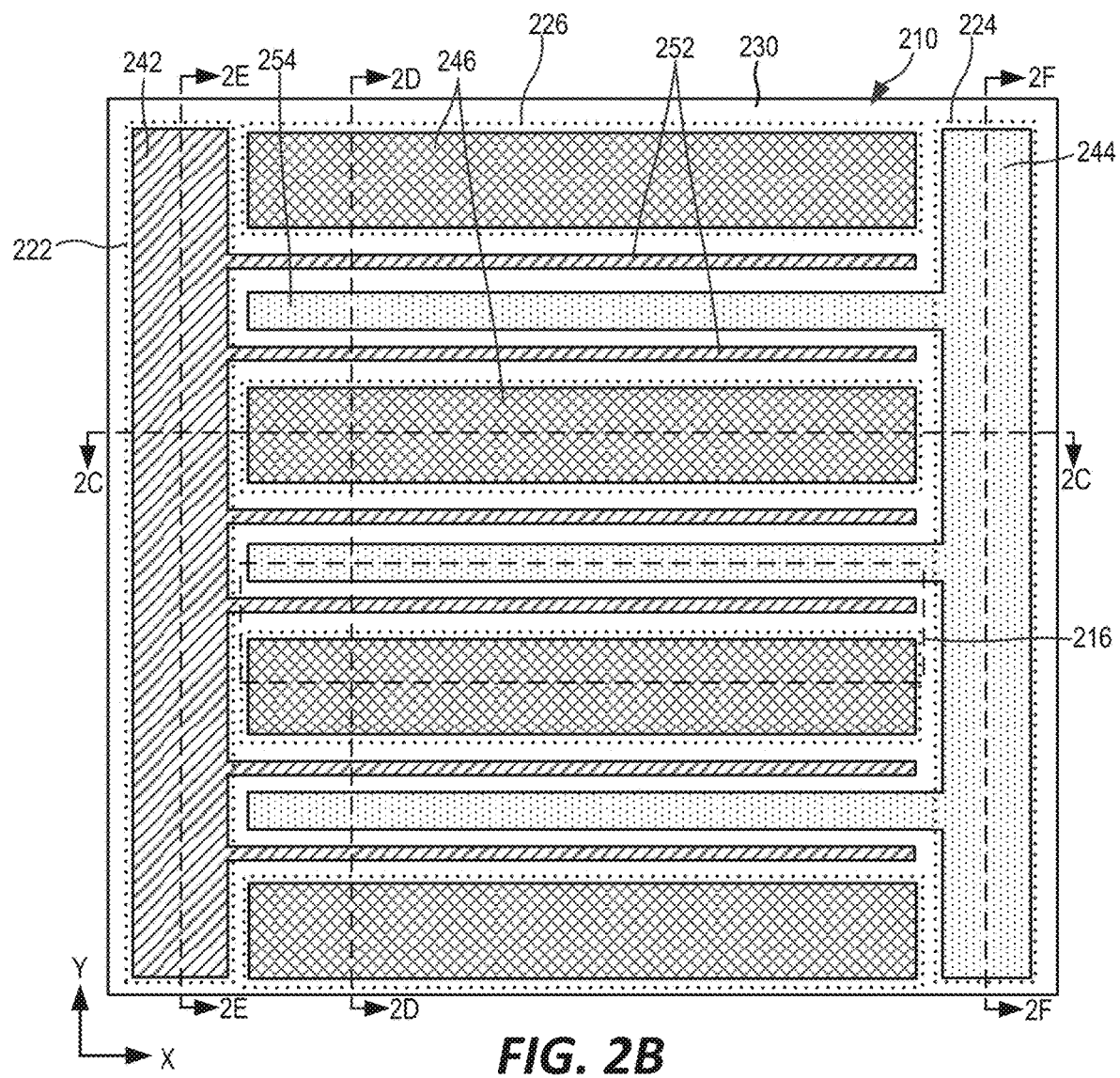

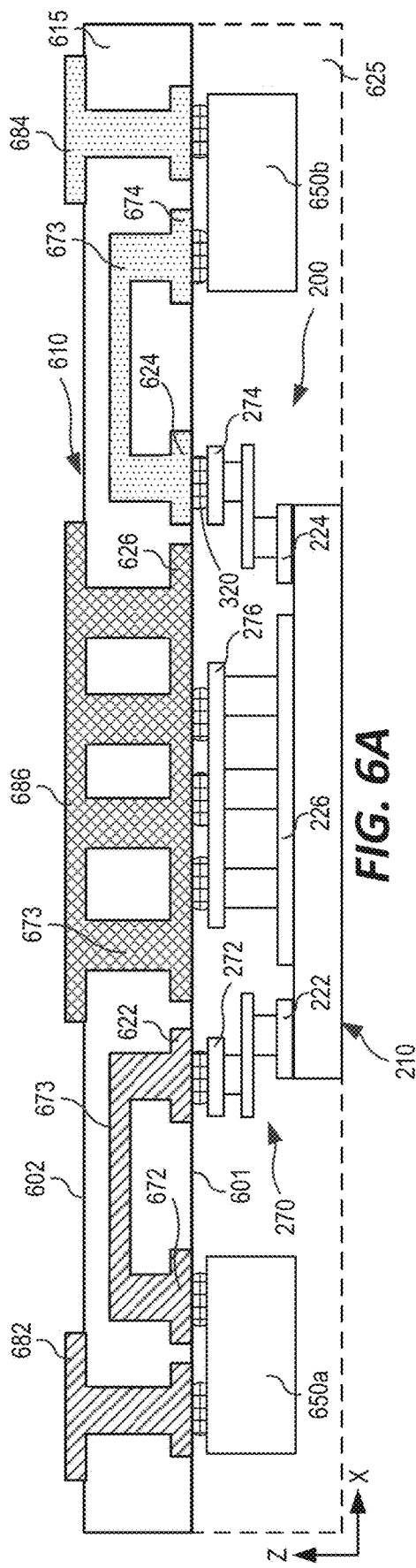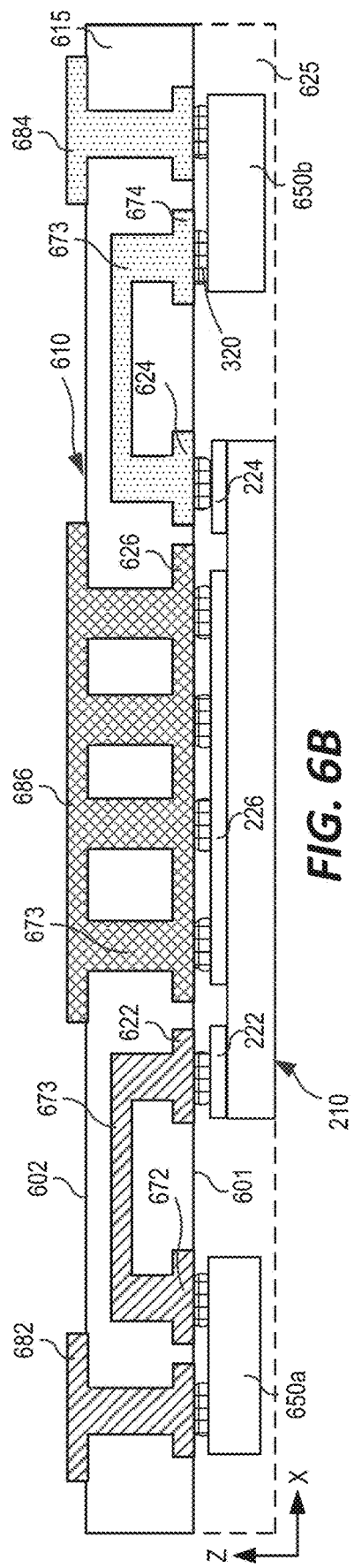
FIG. 6A
FIG. 6B

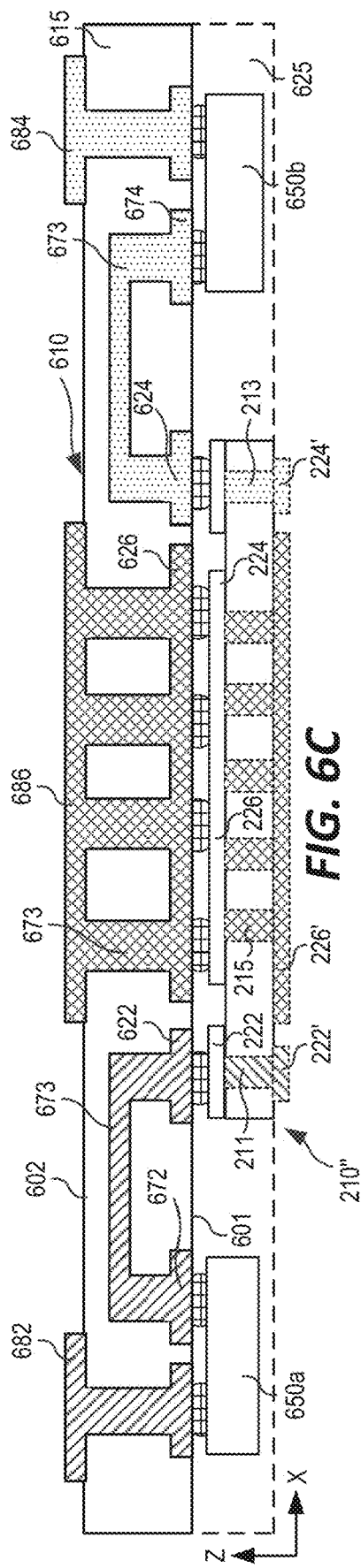

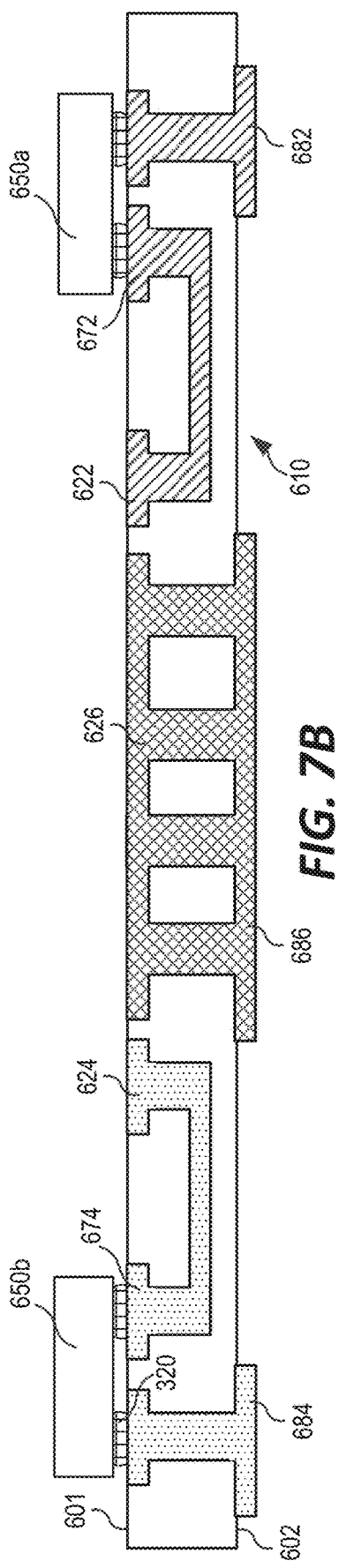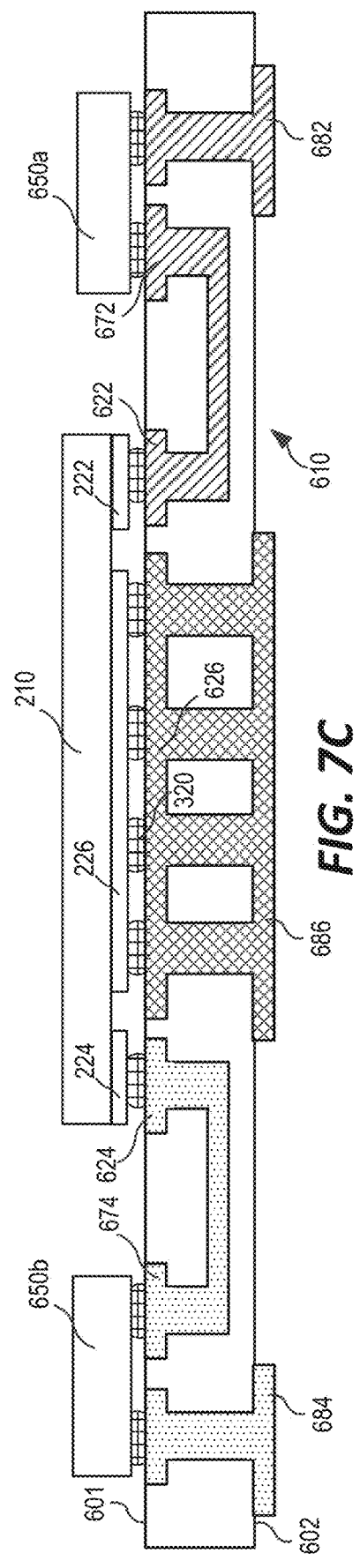

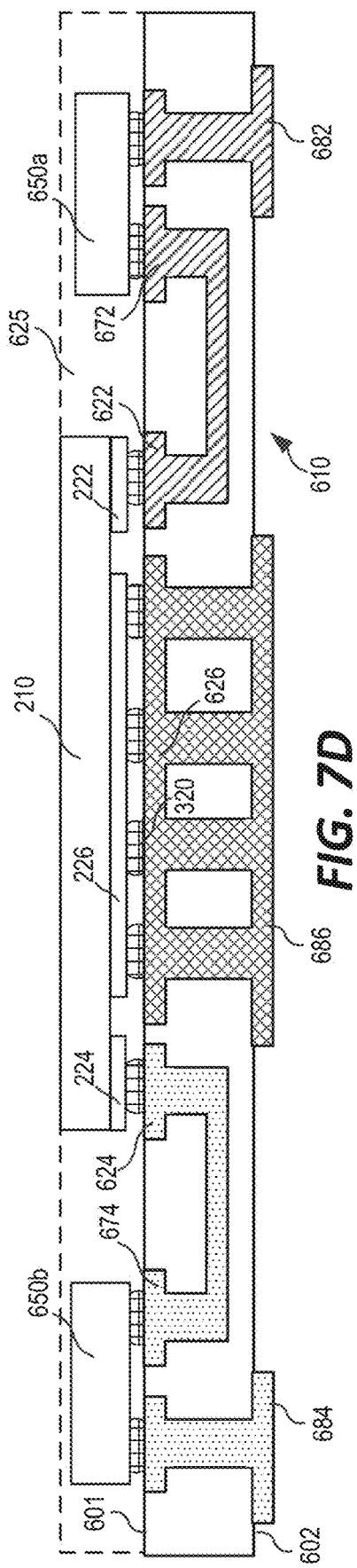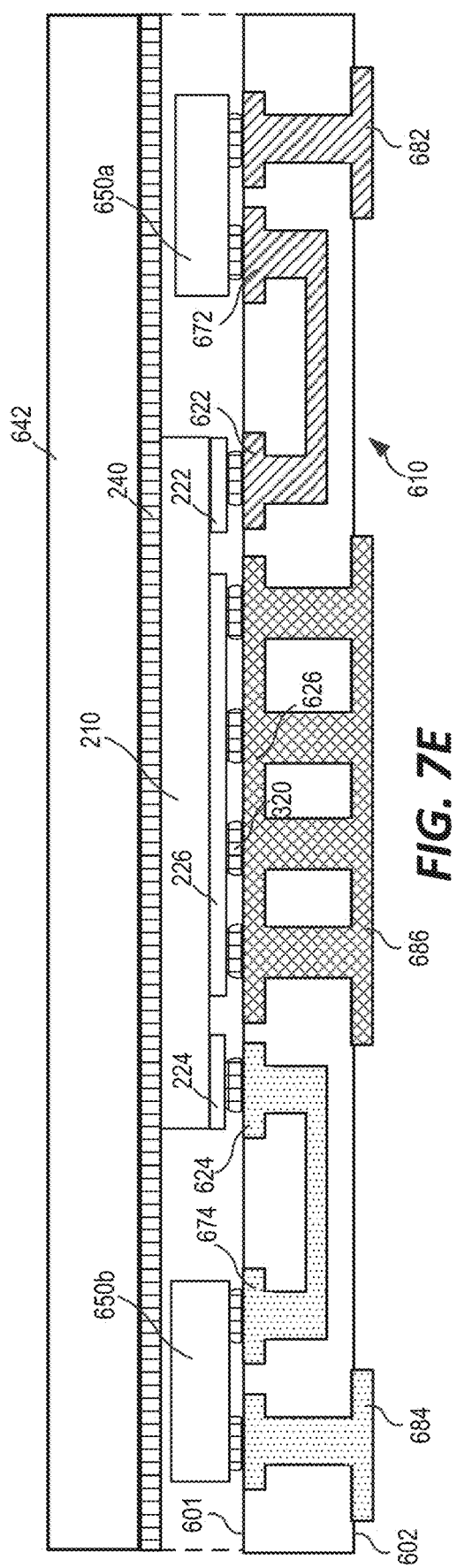

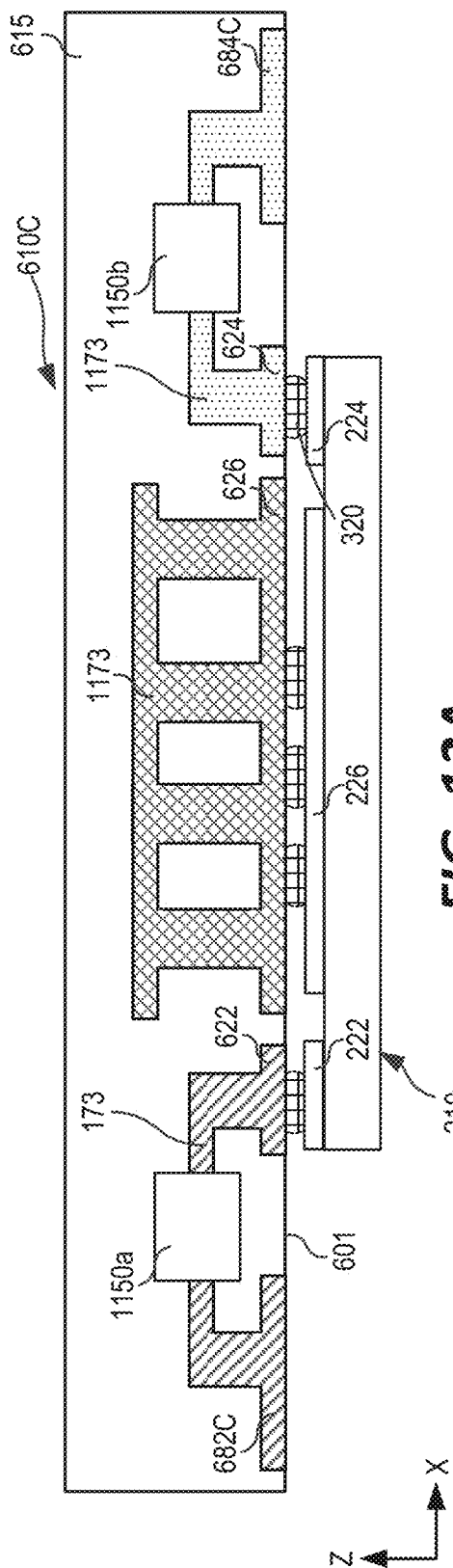
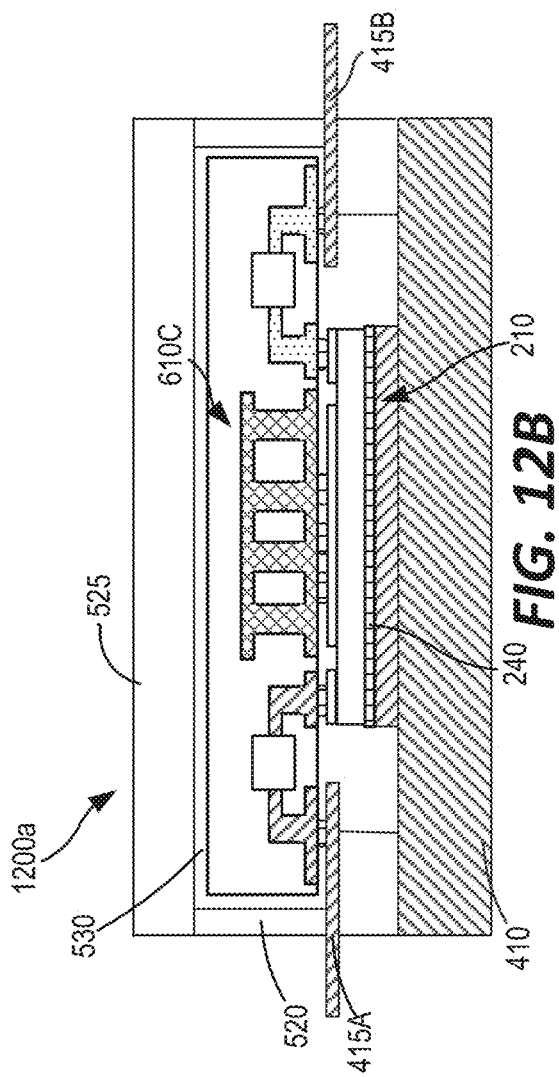
FIG. 12A
FIG. 12B

RF AMPLIFIER DEVICES INCLUDING INTERCONNECT STRUCTURES AND METHODS OF MANUFACTURING

CROSS-REFERENCE TO RELATED APPLICATION

The present application claims priority under 35 U.S.C. § 119 to U.S. Provisional Patent Application Ser. No. 63/004,765, filed Apr. 3, 2020, the content of which is incorporated herein by reference as if set forth in its entirety.

FIELD

The present disclosure is directed to integrated circuit devices, and more particularly, to structures for integrated circuit device packaging.

BACKGROUND

RF power amplifiers are used in a variety of applications such as base stations for wireless communication systems, multi-stage and multiple-path amplifiers (e.g., Doherty amplifiers), etc. The signals amplified by the RF power amplifiers often include signals that have a modulated carrier having frequencies in the megahertz (MHz) to gigahertz (GHz) range. For example, Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies). These RF transistor amplifiers may need to exhibit high reliability, good linearity and handle high output power levels.

Many RF power amplifier designs utilize semiconductor switching devices as amplification devices. Examples of these switching devices include power transistor devices, such as MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc.

RF amplifiers are typically formed as semiconductor integrated circuit chips. Most RF amplifiers are implemented in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF amplifiers are typically implemented using LDMOS transistors, and can exhibit high levels of linearity with relatively inexpensive fabrication. Group III nitride-based RF amplifiers are typically implemented using HEMTs, primarily in applications requiring high power and/or high frequency operation where LDMOS transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier dies are used, they may be connected in series and/or in parallel.

RF transistor amplifiers often include matching circuits, such as impedance matching circuits, that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonic products that may be generated during device operation such as second and third order harmonic products. The termination of the harmonic products also influences generation of intermodulation distortion products.

The RF amplifier transistor die(s) as well as the impedance matching and harmonic termination circuits may be enclosed in a device package. A die or chip may refer to a small block of semiconducting material or other substrate on which electronic circuit elements are fabricated. Integrated circuit packaging may refer to encapsulating one or more dies in a supporting case or package that protects the dies from physical damage and/or corrosion, and supports the electrical contacts for connection to external circuits. The input and output impedance matching circuits in an integrated circuit device package typically include LC networks that provide at least a portion of an impedance matching circuit that is configured to match the impedance of the active transistor die to a fixed value. Electrical leads may extend from the package to electrically connect the RF amplifier to external circuit elements such as input and output RF transmission lines and bias voltage sources.

Some conventional methods for assembling RF power devices may involve assembling the transistor die and some of the matching network components in a ceramic or overmolded package on a CPC (copper, copper-molybdenum, copper laminate structure) or copper flange. The transistor die, capacitors, and input/output leads may be interconnected with wires, such as gold and/or aluminum wires. Such an assembly process may be slow and sequential (e.g., one package bonded at a time), and assembly costs may be high (e.g., due to cost of gold wires and expensive wire-bond machines).

SUMMARY

According to some embodiments, a transistor amplifier includes a group III-nitride based amplifier die comprising a gate terminal, a drain terminal, and a source terminal on a first surface of the amplifier die, and an interconnect structure electrically bonded to the gate terminal, drain terminal and source terminal of the amplifier die on the first surface of the amplifier die and electrically bonded to an input path and output path of the transistor amplifier.

In some embodiments, the interconnect structure comprises a redistribution layer on the first surface of the amplifier die and a circuitry module electrically bonded to gate, drain and source connections on the redistribution layer.

In some embodiments, the circuitry module comprises circuitry comprising at least part of harmonic terminating circuitry, matching circuitry, splitting circuitry, combining circuitry, and/or biasing circuitry.

In some embodiments, the transistor amplifier further includes an input connection, an output connection, a ground connection, and a circuitry module comprising a gate connection electrically bonded to the input connection, a drain connection coupled to the output connection, and a source connection coupled to the ground connection.

In some embodiments, the amplifier die further includes a second surface that is opposite the first surface, the transistor amplifier further includes a carrier substrate, and the amplifier die is thermally coupled to the carrier substrate on the second surface of the amplifier die.

In some embodiments, the carrier substrate comprises metal.

In some embodiments, the interconnect structure comprises a circuitry module comprising a first side adjacent the first surface of the amplifier die and a second side opposite the first side, the input path comprises an input metal lead and the output path comprises an output metal lead, and the input metal lead and the output metal lead are electrically bonded on the first side or the second side of the circuitry module.

In some embodiments, a circuit element is on the second side and/or the first side of the circuitry module.

In some embodiments, a circuit element is formed within the circuitry module.

In some embodiments, an operating frequency of the transistor amplifier is between 500 MHz and 75 GHz In some embodiments, the transistor amplifier is at least partially encapsulated.

According to some embodiments, an RF transistor amplifier includes a semiconductor layer structure comprising a first major surface, a plurality of unit cell transistors on the first major surface that are electrically connected in parallel, the unit cell transistors comprising respective gate fingers coupled to a gate manifold, respective drain fingers coupled to a drain manifold, and respective source fingers, and a coupling element on the first major surface, the coupling element comprising a gate connection pad connected to the gate manifold, a drain connection pad connected to the drain manifold, and a source connection pad connected to the respective source fingers.

In some embodiments, the unit cell transistors extend in a first direction in the semiconductor layer structure, and the gate connection pad, the drain connection pad, and the source connection pad of the coupling element extend in a second direction that crosses the first direction.

In some embodiments, the coupling element is further configured to be coupled to an input matching circuit and/or an output matching circuit.

In some embodiments, the coupling element comprises a fan-out via structure.

In some embodiments, the semiconductor layer structure further comprises a second major surface, and the RF transistor amplifier further comprises a carrier substrate on the second major surface of the semiconductor layer structure.

In some embodiments, the RF transistor amplifier further includes a thermal conductive layer on the second major surface of the semiconductor layer structure between the semiconductor layer structure and the carrier substrate.

In some embodiments, the RF transistor amplifier further includes a circuitry module on the coupling element such that the coupling element is between the circuitry module and the semiconductor layer structure.

In some embodiments, the circuitry module comprises an input matching circuit and/or an output matching circuit.

In some embodiments, the circuitry module comprises a ground plane.

In some embodiments, the circuitry module comprises a first side adjacent the first major surface of the amplifier die and a second side opposite the first side.

In some embodiments, a circuit element is on the second side and/or the first side of the circuitry module.

In some embodiments, a circuit element is formed within the circuitry module.

In some embodiments, the circuitry module comprises an impedance matching circuitry and/or a harmonic termination circuit.

In some embodiments, the semiconductor layer structure further comprises a second major surface, and the semiconductor layer structure is free of a via on the second major surface.

In some embodiments, the semiconductor layer structure further comprises a Group III nitride.

In some embodiments, the semiconductor layer structure further comprises a silicon and/or silicon carbide substrate.

In some embodiments, the semiconductor layer structure further comprises a high electron mobility transistor (HEMT) or a laterally-diffused metal-oxide semiconductor (LDMOS) transistor.

According to some embodiments, an RF transistor amplifier includes an RF transistor amplifier die having a first major surface, the RF transistor amplifier die comprising a gate terminal, a drain terminal and a source terminal on the first major surface, a circuitry module on the first major surface of the RF transistor amplifier die, the circuitry module comprising a gate lead connection pad electrically coupled to the gate terminal and a drain lead connection pad electrically coupled to the drain terminal, an input lead extending from outside the RF transistor amplifier and electrically coupled to the gate lead connection pad, and an output lead extending from outside the RF transistor amplifier and electrically coupled to the drain lead connection pad.

In some embodiments, the circuitry module comprises a first side adjacent the first major surface of the RF transistor amplifier die and a second side opposite the first side, and the circuitry module comprises one or more circuit elements that are coupled between the gate terminal and the input lead and/or between the drain terminal and the output lead.

In some embodiments, the one or more circuit elements are mounted on the first side and/or second side of the circuitry module.

In some embodiments, the one or more circuit elements are formed within the circuitry module.

In some embodiments, the input lead and/or the output lead are coupled to the second side of the circuitry module.

In some embodiments, the input lead and/or the output lead are coupled to the first side of the circuitry module.

In some embodiments, the RF transistor amplifier further includes a coupling element between the amplifier die and the circuitry module.

In some embodiments, the RF transistor amplifier further includes a coupling element between the RF transistor amplifier die and the circuitry module, the coupling element having a bottom surface adjacent the first major surface of the RF transistor amplifier die and a top surface opposite the bottom surface. The top surface of the coupling element comprises a gate connection pad configured to be connected to a first interconnection pad of the circuitry module, a drain connection pad configured to be connected to a second interconnection pad of the circuitry module, and a source connection pad configured to be connected to a third interconnection pad of the circuitry module.

In some embodiments, the RF transistor amplifier die comprises a plurality of unit cell transistors on the first major surface that are electrically connected in parallel, each unit cell transistor extending in a first direction and comprising a gate finger coupled to a gate manifold, a drain finger coupled to a drain manifold, and a source finger opposite the gate finger from the drain finger.

In some embodiments, the RF transistor amplifier die further comprises a second major surface, and the RF transistor amplifier further comprises a carrier substrate on the second major surface of the RF transistor amplifier die.

In some embodiments, the RF transistor amplifier further includes a thermal conductive layer on the second major surface of the RF transistor amplifier die between the RF transistor amplifier die and the carrier substrate.

In some embodiments, the RF transistor amplifier further includes sidewalls and a lid. The carrier substrate, the sidewalls, and the lid define an internal cavity, and the RF transistor amplifier die is within the internal cavity.

In some embodiments, RF transistor amplifier further includes an overmold material on the circuitry module and RF transistor amplifier die.

In some embodiments, the circuitry module comprises an input matching circuit and/or an output matching circuit.

In some embodiments, the RF transistor amplifier die is a first RF transistor amplifier die, the gate terminal is a first gate terminal, the drain terminal is a first drain terminal, and the source terminal is a first source terminal, the RF transistor amplifier further comprises a second RF transistor amplifier die comprising a second gate terminal, a second drain terminal, and a second source terminal, and the circuitry module is electrically coupled to the second gate terminal, the second drain terminal, and the second source terminal.

In some embodiments, the RF transistor amplifier die is a Group III nitride-based RF transistor amplifier die.

In some embodiments, the RF transistor amplifier die comprises a high electron mobility transistor (HEMT) or a laterally-diffused metal-oxide semiconductor (LDMOS) transistor.

In some embodiments, an operating frequency of the RF transistor amplifier is in the R-band, S-band, X-band, Ku-band, K-band, Ka-band, and/or V-band.

According to some embodiments, an RF transistor amplifier includes a semiconductor layer structure comprising first and second major surfaces and a plurality of unit cell transistors on the first major surface that are electrically connected in parallel, each unit cell transistor comprising a gate finger coupled to a gate manifold, a drain finger coupled to a drain manifold, and a source finger, wherein the semiconductor layer structure is free of a via to the source fingers on the second major surface.

In some embodiments, the RF transistor amplifier further includes a coupling element on the first major surface, the coupling element comprising a gate connection pad configured to be connected to the gate manifold, a drain connection pad configured to be connected to the drain manifold, and a source connection pad configured to be connected to ones of the source fingers.

In some embodiments, the RF transistor amplifier further includes a carrier substrate on the second major surface of the semiconductor layer structure.

In some embodiments, the RF transistor amplifier further includes a thermal conductive layer on the second major surface of the semiconductor layer structure between the semiconductor layer structure and the carrier substrate.

In some embodiments, the RF transistor amplifier further includes a circuitry module on the semiconductor layer structure, the circuitry module comprising a gate lead connection pad electrically coupled to the gate manifold and a drain lead connection pad electrically coupled to the drain manifold In some embodiments, the RF transistor amplifier further includes an input lead that is electrically coupled to the gate lead connection pad, the input lead configured to extend externally from a package containing the RF transistor amplifier and an output lead that is electrically coupled to the drain lead connection pad, the output lead configured to extend externally from the package containing the RF transistor amplifier.

In some embodiments, the semiconductor layer structure further comprises a high electron mobility transistor (HEMT) or a laterally-diffused metal-oxide semiconductor (LDMOS) transistor.

According to some embodiments, a transistor amplifier includes a transistor amplifier die comprising a gate terminal, a drain terminal and a source terminal on a first surface of the transistor amplifier die, an input lead extending from outside the transistor amplifier and electrically coupled to the gate terminal, and an output lead extending from outside the transistor amplifier and electrically coupled to the drain terminal. A first electrical path from the input lead to the gate terminal is free of bond wires, and a second electrical path from the output lead to the drain terminal is free of bond wires.

In some embodiments, the transistor amplifier further includes a circuitry module electrically coupled between the input lead and the gate terminal, and the circuitry module is on the first surface of the transistor amplifier die.

In some embodiments, the transistor amplifier further includes a coupling element that is electrically coupled between the circuitry module and the gate terminal.

In some embodiments, the transistor amplifier further includes a bonding layer between the coupling element and the circuitry module.

In some embodiments, the bonding layer comprises solder.

In some embodiments, the transistor amplifier further includes a bonding layer between the input lead and the circuitry module.

In some embodiments, the transistor amplifier further includes a circuit element electrically coupled to the circuitry module.

In some embodiments, the circuit element is on a side of the circuitry module that is opposite the transistor amplifier die.

In some embodiments, the RF transistor amplifier die comprises a plurality of unit cell transistors that are electrically connected in parallel, the unit cell transistors comprising respective gate fingers coupled to a gate manifold, respective drain fingers coupled to a drain manifold, and respective source fingers, the gate terminal is electrically coupled to the gate manifold, and the drain terminal is electrically coupled to the gate manifold.

In some embodiments, the transistor amplifier further includes a plurality of conductive patterns between the gate manifold and the gate terminal.

In some embodiments, the transistor amplifier further includes a carrier substrate, wherein the carrier substrate is on a second surface of the transistor amplifier die.

According to some embodiments, a transistor amplifier includes a group III-nitride based amplifier die comprising a gate terminal, a drain terminal, and a source terminal on a first surface of the amplifier die and a circuitry module on and electrically coupled to the gate terminal, drain terminal and source terminal of the amplifier die on the first surface of the amplifier die. The circuitry module comprises one or more circuit elements that are coupled between the gate terminal and a first lead of the transistor amplifier and/or between the drain terminal and a second lead of the transistor amplifier, the circuitry module has a first surface and a second surface that is on an opposite side of the circuitry module from the first surface, and the first surface of the circuitry module is adjacent the first surface of the amplifier die.

In some embodiments, the one or more circuit elements are mounted on the first surface and/or second surface of the circuitry module.

In some embodiments, the one or more circuit elements are formed within the circuitry module.

In some embodiments, the first and/or second lead are coupled to the second surface of the circuitry module.

In some embodiments, the first and/or second lead are coupled to the first surface of the circuitry module.

In some embodiments, the circuitry module comprises a first interconnection pad and a second interconnection pad on the first surface of the circuitry module, the first interconnection pad is configured to be coupled to the gate terminal of the amplifier die, and the second interconnection pad is configured to be coupled to the drain terminal of the amplifier die.

In some embodiments, wherein the circuitry module comprises a third interconnection pad on the first surface of the circuitry module that is configured to be coupled to the source terminal of the amplifier die.

In some embodiments, the transistor amplifier further includes a coupling element between the amplifier die and the circuitry module.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 2A is a schematic side view of a Group III nitride-based RF transistor amplifier according to some embodiments of the present invention.

FIG. 2B is a schematic plan view of an RF transistor amplifier die that is part of the Group III nitride-based RF transistor amplifier of FIG. 2A, taken along line 2B-2B of FIG. 2A.

FIGS. 6A to 6C are schematic cross-sectional views of additional embodiments of an RF transistor amplifier coupled to a circuitry module, according to some embodiments of the present invention.

FIGS. 7A to 7E are schematic diagrams illustrating methods of coupling circuitry modules and RF transistor amplifier dies according to certain embodiments of the present invention.

FIGS. 12A to 12D are schematic cross-sectional views of additional embodiments of an RF transistor amplifier die coupled to a circuitry module, according to some embodiments of the present invention.

DETAILED DESCRIPTION

Pursuant to embodiments of the present invention, Group III nitride-based RF transistor amplifiers are provided that include RF transistor amplifier dies that have their gate terminals, drain terminals, and source terminals all located on the top side of the RF transistor amplifier die. In some embodiments, the RF transistor amplifiers may not include bond wires for the gate and drain connections, which may reduce an amount of inductance present in the circuit. The top side contacts may allow a coupling element to be coupled directly to the gate, drain, and source terminals of the RF transistor amplifier dies. The coupling element may be further connected to additional circuitry, such as harmonic termination circuitry, input impedance matching circuitry, and/or output impedance matching circuitry in a convenient manner. In particular embodiments where the substrate of the transistor die has a high thermal conductivity, such as a SiC growth substrate for a Group III nitride based HEMT, the die can be mounted with the substrate on a thermally conductive carrier substrate or submount, such as a metal slug, leadframe, or flange, to provide improved thermal dissipation of the heat generated by the die from the amplifier package.

Figure 1A:
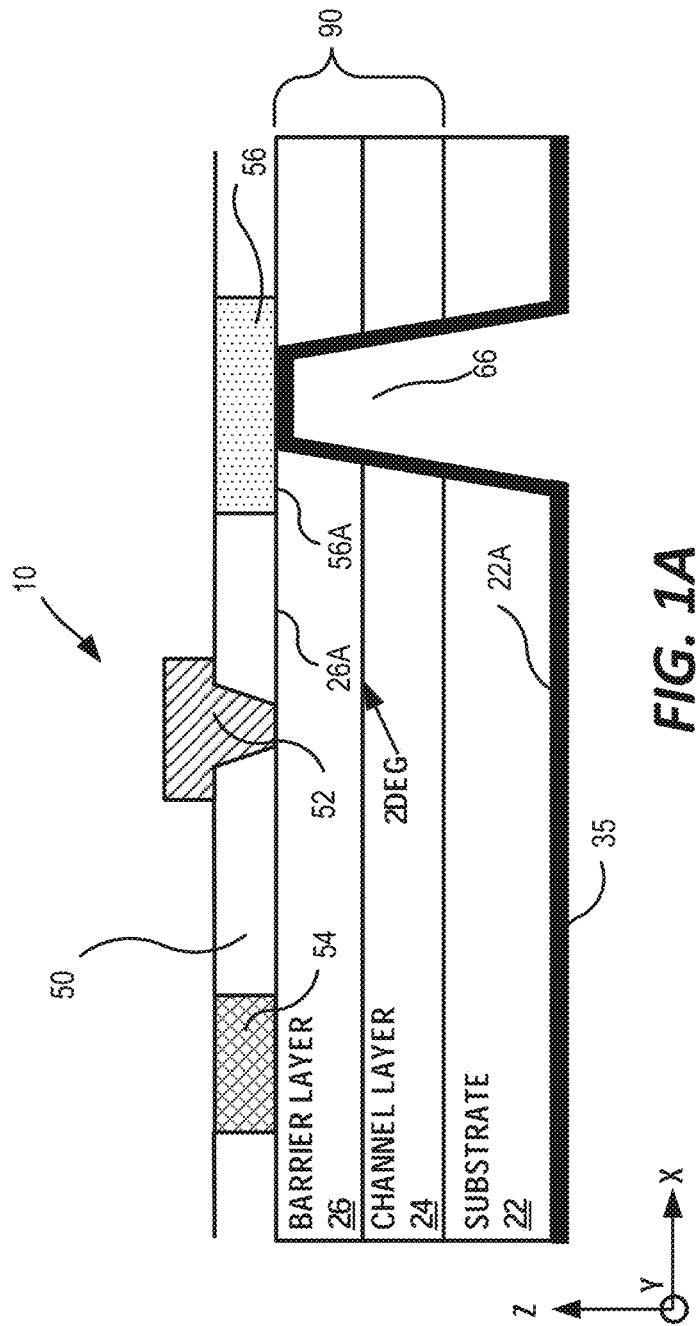
FIG. 1A is a schematic cross-sectional view of a conventional high electron mobility transistor.

FIG. 1A is a schematic cross-sectional view of a conventional high electron mobility transistor 10. As shown in FIG. 1A, the high electron mobility transistor 10 may be formed on a substrate 22 such as, for example, a silicon carbide, silicon, or sapphire. A channel layer 24 is formed on the substrate 22. A barrier layer 26 is formed on the channel layer 24 opposite the substrate 22. The channel layer 24 may include, for example, gallium-nitride (GaN) and the barrier layer 26 may include, for example, aluminum gallium-nitride (AlGaN).

The channel layer 24, and barrier layer 26 may together form a semiconductor structure 90 on the substrate 22. A source contact 56 and a drain contact 54 are formed on an upper surface of the barrier layer 26 and are laterally spaced apart from each other. The source contact 56 and the drain contact 54 may form an ohmic contact to the barrier layer 26.

A gate contact 52 is formed on the upper surface of the barrier layer 26 between the source contact 56 and the drain contact 54. A two-dimensional electron gas (2 DEG) layer is formed at a junction between the channel layer 24 and the barrier layer 26 when the HEMT device 10 is biased to be in its conducting or "on" state. The 2 DEG layer acts as a highly conductive layer that allows current to flow between the source and drain regions of the device that are beneath the source contact 56 and the drain contact 54, respectively.

The source contact 56 may be coupled to a reference signal such as, for example, a ground voltage. The coupling to the reference signal may be provided by a via 66 that extends from a lower surface 22A of the substrate 22, through the substrate 22 to an upper surface 26A of the barrier layer. The via 66 may expose a lower surface 56A of the source contact 56. A backmetal layer 35 may be formed on the lower surface 22A of the substrate 22 and on side walls of the via 66. The backmetal layer 35 may directly contact the source contact 56. Thus, the backmetal layer 35, and a signal coupled thereto, may be electrically connected to the source contact 56.

In some embodiments, one or more insulating layers 50 may directly contact the upper surface of the semiconductor structure 90 (e.g., contact the upper surface 26A of the barrier layer 26). The one or more insulating layers 50 may serve as passivation layers for the HEMT device 10. In some embodiments, additional metal contacts (not shown) may be provided to contact the gate contact 52 and/or the drain contact 54.

Figure 1B:
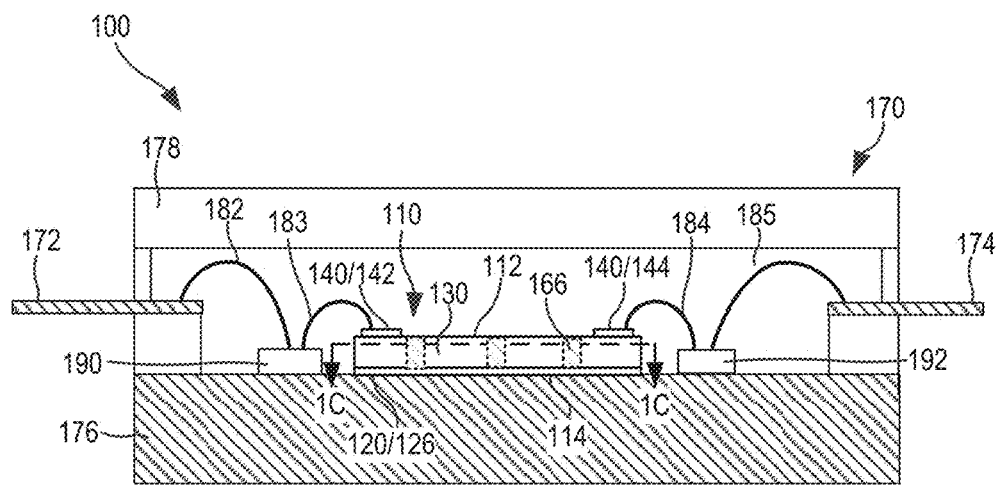
FIG. 1B is a schematic side view of a conventional packaged Group III nitride-based RF transistor amplifier.
Figure 1C:
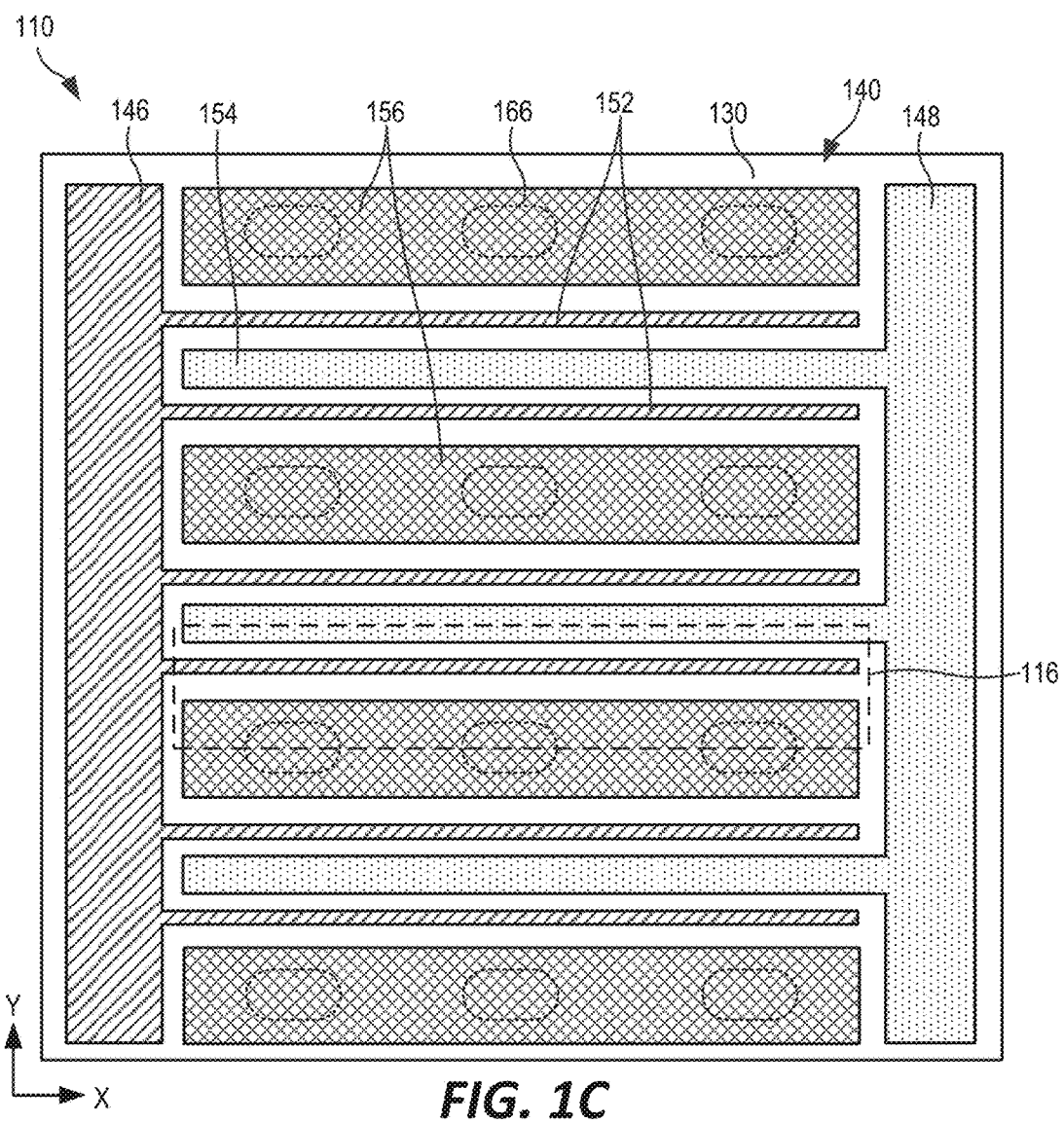
FIG. 1C is a schematic cross-sectional view taken along line 1C-1C of FIG. 1B that shows the structure of the top metallization of an RF transistor amplifier die that is included in the RF transistor amplifier of FIG. 1B.

As noted above, Group III nitride-based RF amplifiers, including the HEMT device illustrated in FIG. 1A, are often used in high power and/or high frequency applications. Typically, high levels of heat are generated within the Group III nitride-based RF amplifier die(s) during operation. If the RF die(s) become too hot, the performance (e.g., output power, efficiency, linearity, gain, etc.) of the RF amplifier may deteriorate and/or the RF amplifier die(s) may be damaged. As such, Group III nitride-based RF amplifiers are typically mounted in packages that may be optimized for heat removal. FIGS. 1B and 1C illustrate a conventional packaged Group III nitride-based RF amplifier. In particular, FIG. 1B is a schematic side view of a conventional packaged Group III nitride-based RF amplifier 100, and FIG. 1C is a schematic cross-sectional view of the RF transistor amplifier die that is included in the packaged Group III nitride-based RF transistor amplifier 100, where the cross-section is taken along line 1C 1C of FIG. 1B. It will be appreciated that FIGS. 1B-1C (and various of the other figures) are highly simplified diagrams and that actual RF amplifiers may include many more unit cells and various circuitry and elements that are not shown in the simplified figures herein.

As shown in FIG. 1B, the Group III nitride-based RF amplifier 100 includes an RF amplifier die 110 that is mounted within a package 170. The package 170 includes a gate lead 172, a drain lead 174, a carrier substrate 176 and a housing 178. The RF transistor amplifier die 110 is mounted on the upper surface of the carrier substrate 176 which may comprise, for example, a metal flange. The RF amplifier die 110 has a top side 112 and a bottom side 114. The RF amplifier die 110 includes a bottom side (also referred to as a "back" side) metallization structure 120, a semiconductor layer structure 130 and a top side metallization structure 140 that are sequentially stacked. The back side metallization structure 120 comprises a source terminal 126. The RF amplifier 100 may be a HEMT-based RF amplifier, such as that illustrated in FIG. 1A, in which case the semiconductor layer structure 130 may include at least a channel layer and a barrier layer, which are typically formed on a semiconductor or insulating growth substrate (such as a SiC, silicon, or sapphire substrate). The growth substrate, even if formed of a non-semiconductor material, may be considered to be part of the semiconductor layer structure 130. The top side metallization structure 140 includes, among other things, a gate terminal 142 and a drain terminal 144.

Input matching circuits 190 and/or output matching circuits 192 may also be mounted within the housing 178. The matching circuits 190, 192 may be impedance matching circuits that match the impedance of the fundamental component of RF signals input to or output from the RF transistor amplifier 100 to the impedance at the input or output of the RF transistor amplifier die 110, respectively, and/or harmonic termination circuits that are configured to short to ground harmonics of the fundamental RF signal that may be present at the input or output of the RF transistor amplifier die 110, such as second order or third order harmonics. As schematically shown in FIG. 1B, the input and output matching circuits 190, 192 may be mounted on the metal flange 176. The gate lead 172 may be connected to the input matching circuit 190 by one or more first bond wires 182, and the input matching circuit 190 may be connected to the gate terminal 142 of RF amplifier die 110 by one or more second bond wires 183. Similarly, the drain lead 174 may be connected to the output matching circuit 192 by one or more fourth bond wires 185, and the output matching circuit 192 may be connected to the drain terminal 144 of RF amplifier die 110 by one or more third bond wires 184. The source terminal 126 of RF transistor amplifier die 110 may be mounted directly on the metal flange 176. The metal flange 176 may provide the electrical connection to the source terminal 126 and may also serve as a heat dissipation structure. The first through fourth bond wires 182-185 may form part of the input and/or output matching circuits. The housing 178 may comprise a ceramic housing, and the gate lead 172 and the drain lead 174 may extend through the housing 178. The housing 178 may comprise multiple pieces, such as a frame that forms the lower portion of the sidewalls and supports the gate and drain leads 172, 174, and a lid that is placed on top of the frame. The interior of the device may comprise an air-filled cavity.

FIG. 1C is a schematic cross-sectional view of the RF amplifier die 110 that is taken through a portion of the top side metallization structure 140. Dielectric layers that isolate the various conductive elements of the top-side metallization structure 140 from each other are not shown in FIG. 1C to simplify the drawing.

As shown in FIG. 1C, the RF transistor amplifier die 110 comprises a Group III nitride-based HEMT RF transistor amplifier that has a plurality of unit cell transistors 116 that each include a gate finger 152, a drain finger 154 and a source finger 156. The gate fingers 152 are electrically connected to a common gate manifold 146, and the drain fingers 154 are electrically connected to a common drain manifold 148. The gate manifold 146 is electrically connected to the gate terminal 142 (e.g., through a conductive via that extends upwardly from the gate manifold 146) which may be implemented as a gate bond pad (see FIG. 1B), and the drain manifold 148 is electrically connected to the drain terminal 144 (e.g., through a conductive via that extends upwardly from the drain manifold 148) which may be implemented as a drain bond pad (see FIG. 1B). The source fingers 156 are electrically connected to the source terminal 126 via a plurality of conductive source vias 166 that extend through the semiconductor layer structure 130. The conductive source vias 166 may comprise metal-plated vias that extend completely through the semiconductor layer structure 130.

Referring again to FIG. 1B, the carrier substrate 176 (which here is a metal flange) may act as a heat sink that dissipates heat that is generated in the RF amplifier die 110. The heat is primarily generated in the upper portion of the RF amplifier die 110 where relatively high current densities are generated in, for example, the channel regions of the unit cell transistors 116 This heat may be transferred though both the source vias 166 and the semiconductor layer structure 130 to the carrier substrate 176.

Figure 1D:
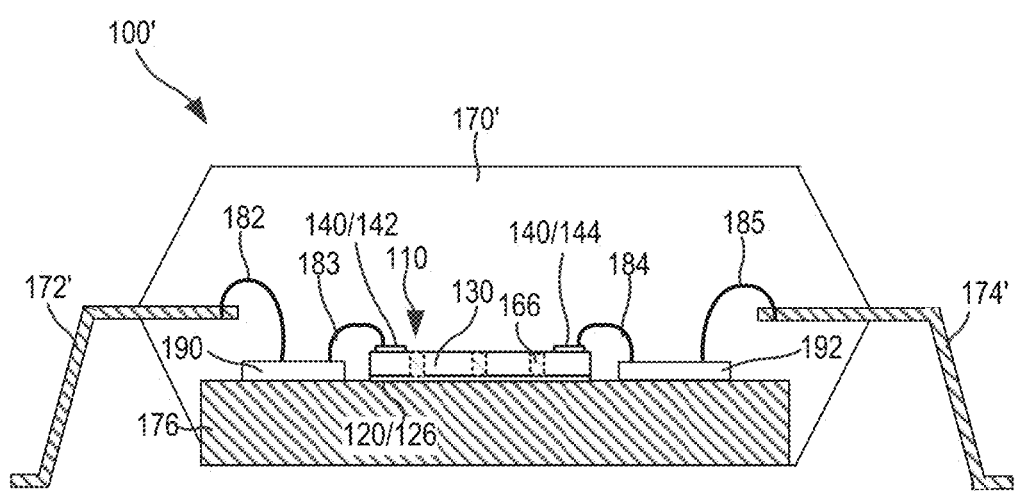
FIG. 1D is a schematic side view of another conventional Group III nitride-based RF transistor amplifier.

FIG. 1D is a schematic side view of a conventional packaged Group III nitride-based RF transistor amplifier 100' that is similar to the RF transistor amplifier discussed above with reference to FIG. 1B. RF transistor amplifier 100' differs from RF transistor amplifier 100 in that it includes a different package 170'. The package 170' includes a metal submount 176 (which acts as a metal heat sink and can be implemented as a metal slug), as well as gate and drain leads 172', 174'. In some embodiments, a metal lead frame may be formed that is then processed to provide the metal submount 176 and/or the gate and drain leads 172', 174'. RF transistor amplifier 100' also includes a plastic overmold 178' that at least partially surrounds the RF transistor amplifier die 110, the leads 172', 174' and the metal submount 176. The plastic overmold 178' replaces the ceramic sidewalls and lid 178 included in RF transistor amplifier 100.

Depending on the embodiment, the packaged transistor amplifier 100' can include, for example, a monolithic microwave integrated circuit (MMIC) as the RF transistor amplifier die 110 in which case the RF transistor amplifier die 110 incorporates multiple discrete devices. In some embodiments, the packaged RF transistor amplifier 100 can include multiple RF transistor amplifier die that are connected in series to form a multiple stage RF transistor amplifier and/or may include multiple transistor die that are disposed in multiple paths (e.g., in parallel) to form an RF transistor amplifier with multiple RF transistor amplifier die and multiple paths, such as in a Doherty amplifier configuration In other cases, Group III nitride-based RF amplifiers may be implemented as MMIC devices in which one or more RF amplifier die(s) are implemented together with their associated impedance matching and harmonic termination circuits in a single, integrated circuit die. Examples of such Group III nitride-based RF amplifiers are disclosed, for example, in U.S. Pat. No. 9,947,616, the entire content of which is incorporated herein by reference. When the RF transistor amplifier die 110 is a MMIC implementation, the input matching circuits 190 and/or the output matching circuits 192 may be omitted (since they may instead be implemented within the RF transistor amplifier die 110) and the bond wires 182 and/or 185 may extend directly from the gate and drain leads 172', 174' to the gate and drain terminals 142, 144.

Conventional Group III nitride-based RF transistor amplifiers, such as the RF transistor amplifier 100 of FIGS. 1A-1D, may use bond wires 182, 184 to connect the RF transistor amplifier die 110 other portions of the package. These bond wires 182, 184 have inherent inductance that may be used to implement some of the inductors in the impedance matching and/or harmonic termination circuits of the RF transistor amplifiers. The amount of inductance provided may be varied by changing the length and/or the cross-sectional area (e.g., the diameter) of the bond wires 182, 184 so that the bond wires 182, 184 provide a desired amount of inductance. Unfortunately, as applications move to higher frequencies, the inductance of the bond wires 182, 184 may exceed a desired amount of inductance for the impedance matching and/or harmonic termination circuits. When this occurs, bond wires 182, 184 that are very short and/or that have large cross-sectional areas may be used in an effort to decrease the inductance thereof to suitable levels. Very short bond wires 182, 184, however, may be difficult to solder in place, which may increase manufacturing costs, and/or may result in higher device failure rates. Bond wires 182, 184 having large cross-sectional areas may require larger gate and drain bond pads on the RF transistor amplifier die, which may result in an increase in the overall size of the RF transistor amplifier die, which is also undesirable. Moreover, in some higher frequency applications, even very short bond wires 182, 184 having large cross-sectional areas may have too much inductance such that the matching networks cannot, for example, properly terminate the second or third order harmonics. While the RF transistor amplifiers may be implemented as MMIC devices in order to avoid the problem of too much inductance in the bond wires 182, 184, MMIC RF amplifiers are more expensive to fabricate and can only be used in the frequency range of the matching circuits, reducing flexibility.

Moreover, wire bonding equipment that is typically used for high volume manufacturing may have a tolerance of +/−1 mil, meaning that the length of any particular wire bond may vary by as much a 2 mils (i.e., +/−1 mil on each end of the bond wire). For high frequency applications, the variation in inductance associated with 2 mils of a wire bond may be significant, and hence the performance of the matching circuits may be degraded if the bond wires are 1-2 mils too short or long from a desired nominal length. Forming the gate and drain terminals on the top side of the device and using a coupling element to connect these terminals to additional circuitry may largely eliminate this process variation, resulting in improved performance.

Embodiments of the present invention will now be discussed in further detail with reference to the accompanying figures.

Figure 2C:
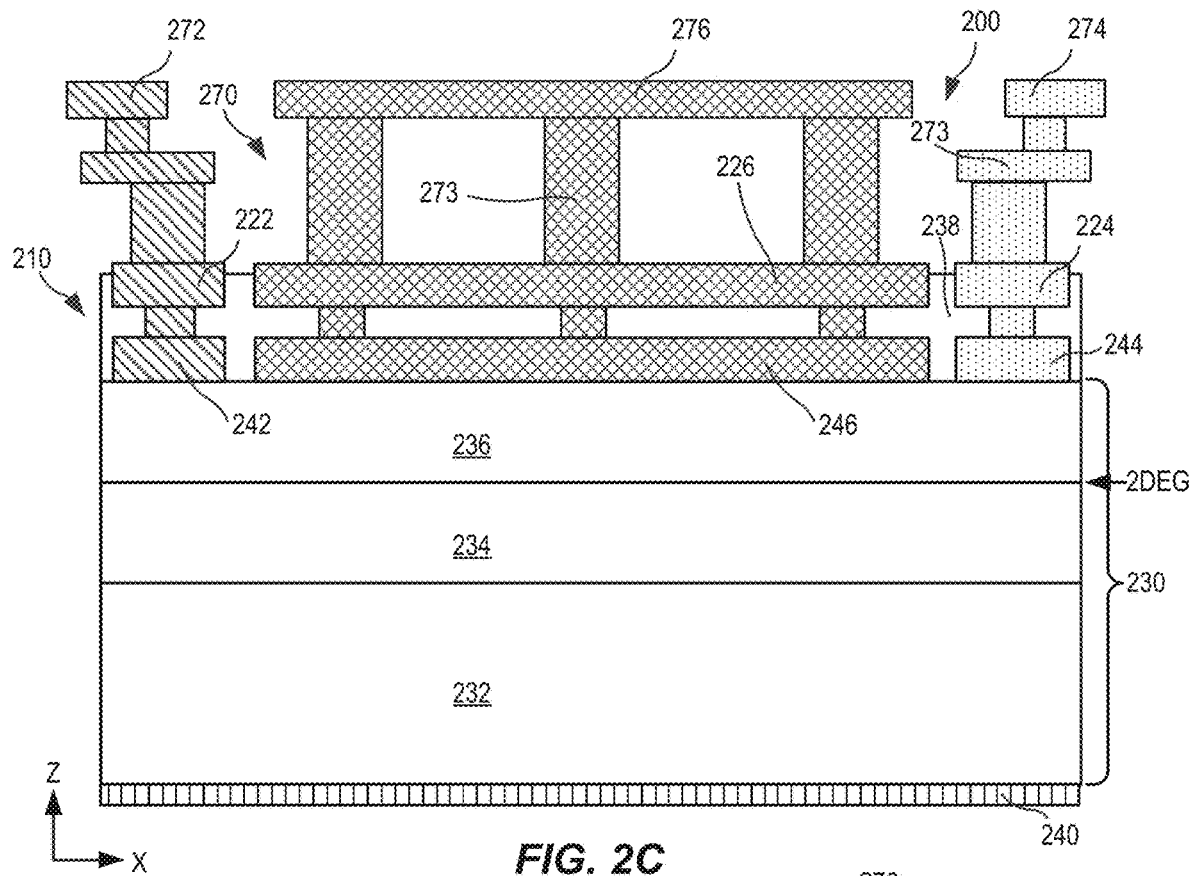
FIG. 2C is a cross-sectional view taken along line 2C-2C of FIG. 2B.
Figure 2D:
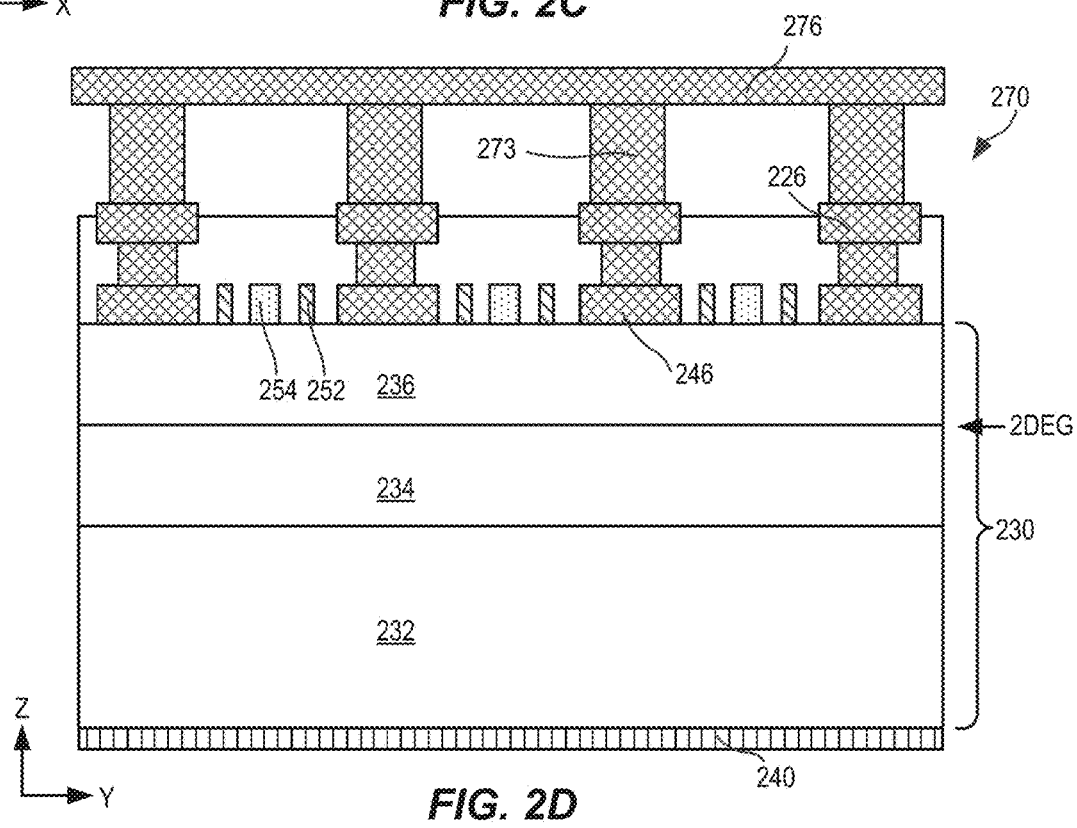
FIG. 2D is a cross-sectional view taken along line 2D-2D of FIG. 2B.
Figure 2E:
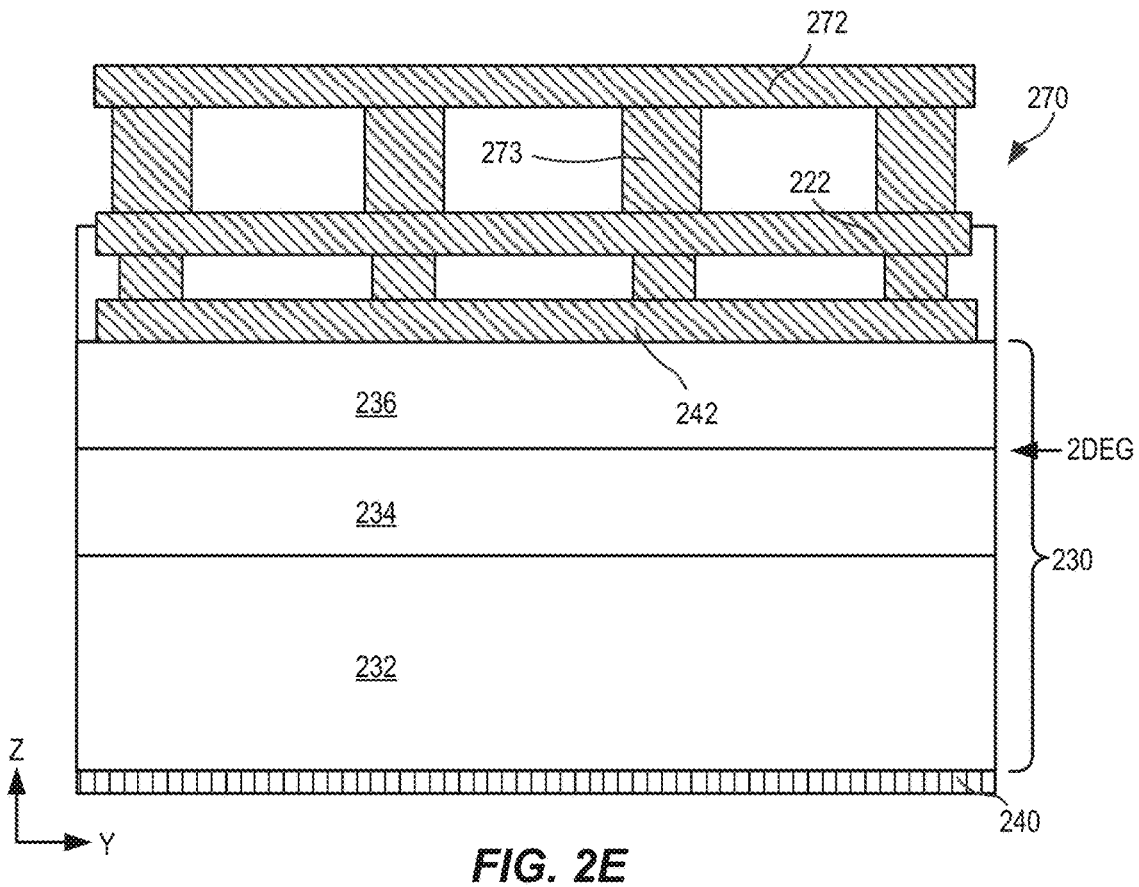
FIG. 2E is a cross-sectional view taken along line 2E-2E of FIG. 2B.
Figure 2F:
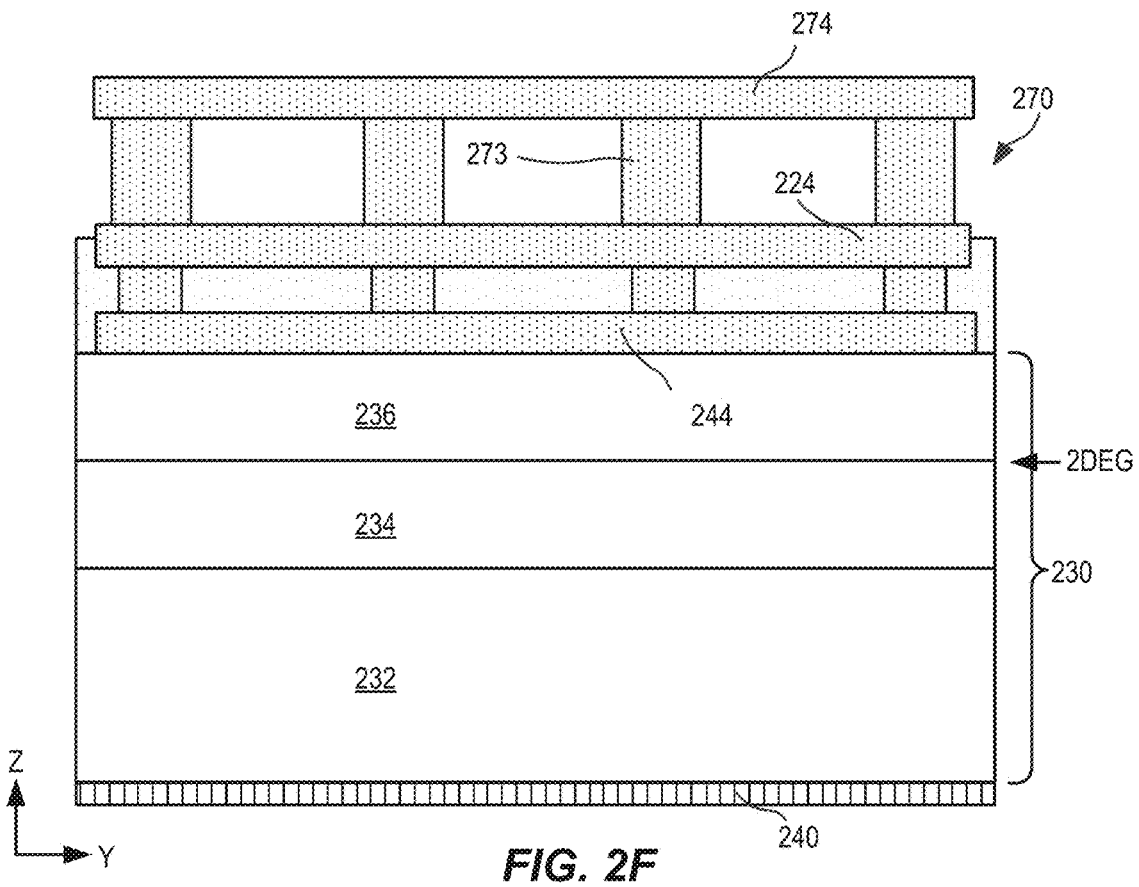
FIG. 2F is a cross-sectional view taken along line 2F-2F of FIG. 2B.
Figure 2G:
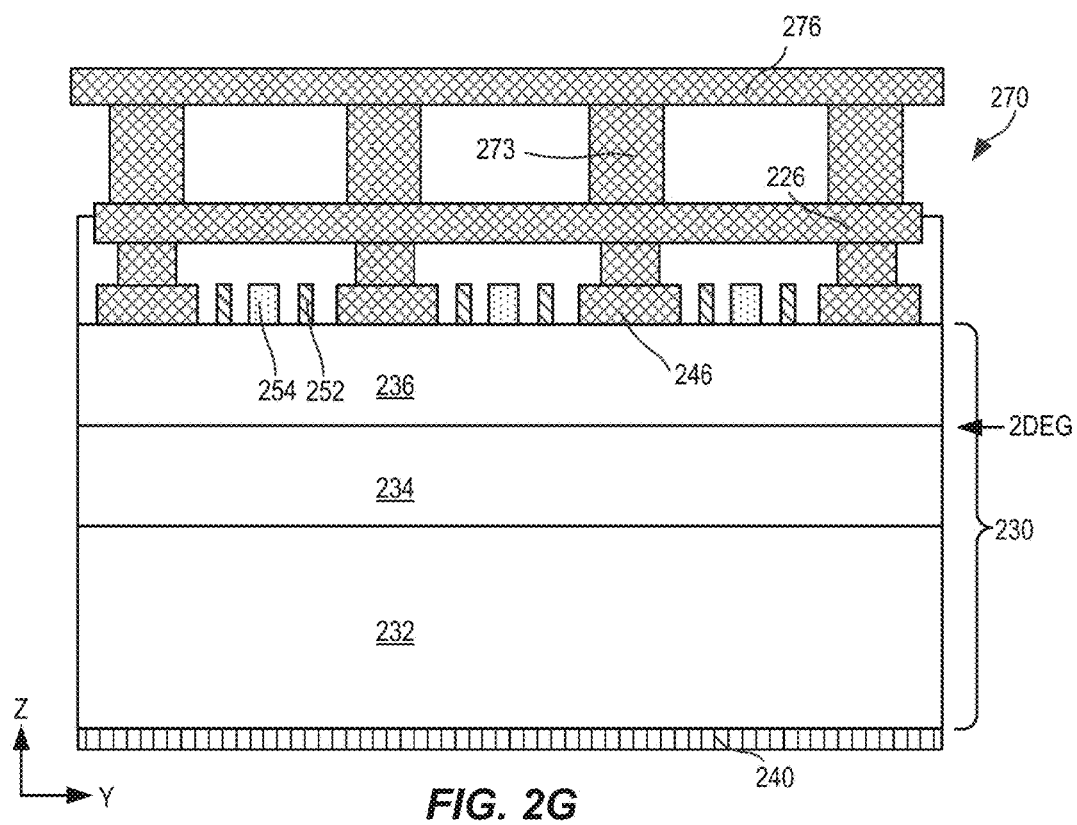
FIGS. 2G to 2L are cross-sectional views of additional embodiments of the present invention.

FIGS. 2A-2G depict a Group III nitride-based RF transistor amplifier 200 according to certain embodiments of the present invention. In particular, FIG. 2A is a schematic side view of the Group III nitride-based RF transistor amplifier 200. FIG. 2B is a schematic plan view of an RF transistor amplifier die 210 that is part of the Group III nitride-based RF transistor amplifier 200 of FIG. 2A that is taken along line 2B-2B of FIG. 2A. FIGS. 2C through 2F are schematic cross-sectional views of the RF transistor amplifier die 210 that are taken along lines 2C-2C through 2F-2F of FIG. 2B, respectively. FIG. 2G is an alternative embodiment of the source terminal illustrated in FIG. 2D. FIGS. 2H to 2L are cross-sectional views of additional embodiments of Group III nitride-based RF transistor amplifiers 200', 200" according to certain embodiments of the present invention.

As shown in FIG. 2A, in some embodiments, the Group III nitride-based RF transistor amplifier 200 may include an RF transistor amplifier die 210 that is mounted on the bottom surface of a coupling element 270. The RF transistor amplifier die 210 has a top side 212 and a back side 214. The RF transistor amplifier die 210 includes a top side metallization structure 220, a semiconductor layer structure 230, and a bottom side thermal layer 240 that are sequentially stacked. The top side metallization structure 220 comprises a gate terminal 222, a drain terminal 224, and one or more source terminal(s) 226. The RF transistor amplifier 200 may be a HEMT-based RF transistor amplifier, in which case the semiconductor layer structure 230 may include at least a channel layer and a barrier layer, as will be discussed in greater detail with reference to FIGS. 2C and 2D. In some configurations, as will be discussed further herein, the coupling element 270 may be omitted from the RF transistor amplifier 200.

The coupling element 270 may be configured to couple to the gate terminal 222, the drain terminal 224, and the one or more source terminal(s) 226. In some cases, the coupling element 270 may comprise a redistribution layer (RDL) laminate structure and/or interposer. An RDL laminate structure refers to a substrate that has conductive layer patterns and/or conductive vias. RDL laminate structures may be fabricated using semiconductor processing techniques by depositing conductive and insulating layers and/or patterns on a base material and by forming vias and routing patterns (e.g., from copper) within the structure for transmitting signals through the RDL laminate structure. For example, as illustrated in FIG. 2A, the coupling element 270 may include conductive patterns 273 formed in an encapsulating structure 277.

A gate connection pad 272, a drain connection pad 274, and a source connection pad 276 are provided on the top surface of the coupling element 270. Each of these connection pads 272, 274, 276 may comprise, for example, an exposed copper pad, though the present invention is not limited thereto. The gate connection pad 272 may be electrically coupled to the gate terminal 222 by one or more conductive patterns 273 in the coupling element 270. Similarly, the drain connection pad 274 may be electrically coupled to the drain terminal 224 by one or more conductive patterns 273 in the coupling element 270, and the source connection pad 276 may be electrically coupled to source terminal(s) 226 by one or more conductive patterns 273 in the coupling element 270.

In some embodiments, the conductive patterns 273 of the coupling element 270 may be configured in a fan-out (FO) configuration. The FO configuration may allow for the spacing of the connections to the respective source, gate, and drain terminals to be enlarged, allowing for increased separation of the connections. However, the present invention is not limited to an FO connection. In some embodiments, a fan-in connection, fan-in and fan-out configurations, or other configurations may be used.

In some embodiment the coupling element 270 and/or the RDL laminate structure may be formed as part of a wafer level processing (WLP) operation, but the present invention is not limited thereto. For example, the coupling element 270 can be formed by disposing conductive pillars on the gate terminal 222, drain terminal 224, and the one or more source terminal(s) 226. In some embodiments, the conductive pillars may comprise copper. For example, the conductive pillars may be formed by electroplating a copper seed using one or more masks to form the patterns. The conductive pillars may form the conductive patterns 273. In addition, the gate connection pad 272, the drain connection pad 274, and the source connection pad 276 may be formed on the conductive patterns 273. The conductive patterns 273, gate connection pad 272, drain connection pad 274, and source connection pad 276 may be disposed at least partially within the encapsulating structure 277, which may include an overmold material. The overmold material may include, for example, silicon oxide, silicon nitride, an oxide of the conductive patterns 273, a polymer, a molding compound, and/or a combination thereof. The overmold material may be processed (e.g., planarized) to expose the gate connection pad 272, the drain connection pad 274, and/or the source connection pad 276. In some embodiments, the formation of the coupling element 270 may be performed at the wafer level, and individual ones of the RF transistor amplifier dies 210 and/or RF transistor amplifiers 200 may be singulated from the wafer.

In some embodiments, the coupling element 270 may be formed in a chip-first or chip-last process. In a chip-first process, the RDL structure may be formed on the die 210 (or wafer including die 210). For example, a seed layer may be deposited (e.g., on one or more of the gate terminal 222, the drain terminal 224, and the one or more source terminal(s) 226. The seed may then be patterned and electroplated to form a layer of conductive material. This process may be repeated multiple times to from the conductive patterns 273 of the coupling element 270. These conductive patterns 273 may then be enclosed in the encapsulating structure 277 to form the coupling element 270.

In a chip-last process, the RDL layers of the coupling element 270 may be formed on a temporary carrier layer. The conductive patterns 273 may be formed in a manner similar to the chip-first process on the temporary carrier layer. When complete, the coupling element 270 may be decoupled from the temporary carrier layer and then recoupled to the die 210. For example, the coupling element 270 may be coupled to one or more of the gate terminal 222, the drain terminal 224, and the one or more source terminal(s) 226 (e.g., via solder).

Other coupling elements 270 may alternatively be used such as, for example, a printed circuit board (e.g., a multi-layer printed circuit board), a ceramic substrate that includes conductive vias and/or pads, or any coupling structures for the RF transistor amplifier die 210 that can make electrical connections to the top side 212 of the RF transistor amplifier die 210.

The arrangement of conductive patterns 273 illustrated in FIG. 2A are merely an example, and other arrangements are possible without deviating from the present invention. For example, in some embodiments, conductive patterns 273 of the coupling element 270 may extend adjacent sides of the RF transistor amplifier die 210. In some embodiments, the coupling element 270 may have terminals other than those illustrated in FIG. 2A.

The thermal layer 240 may be on the back side 214 of the RF transistor amplifier die 210. The thermal layer 240 may be a thermally conductive layer configured to facilitate thermal transfer between the RF transistor amplifier die 210 and a carrier substrate to which the RF transistor amplifier die 210 is mounted. In some embodiments, the thermal layer 240 may be omitted. In some embodiments, the thermal layer 240 may be a die attach layer, such as a eutectic layer. The thermal layer 240 can be on the transistor amplifier die 210 and/or extend onto the encapsulating structure 277. The thermal layer 240 can be a metal layer to form a eutectic or other metal bond. In some embodiments, the thermal layer 240 can be a thermal adhesive.

The RF transistor amplifier die 210 may comprise a Group III nitride-based HEMT RF transistor amplifier that includes a plurality of unit cell transistors 216 that are electrically connected to each other in parallel. This can best be seen in FIG. 2B, which schematically depicts a plan view of RF transistor amplifier die 210 below the top side metallization structure 220. The top side metallization structure 220, including the gate terminal 222, the drain terminal 224, and the one or more source terminals 226, are illustrated as dashed lines in FIG. 2B.

As shown in FIG. 2B, the RF transistor amplifier die 210 includes a gate manifold 242 and a drain manifold 244, a plurality of gate fingers 252, a plurality of drain fingers 254 and a plurality of source fingers 246, all of which may be formed on an upper surface of the semiconductor layer structure 230. The gate manifold 242 and gate fingers 252 are part of a gate electrode of the RF transistor amplifier die 210. The gate manifold 242 and the gate fingers 252 may be implemented as a first monolithic metal pattern, but the present invention is not limited thereto. The drain manifold 244 and drain fingers 254 are part of a drain electrode of the RF transistor amplifier die 210, and may be implemented as a second monolithic metal pattern, but the present invention is not limited thereto.

The gate fingers 252 may be formed of materials that are capable of making a Schottky contact to a Group III nitride-based semiconductor material, such as Ni, Pt, Cu, Pd, Cr, W, and/or WSiN. The drain fingers 254 and source fingers 246 may include a metal (e.g., TiAlN, TiSiNi, or the like) that can form an ohmic contact to Group III nitride-based materials. A dielectric layer (or a series of dielectric layers) that help isolate the gate manifold/fingers 242, 252, the drain manifold/fingers 244, 254 and the source fingers 246 from each other is not shown in FIG. 2B to better illustrate the elements of the RF transistor amplifier die 210.

The gate terminal 222, drain terminal 224, and source terminal(s) 226 may be provided on the upper surface of the RF transistor amplifier die 210. The gate terminal 222 may be physically and electrically connected to the gate manifold 242 (e.g., by conductive vias), the source terminal(s) 226 may be physically and electrically connected to the source fingers 246 (e.g., by conductive vias), and the drain terminal 224 may be physically and electrically connected to the drain manifold 244 (e.g., by conductive vias). Though the various terminals are illustrated as being directly connected to the gate/drain manifold and/or source fingers, it will be understood that, in some embodiments, intermediate elements may be present. For example, in some embodiments, capacitors, inductors, resistors, etc., may be coupled between the terminal and the respective manifold and/or finger. As an example, a capacitor may formed on the surface of the RF transistor amplifier die 210 that is coupled to the drain manifold 244, and the drain terminal 224 may be coupled to the capacitor.

One of the unit cell transistors 216 is also shown in FIG. 2B. As shown, the unit cell transistor 216 includes a gate finger 252, a drain finger 254, and a source finger 246 along with the underlying portion of the semiconductor layer structure 230. Since all of the gate fingers 252 are electrically connected to a common gate manifold 242, all of the drain fingers 254 are electrically connected to a common drain manifold 244, and all of the source fingers 246 are electrically connected together via the source terminal(s) 226 (discussed below), it can be seen that the unit cell transistors 216 are all electrically connected together in parallel.

The unit cell transistors 216 may be HEMT devices. Suitable structures for Group III-nitride-based HEMT devices that may utilize embodiments of the present invention are described, for example, in commonly assigned U.S. Patent Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Patent Publication No. 2002/0167023A1 for "Group-III Nitride Based High Electron Mobility Transistor (HEMT) With Barrier/Spacer Layer," published Nov. 14, 2002, U.S. Patent Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

Referring to FIGS. 2C and 2D, the semiconductor layer structure 230 includes a plurality of semiconductor layers. In the depicted embodiment, a total of two semiconductor layers are shown, namely a channel layer 234 and a barrier layer 236 that is on a top side of the channel layer 234. The semiconductor layer structure 230 may include additional semiconductor and/or non-semiconductor layers. For example, the semiconductor layer structure 230 may include a growth substrate 232 on which the other semiconductor layers are grown. The growth substrate 232 may be a semi-insulating silicon carbide (SiC) substrate that may be, for example, the 4H polytype of silicon carbide. Other silicon carbide candidate polytypes may include the 3C, 6H, and 15R polytypes. The growth substrate 232 may be a High Purity Semi-Insulating (HPSI) substrate, available from Cree, Inc. The term "semi-insulating" is used descriptively herein, rather than in an absolute sense.

In some embodiments of the present invention, the silicon carbide bulk crystal of the growth substrate 232 may have a resistivity equal to or higher than about $1 \times 10^5$ ohm-cm at room temperature. Exemplary SiC substrates that may be used in some embodiments of the present invention are manufactured by, for example, Cree, Inc., of Durham, N.C., the assignee of the present invention, and methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although silicon carbide may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The growth substrate 232 may be a silicon carbide wafer, and the RF transistor amplifier 200 may be formed, at least in part, via wafer-level processing, and the wafer may then be diced to provide a plurality of individual RF transistor amplifiers 200.

SiC has a much closer crystal lattice match to Group III nitrides than does sapphire ($Al_2O_3$) or silicon, which are very common substrate materials for Group III nitride devices. The closer lattice match of SiC may result in Group III nitride films of higher quality than those generally available on sapphire or silicon. SiC also has a very high thermal conductivity so that the total output power of Group III nitride devices on silicon carbide is, typically, not as limited by thermal dissipation of the substrate as in the case of the same devices formed on sapphire. Also, the availability of semi-insulating SiC substrates may provide for device isolation and reduced parasitic capacitance.

Optional buffer, nucleation, and/or transition layers (not shown) may be provided on the growth substrate 232 beneath the channel layer 234. For example, an AlN buffer layer may be included to provide an appropriate crystal structure transition between an SiC growth substrate 232 and the remainder of the semiconductor layer structure 230. Additionally, strain balancing transition layer(s) may also be provided as described, for example, in commonly assigned U.S. Patent Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein.

The channel layer 234 and the barrier layer 236 may each be formed by epitaxial growth in some embodiments. Techniques for epitaxial growth of Group III nitrides have been described in, for example, U.S. Pat. Nos. 5,210,051, 5,393,993, and 5,523,589, the disclosures of which are also incorporated by reference herein in their entireties. The channel layer 234 may have a bandgap that is less than the bandgap of the barrier layer 236 and the channel layer 234 may also have a larger electron affinity than the barrier layer 236. The channel layer 234 and the barrier layer 236 may include Group III-nitride based materials.

In some embodiments, the channel layer 234 is a Group III nitride material, such as $Al_xGa_xN$ where $0 \le x < 1$, provided that the energy of the conduction band edge of the channel layer 234 is less than the energy of the conduction band edge of the barrier layer 236 at the interface between the channel and barrier layers 234, 236. In certain embodiments of the present invention, x=0, indicating that the channel layer 234 is gallium nitride ("GaN"). The channel layer 234 may also be other Group III nitrides such as InGaN, AlInGaN or the like. The channel layer 234 may be undoped or unintentionally doped and may be grown to a thickness of, for example, greater than about 2 nm. The channel layer 234 may also be a multi-layer structure, such as a superlattice or combinations of GaN, AlGaN or the like.

The channel layer 234 may have a bandgap that is less than the bandgap of at least a portion of the barrier layer 236, and the channel layer 234 may also have a larger electron affinity than the barrier layer 236. In certain embodiments, the barrier layer 236 is AlN, AlInN, AlGaN or AlInGaN with a thickness of between about 0.1 nm and about 10 nm or more. In particular embodiments, the barrier layer 236 is thick enough and has a high enough Al composition and doping to induce a significant carrier concentration at the interface between the channel layer 234 and the barrier layer 236.

The barrier layer 236 may be a Group III nitride and may have a bandgap larger than that of the channel layer 234 and a smaller electron affinity than the channel layer 234. Accordingly, in certain embodiments of the present invention, the barrier layer 236 may include AlGaN, AlInGaN and/or AlN or combinations of layers thereof. The barrier layer 236 may, for example, be from about 0.1 nm to about 30 nm thick. In certain embodiments, the barrier layer 236 is undoped or doped with an n-type dopant to a concentration less than about $10^{19}$ cm$^{-3}$. In some embodiments of the present invention, the barrier layer 236 is $Al_xGa_{1-x}N$ where $0 < x < 1$. In particular embodiments, the aluminum concentration is about 25%. However, in other embodiments of the present invention, the barrier layer 236 comprises AlGaN with an aluminum concentration of between about 5% and about 100%. In specific embodiments of the present invention, the aluminum concentration is greater than about 10%.

Due to the difference in bandgap between the barrier layer 236 and the channel layer 234 and piezoelectric effects at the interface between the barrier layer 236 and the channel layer 234, a two dimensional electron gas (2 DEG) is induced in the channel layer 234 at a junction between the channel layer 234 and the barrier layer 236. The 2 DEG acts as a highly conductive layer that allows conduction between the source region of each unit cell transistor 216 and its associated drain region, where the source region is the portion of the semiconductor layer structure 230 that is directly underneath the source finger 246 and the drain region is the portion of the semiconductor layer structure 230 that is directly underneath the corresponding drain finger 254.

While semiconductor structure 230 is shown with channel layer 234 and barrier layer 236 for purposes of illustration, semiconductor structure 230 may include additional layers/ structures/elements such as a buffer and/or nucleation layer(s) between channel layer 234 and substrate 232, and/or a cap layer on barrier layer 236. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, 7,548,112, and 7,709,269, the disclosures of which are hereby incorporated herein in their entirety by reference. For example, an AlN buffer layer may be formed on the upper surface of the substrate 232 to provide an appropriate crystal structure transition between the silicon carbide substrate 232 and the remainder of the RF transistor amplifier 200. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HVPE.

An interlayer insulating layer 238 is formed over the gate fingers 252, the drain fingers 254, and the source fingers 246. The interlayer insulating layer 238 may include a dielectric material, such as SiN, $SiO_2$, etc.

The coupling element 270 may be on and/or coupled to the semiconductor layer structure 230. For example, conductive patterns 273 may be coupled, respectively, between the gate connection pad 272 and the gate terminal 222, between the drain connection pad 274 and the drain terminal 224, and between the source connection pad 276 and the source terminal 226. In FIG. 2C, the encapsulating structure 277 of the coupling element 270 is omitted for ease of description. The gate connection pad 272, the drain connection pad 274, and the source connection pad 276 of the coupling element 270 may extend perpendicularly to the gate fingers 252 and drain fingers 254.

By placing all of the terminals on the top side of the RF transistor amplifier die 210, the RF transistor amplifier 200 according to certain embodiments of the present invention may be able to omit vias to the back side of the RF transistor amplifier die 210. Without vias on the back side of the RF transistor amplifier die 210 connecting the source to the grounded electrically conductive submount, the conductive submount need not be electrically active. Furthermore, the back side of the substrate 232 of the RF transistor amplifier die 210 may be thermally coupled to a thermally conductive submount such as a heat sink or a flange (not shown) to provide improved thermal dissipation. In some embodiments, the thermal layer 240 may facilitate this thermal coupling. When SiC is used as a substrate material, the thermal properties of the package can be further improved due to the improved thermal conductivity of SiC.

Moreover, the placement of all of the terminals on the top side of the RF transistor amplifier die 210, allows for the use of the coupling element 270, which can bring all of the transistor connections to respective connection pads. This may allow the RF transistor amplifier die 210 to be further coupled to other elements of the circuit (e.g., other routing elements, grounding elements, harmonic and/or input/output impedance matching elements) through the use of connection methods that avoid bonding wires, such as solder.

FIG. 2D illustrates an example of the connections between the various source fingers 246 and the source terminals 226. As illustrated in FIG. 2D, each of the source fingers 246 may be coupled to a respective source terminal 226, but the present invention is not limited thereto. In some embodiments, the one or more source terminals 226 may be coupled to more than one source finger 246. For example, as illustrated in FIG. 2G, in some embodiments a single source terminal 226 may be provided, and the source terminal 226 may be connected to each of the individual source fingers 246. In some embodiments, multiple source terminals 226 may be provided, each of which is connected to a plurality of source fingers 246. The one or more source terminals 226 may be coupled to the source connection pad 276 by conductive patterns 273 of the coupling element 270.

FIG. 2E illustrates an example of the connections between the gate manifold 242 and the gate terminal 222. As illustrated in FIG. 2E, the gate manifold 242 may be coupled to the gate terminal 222 by, for example, a plurality of vias. FIG. 2F illustrates an example of the connections between the drain manifold 244 and the drain terminal 224. As illustrated in FIG. 2E, the drain manifold 244 may be coupled to the drain terminal 224 by, for example, a plurality of vias. In both FIGS. 2E and 2F, the gate terminal 222 and/or drain terminal 224 may be coupled, respectively, to the gate connection pad 272 and/or the drain connection pad 274 of the coupling element 270 by one or more conductive patterns 273.

Figure 2H:
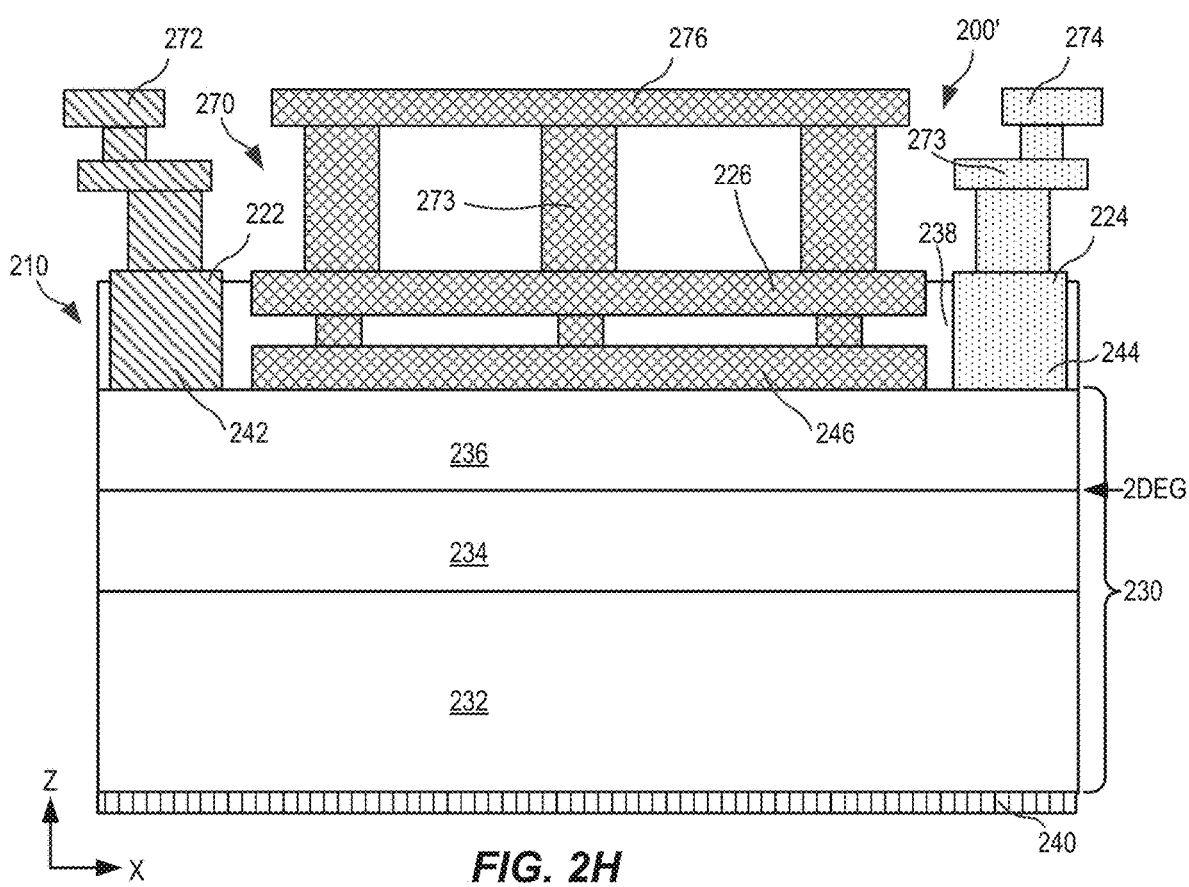
Figure 2I:
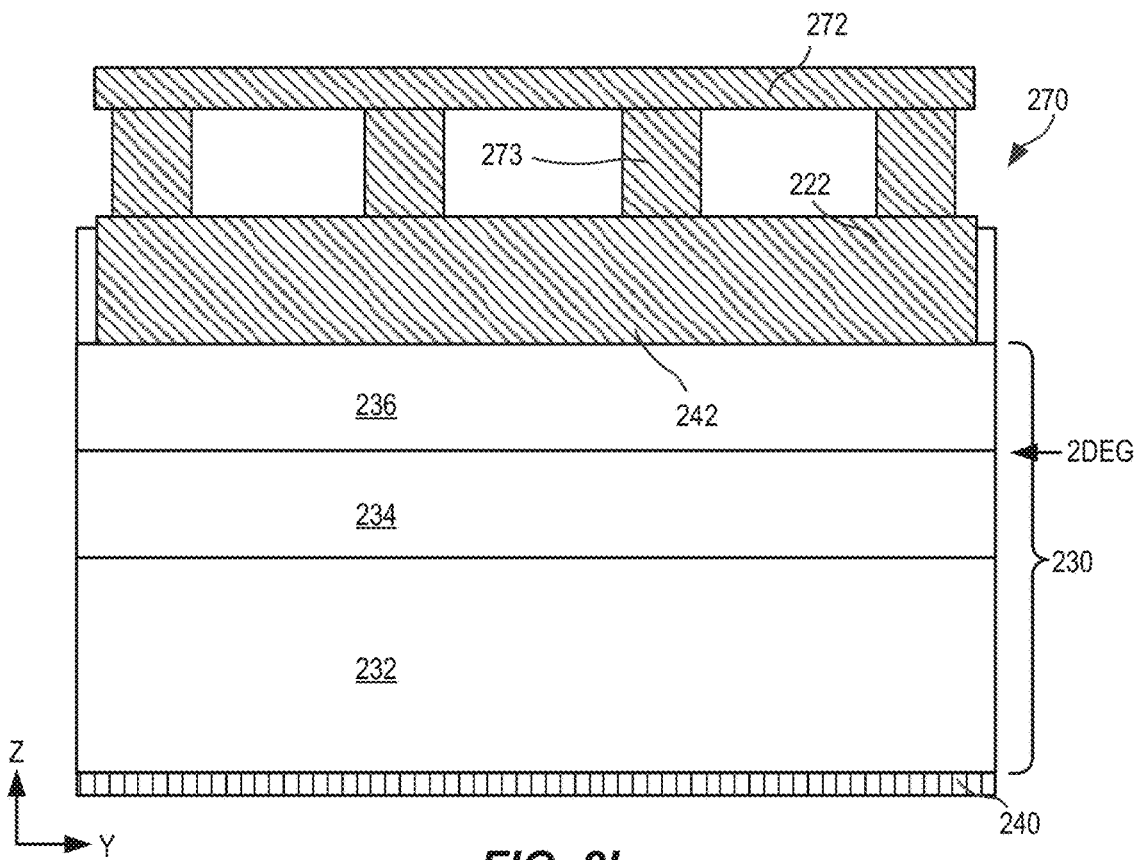
Figure 2J:
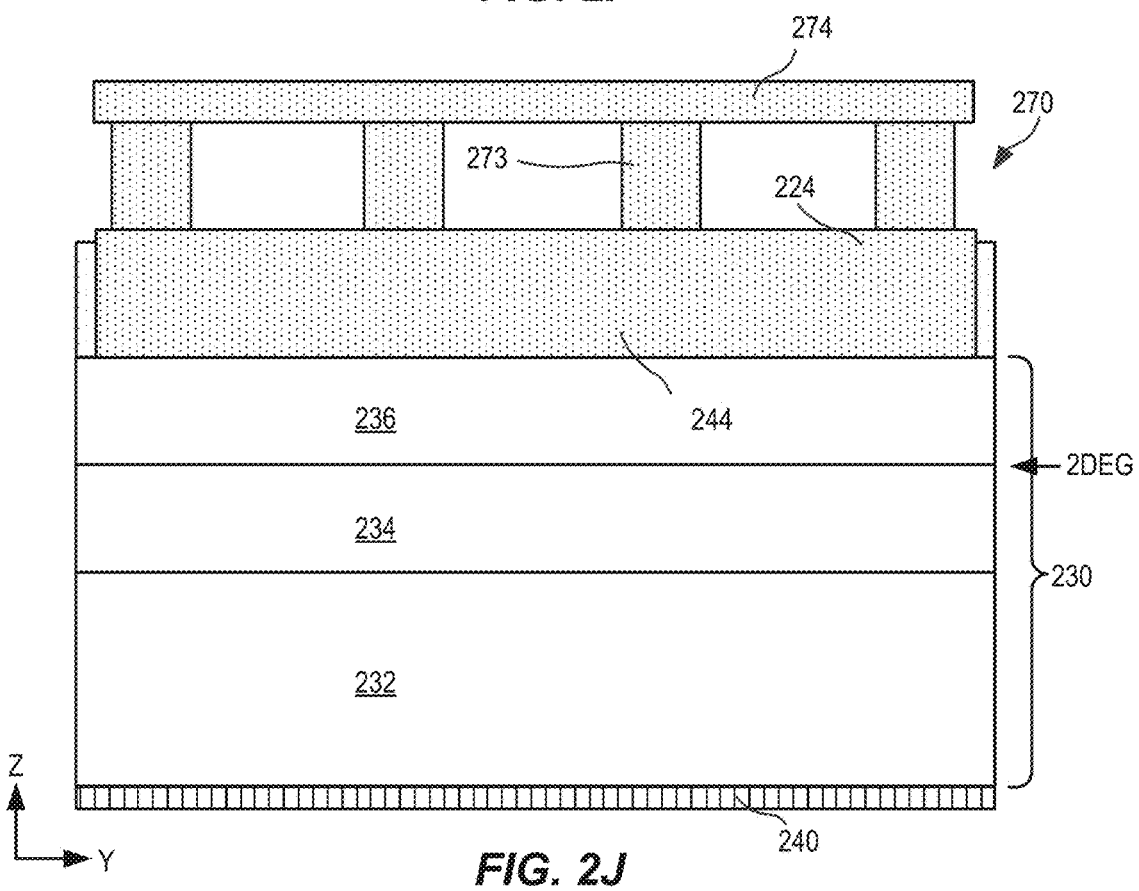

Though FIGS. 2C, 2E, and 2F illustrate embodiments in which the gate manifold 242 and the gate terminal 222 are separate elements and drain gate manifold 244 and the drain terminal 224 are separate elements (e.g., connected by vias), the present invention is not limited thereto. For example, FIGS. 2H-2J illustrate examples in which the gate/drain manifold and terminal are a single element. For example, referring to FIGS. 2H and 2I, a device 200' may be configured so that the gate manifold 242 extends to the surface of the RF transistor amplifier die 210 to serve as the gate terminal 222. Similarly, FIGS. 2H and 2J illustrate that the device 200' may be configured so that the drain manifold 244 extends to the surface of the RF transistor amplifier die 210 to serve as the drain terminal 224.

Figure 2K:
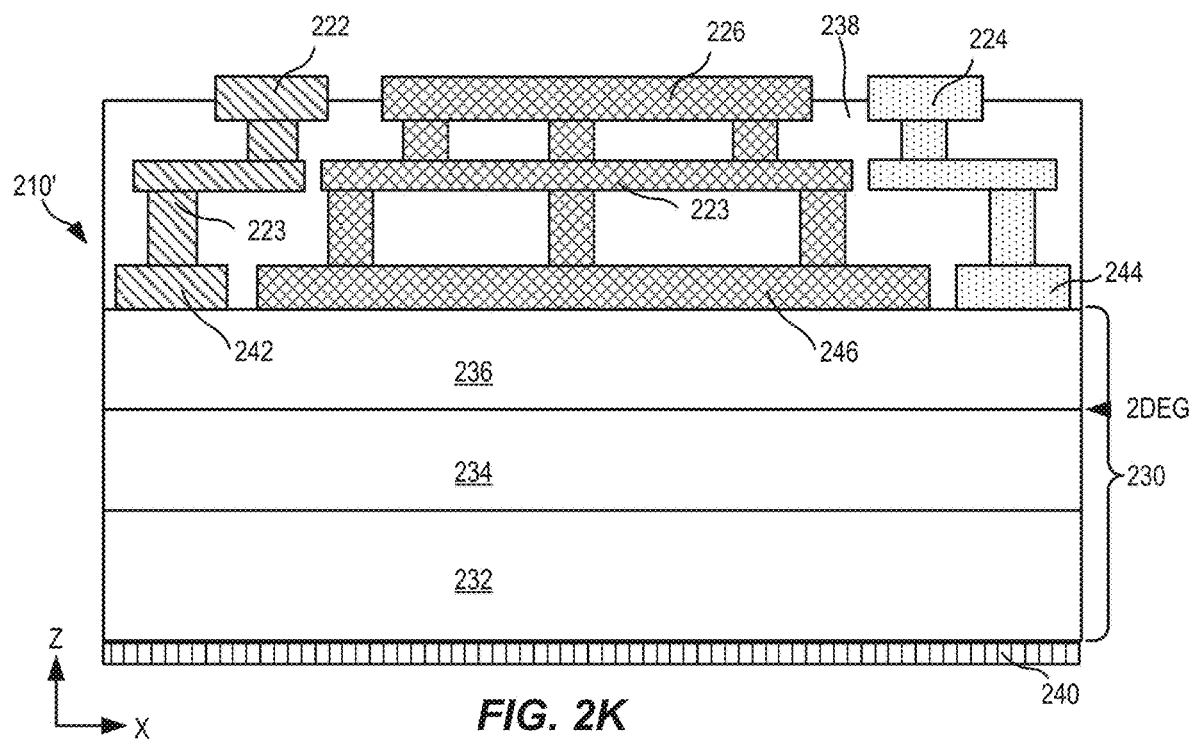

In some embodiments, additional conductive elements and/or discrete circuit components may be formed as part of the RF transistor amplifier die. FIG. 2K illustrates an additional embodiment of an RF transistor amplifier die 210', according to some embodiments of the present invention. FIG. 2K is an embodiment illustrated from the perspective of line 2C-2C of FIG. 2A, with modifications as described herein. For example, as illustrated in FIG. 2K, an RF transistor amplifier die 210' may utilize a number of conductive patterns 223 between the gate manifold 242 and the gate terminal 222, between the drain gate manifold 244 and the drain terminal 222, and/or between one or more of the source fingers 246 and the source terminal 246. The conductive patterns 223 may be formed within the interlayer insulating layer 238 of the RF transistor amplifier die 210'.

The conductive patterns 223 may be utilized to form discrete circuit elements integral to the RF transistor amplifier die 210'. For example, the conductive patterns 223 may form an RDL within the RF transistor amplifier die 210'. FIG. 2K illustrates a fan-in configuration that couples the gate/drain manifolds 242, 244 and the source fingers 246 to the gate, drain, and source terminals 222, 224, 226, respectively. However, the present invention is not limited thereto. In some embodiments, the conductive patterns 223 may also be coupled to discrete circuit elements within the interlayer insulating layer 238, such as in a MMIC configuration. The use of an on-die RDL may allow for more flexible packaging options as well as the integration of certain circuit functions, such as impedance matching and/or harmonic termination.

Figure 2L:
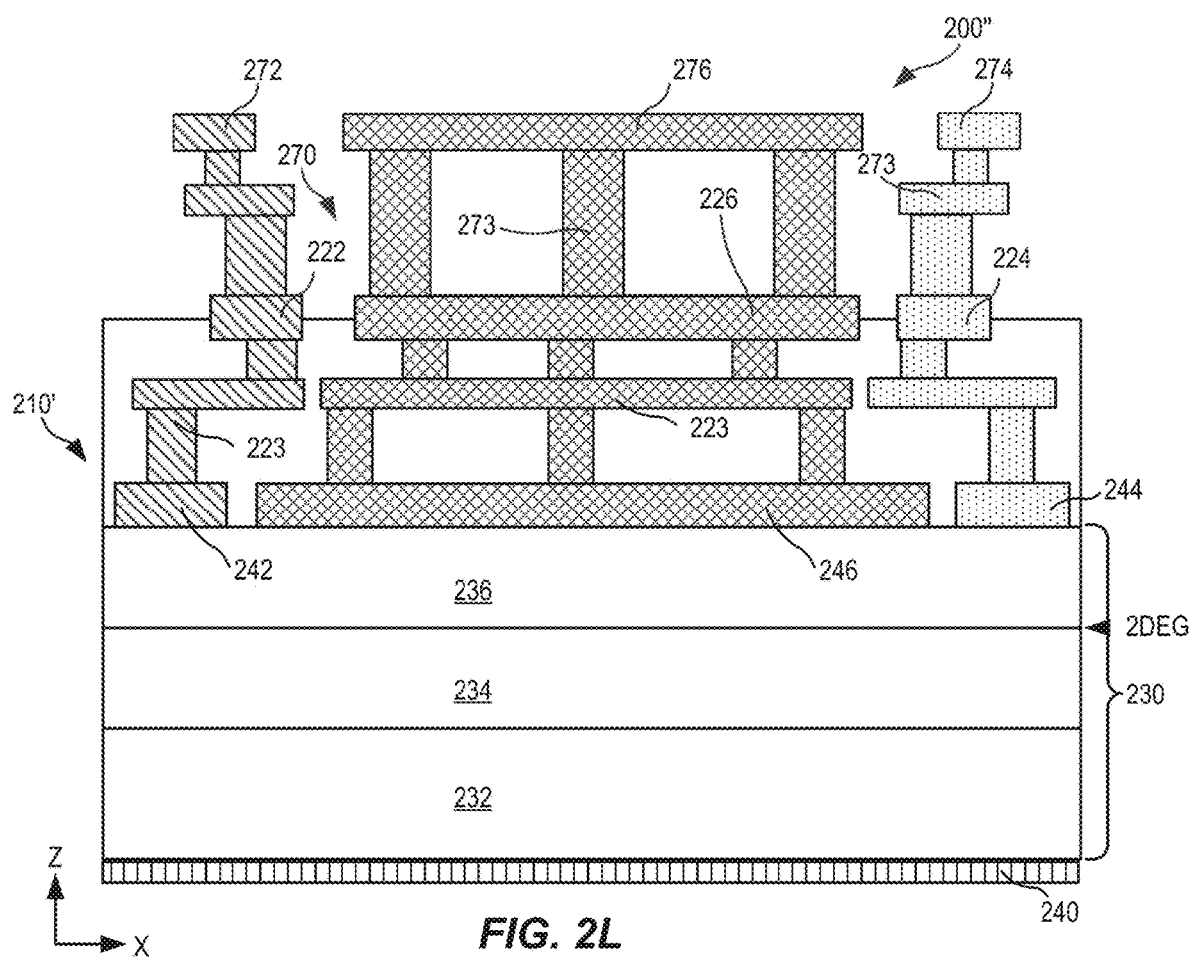

FIG. 2L illustrates that the RF transistor amplifier die 210' may also be used with a coupling element 270 in an RF transistor amplifier 200". The embodiment of FIG. 2L may include a first RDL as part of the RF transistor amplifier die 210' and a second RDL as part of the coupling element 270. In some embodiments, the conductive patterns 223 of the RF transistor amplifier die 210' may provide one or more additional integrated circuits, such as impedance matching or harmonic termination, and the conductive patterns 273 of the coupling element 270 may provide a fan-in, fan-out, or other configuration. In some embodiments, the combination of the coupling element 270 and RF transistor amplifier die 210' may be enclosed in an encapsulating structure (not shown).

Though FIGS. 2A-2L illustrate a semiconductor layer structure 230 that comprises a HEMT it will be understood that other types of semiconductor devices may be formed in the semiconductor layer structure 230 without deviating from the present invention. For example, the semiconductor layer structure 230 may include a MOSFET, a DMOS transistor, a MESFET, and/or an LDMOS transistor. One of ordinary skill in the art will recognize that the arrangement of all of the source/drain/gate contacts on a single side of the semiconductor layer structure 230, including the use of the coupling element 270, may allow for improved connection possibilities and better thermal performance.

By placing gate, drain, and source contacts on a same side of the RF transistor amplifier 200, connection options may be available that were not previously possible. These connection options may also allow for embodiments that can more strongly leverage the improved thermal conductivity of SiC materials.

Figure 3A:
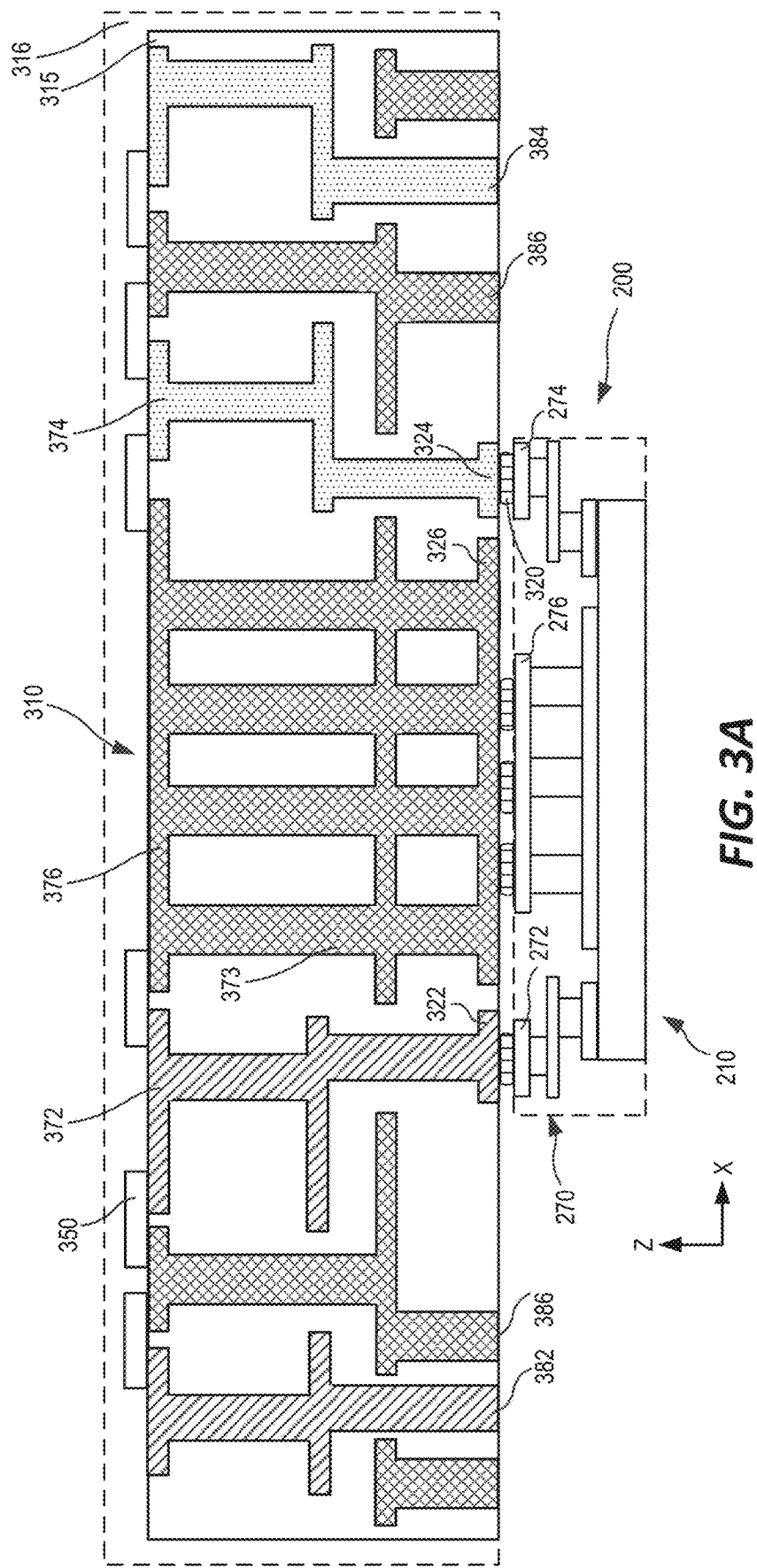
FIG. 3A is a schematic cross-sectional view of an RF transistor amplifier coupled to a circuitry module, according to some embodiments of the present invention.

FIG. 3A is a schematic cross-sectional view of the RF transistor amplifier 200 coupled to a circuitry module 310, according to some embodiments of the present invention. FIG. 3A includes elements of the RF transistor amplifier 200 that have been previously discussed. As such, the discussion of FIG. 3A will focus on those portions of the embodiments that are different from those discussed with respect to the prior figures.

Referring to FIG. 3A, the circuitry module 310 may be configured to couple to the gate connection pad 272, the drain connection pad 274, and the source connection pad 276 of the coupling element 270. For example, the circuitry module 310 may expose interconnection pads 322, 324, 326 that may be configured to be coupled to the gate connection pad 272, the drain connection pad 274, and the source connection pad 276. For example, the first interconnection pad 322 may be configured to couple to the gate connection pad 272, the second interconnection pad 324 may be configured to couple to the drain connection pad 274, and the third interconnection pad 326 may be configured to couple to the source connection pad 276. In some embodiments, a bonding element (e.g., solder balls and/or bumps 320) may be used to respectively couple the first, second, and third interconnection pads 322, 324, 326 to the gate connection pad 272, the drain connection pad 274, and the source connection pad 276. Though illustrated as a single pad, in some embodiments, one or more of the first, second, and/or third interconnection pads 322, 324, 326 may include a plurality of pads.

Each of the first, second, and third interconnection pads 322, 324, 326 may be coupled to one or more conductive patterns 373 within the circuitry module 310. The conductive patterns 373 may provide various routing and/or circuitry within the circuitry module 310. For example, the conductive patterns 373 may connect the first interconnection pad 322 to one or more first surface connection pads 372 and one or more gate lead connection pads 382. Thus, the gate connection pad 272 may be electrically coupled to the one or more first surface connection pads 372 and the one or more gate lead connection pads 382. The conductive patterns 373 may also connect the second interconnection pad 324 to one or more second surface connection pads 374 and one or more drain lead connection pads 384. Thus, the drain connection pad 274 may be electrically coupled to the one or more second surface connection pads 374 and the one or more drain lead connection pads 384. The conductive patterns 373 may also connect the third interconnection pad 326 to one or more third surface connection pads 376 and one or more source lead connection pads 386. Thus, the source connection pad 276 may be electrically coupled to the one or more third surface connection pads 376 and the one or more source lead connection pads 386. Thus, the circuitry module 310 may have a surface (e.g., a top surface) having a plurality of first surface connection pads 372, respective ones of which are coupled to the gate connection pad 272 of the coupling element 270, a plurality of second surface connection pads 374, respective ones of which are coupled to the drain connection pad 274 of the coupling element 270, and a plurality of third surface connection pads 376, respective ones of which are coupled to the source connection pad 276 of the coupling element 270.

The conductive patterns 373 may be encased in an isolation material 315. In some embodiments, the isolation material 315 may include, for example, silicon oxide, silicon nitride, an oxide of the conductive patterns 273, a polymer, a molding compound, or a combination thereof. In some embodiments, circuitry module 310 may be formed as a printed circuit board (PCB). In a PCB embodiment, the isolation material 315 may be the substrate of the PCB, and the conductive patterns 373 may be traces formed within the substrate.

The presence of the conductive patterns 373 and the first, second, and third surface connection pads 372, 374, 376 may allow for a number of different circuits to be coupled to the RF transistor amplifier 200. For example, circuit elements 350 may be coupled (e.g., via solder or other bonding) between two or more of the first, second, and third surface connection pads 372, 374, 376. The circuit elements 350 may provide various electronic capabilities to the RF transistor amplifier 200. For example, the circuit elements 350 may comprise impedances (including, for example, resistive, inductive, and capacitive elements) that may be used for impedance matching and/or harmonic termination. In some embodiments, the circuit elements 350 may provide stripline components and/or baseband termination to the RF transistor amplifier 200.

Though illustrated as being on the surface of the circuitry module 310, it will be understood that additional circuit elements 350 may be provided internally within the circuitry module 310. For example, one or more ground planes may be formed as a circuit element 350 within the circuitry module 310. Similarly, a stripline may be formed within the circuitry module 310 (e.g., in conjunction with one or more ground planes). The configuration of the conductive patterns 373 and the circuit elements 350 illustrated in FIG. 3A are merely examples and are not intended to limit embodiments of the present invention. In some embodiments, the circuit elements 350 and/or the conductive patterns 373 may be configured to provide at least part of harmonic terminating circuitry, matching circuitry, splitting circuitry, combining circuitry, and/or biasing circuitry. Other configurations of the conductive patterns 373 and/or other types of circuit elements 350 may be used without deviating from the scope of the present invention.

In some embodiments, the circuitry module 310 and the circuit elements 350 may be optionally encased within an encapsulating material 316. In some embodiments, the encapsulating material 316 may include, for example, silicon oxide, silicon nitride, a polymer, a molding compound, or a combination thereof.

The gate lead connection pads 382, drain lead connection pads 384, and source lead connection pads 386 may provide terminals to connect signals to the respective gate, drain, and source of the RF transistor amplifier 200. For example, a connection for providing an input signal to the RF transistor amplifier 200 may be coupled to one or more of the gate lead connection pads 382. In some embodiments, a connection for receiving an output signal from the RF transistor amplifier 200 may be coupled to the drain lead connection pads 384. In some embodiments, a ground signal may be coupled to the source lead connection pads 386, though the present invention is not limited thereto. Though the gate lead connection pads 382, drain lead connection pads 384, and source lead connection pads 386 are illustrated as being at a bottom surface of the circuitry module 310, this is merely an example and not intended to limit the present invention. In some embodiments, the various lead connections may be on a top or other surface of the circuitry module 310.

The use of the circuitry module 310 in conjunction with the top-side contacts of the RF transistor amplifier 200 allows for additional functionality, such as impedance matching and/or harmonic termination, to be conveniently added to the RF transistor amplifier 200 without the use of extensive wire bonding. Thus, different functionality and/or capability may be coupled to an RF transistor amplifier 200 simply by using a different circuitry module 310. Because the connection points (e.g., the terminals) of the RF transistor amplifier 200 are consistent, variations in the configuration of the RF transistor amplifier 200 may be accomplished more efficiently than previously available. The reduced or eliminated need for wire bonds may also allow for reduced die size in some applications (where the sizes of the wire bond pads drive die size), and hence the RF transistor amplifier dies according to embodiments of the present invention may also exhibit increased integration density. Thus, the RF amplifier die according to embodiments of the present invention may exhibit improved product assembly consistency, higher yields, increased product integration, reduced cost and improved RF performance, especially for products operating at high frequencies such as millimeter wave frequencies.

The techniques disclosed herein may be particularly beneficial in higher frequency applications as the inductance required in the matching circuits may be much lower in such applications, and hence the use of traditional bond wires may inject too much inductance. Additionally, the tolerances in the bond wire lengths may have a larger impact at higher frequencies, and in high frequency applications (particularly if lower power) the size of the bond pads may drive the size of the die. In some embodiments, any of the RF transistor amplifier dies disclosed herein may be configured to operate at frequencies greater than 1 GHz. In other embodiments, these RF transistor amplifier dies may be configured to operate at frequencies greater than 2.5 GHz. In still other embodiments, these RF transistor amplifier dies may be configured to operate at frequencies greater than 3.1 GHz. In yet additional embodiments, these RF transistor amplifier dies may be configured to operate at frequencies greater than 5 GHz. In some embodiments, these RF transistor amplifier dies may be configured to operate in at least one of the 2.5-2.7 GHz, 3.4-4.2 GHz or 5.1-5.8 GHz frequency bands or sub-portions thereof.

Figure 3B:
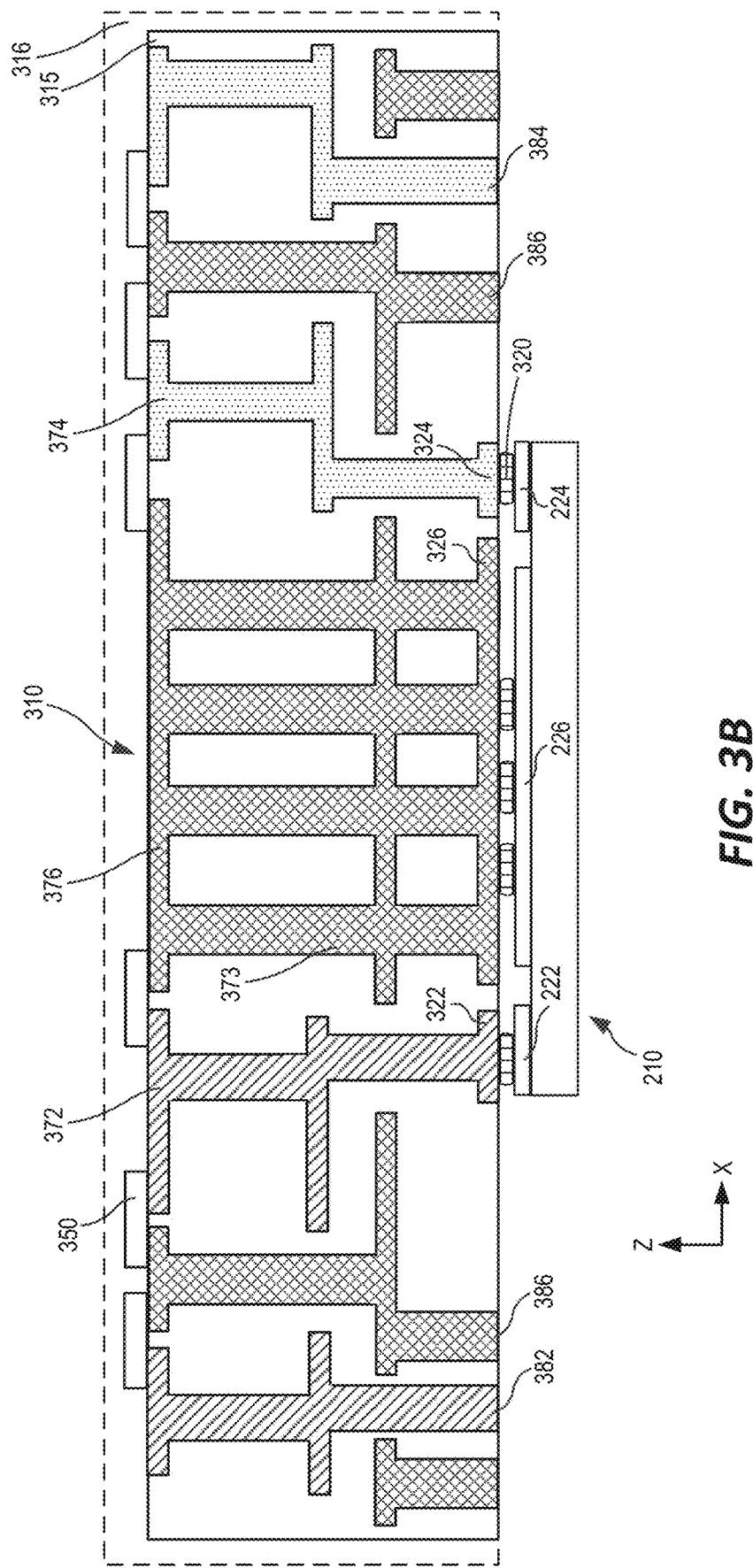
FIG. 3B is a schematic cross-sectional view of an RF transistor amplifier die coupled to a circuitry module, according to some embodiments of the present invention.

FIG. 3B is a schematic cross-sectional view of an RF transistor amplifier die 210 coupled to a circuitry module 310, according to some embodiments of the present invention. FIG. 3B includes elements of the circuitry module 310, circuit elements 350, and RF transistor amplifier die 210 that have been previously discussed. As such, the discussion of FIG. 3B will focus on those portions of the embodiments that are different from those discussed with respect to the prior figures.

FIG. 3B illustrates an embodiment in which the circuitry module 310 is directly connected to the RF transistor amplifier die 210 without an intervening coupling element 270. Thus, the circuitry module 310 may be configured to couple to the gate terminal 222, the drain terminal 224, and one or more of the source terminal(s) 226 of the RF transistor amplifier die 210. For example, the first interconnection pad 322 of the circuitry module 310 may be configured to couple to the gate terminal 222, the second interconnection pad 324 of the circuitry module 310 may be configured to couple to the drain terminal 224, and the third interconnection pad 326 of the circuitry module 310 may be configured to couple to one or more of the source terminal(s) 226. In some embodiments, a bonding element (e.g., solder balls and/or bumps) 320 may be used to respectively couple the first, second, and third interconnection pads 322, 324, 326 to the gate terminal 222, the drain terminal 224, and one or more of the source terminal(s) 226. Though illustrated as a single pad, in some embodiments, one or more of the first, second, and/or third interconnection pads 322, 324, 326 may include a plurality of pads. The configuration illustrated in FIG. 3B may be useful when a fan-in or fan-out configuration of a coupling element 270 is not needed to provide a connection between the RF transistor amplifier die 210 and the circuitry module 310.

Figure 3C:
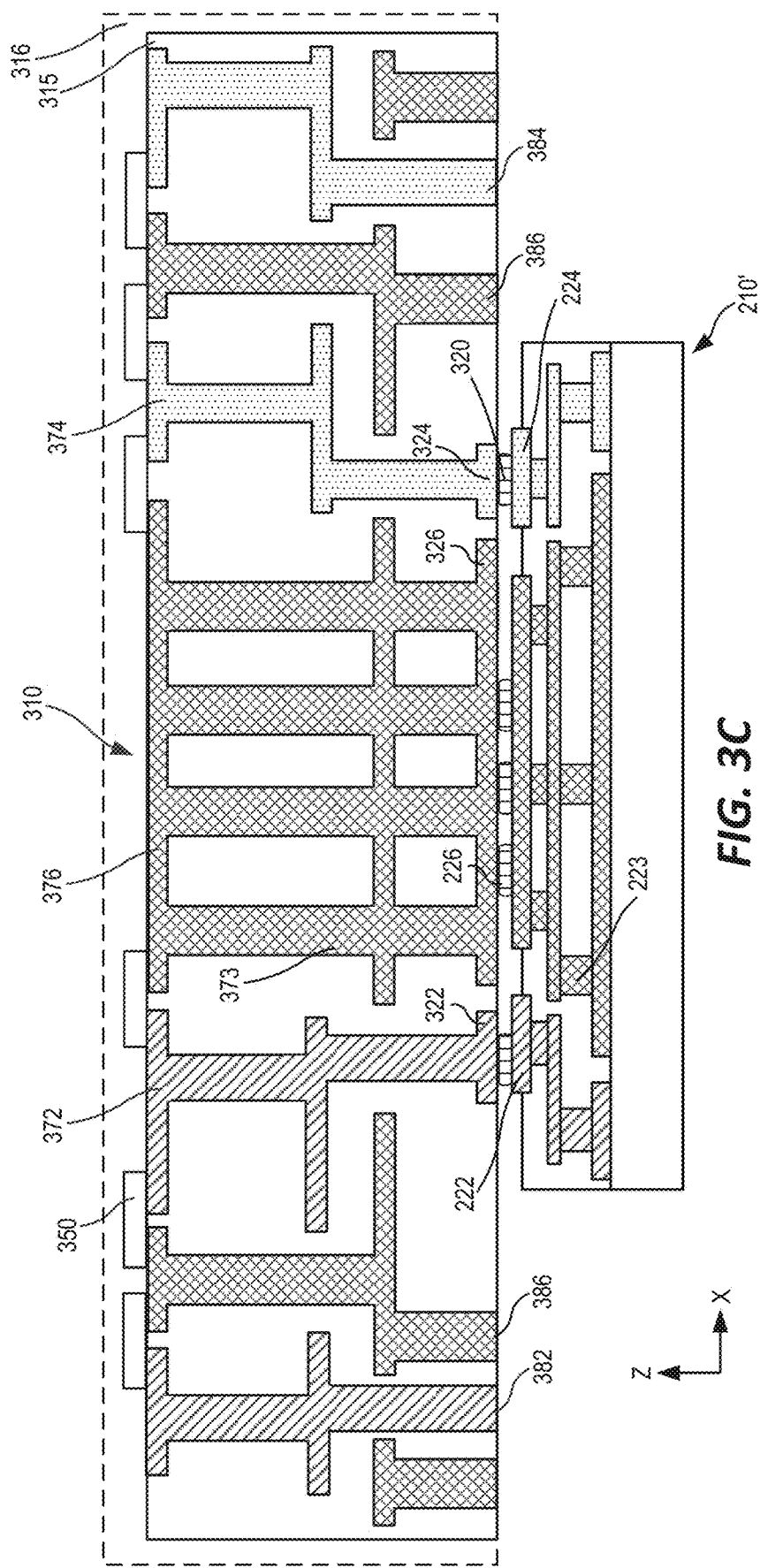
FIG. 3C is a schematic cross-sectional view of an RF transistor amplifier die incorporating a redistribution layer that is coupled to a circuitry module, according to some embodiments of the present invention.

FIG. 3C illustrates an embodiment in which the circuitry module 310 is directly connected to an RF transistor amplifier die 210' that incorporates an on-die RDL utilizing conductive patterns 223 without an intervening coupling element 270. Thus, the circuitry module 310 may be configured to couple to the gate terminal 222, the drain terminal 224, and one or more of the source terminal(s) 226 of the RF transistor amplifier die 210'. The RF transistor amplifier die 210' of FIG. 3C is illustrated in cross-section to show an example of the internal conductive patterns (e.g., of an RDL) coupled to the gate terminal 222, the drain terminal 224, and one or more of the source terminal(s) 226. In some embodiments, the RF transistor amplifier die 210' may be a MMIC. Though illustrated without a coupling element 270, it will be understood that, in some embodiments, the coupling element 270 may also be present between the RF transistor amplifier die 210' and the circuitry module 310.

The use of the coupling element 270 utilizing conductive patterns 273 (if present), the on-die RDL utilizing conductive patterns 223 (if present), and the circuitry module 310 utilizing conductive patterns 373 may provide an interconnect structure between the gate, drain, and source of the RF transistor amplifier die 210 and the gate lead connection pads 382, drain lead connection pads 384, and source lead connection pads 386. By utilizing various combinations of these element and electric bonding techniques, a semiconductor package may be provided that eliminates and/or reduces wire bonding.

Figure 3D:
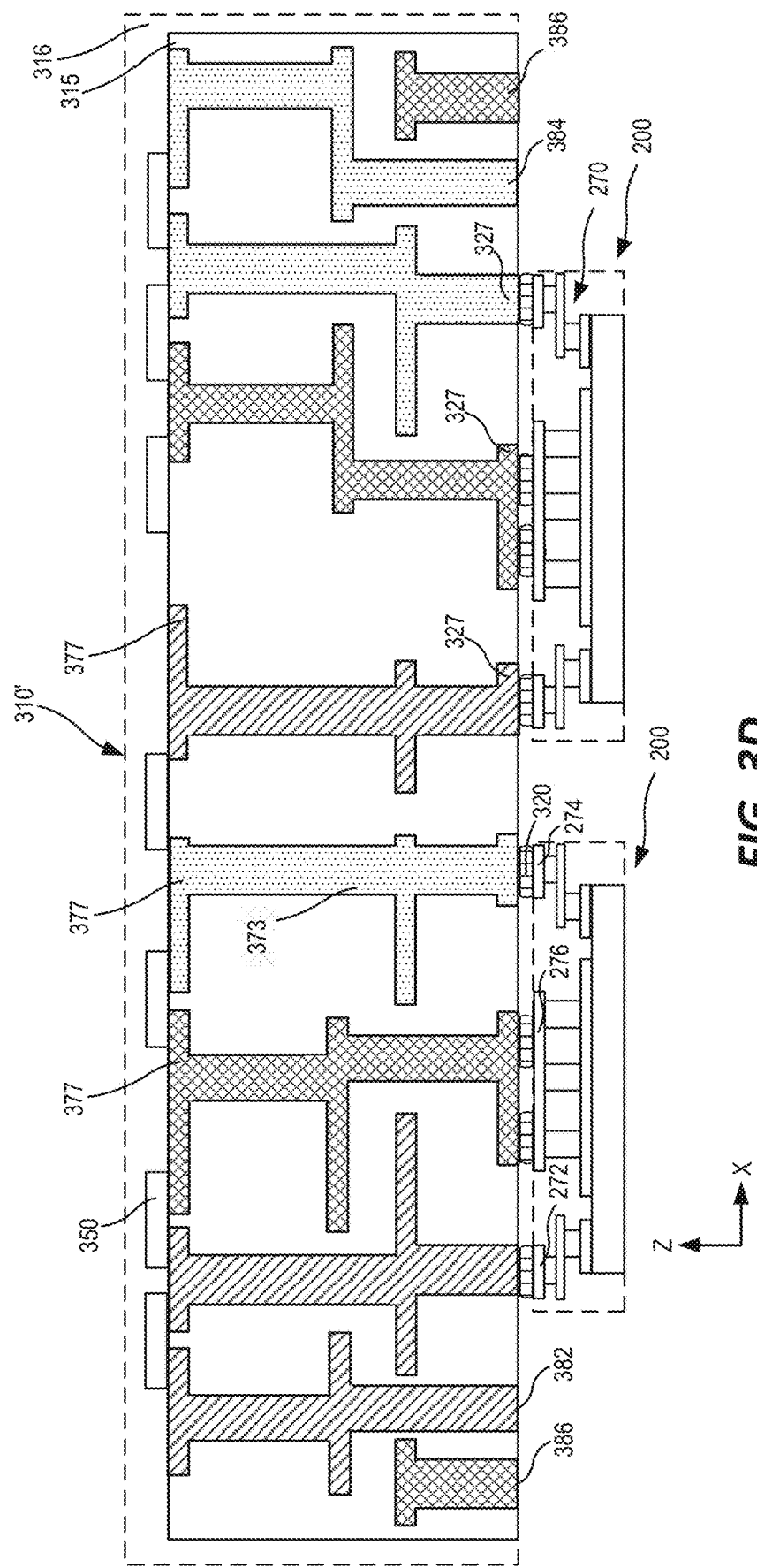
FIG. 3D is a schematic cross-sectional view of a circuitry module coupled to a plurality of RF transistor amplifiers, according to some embodiments of the present invention.
Figure 3E:
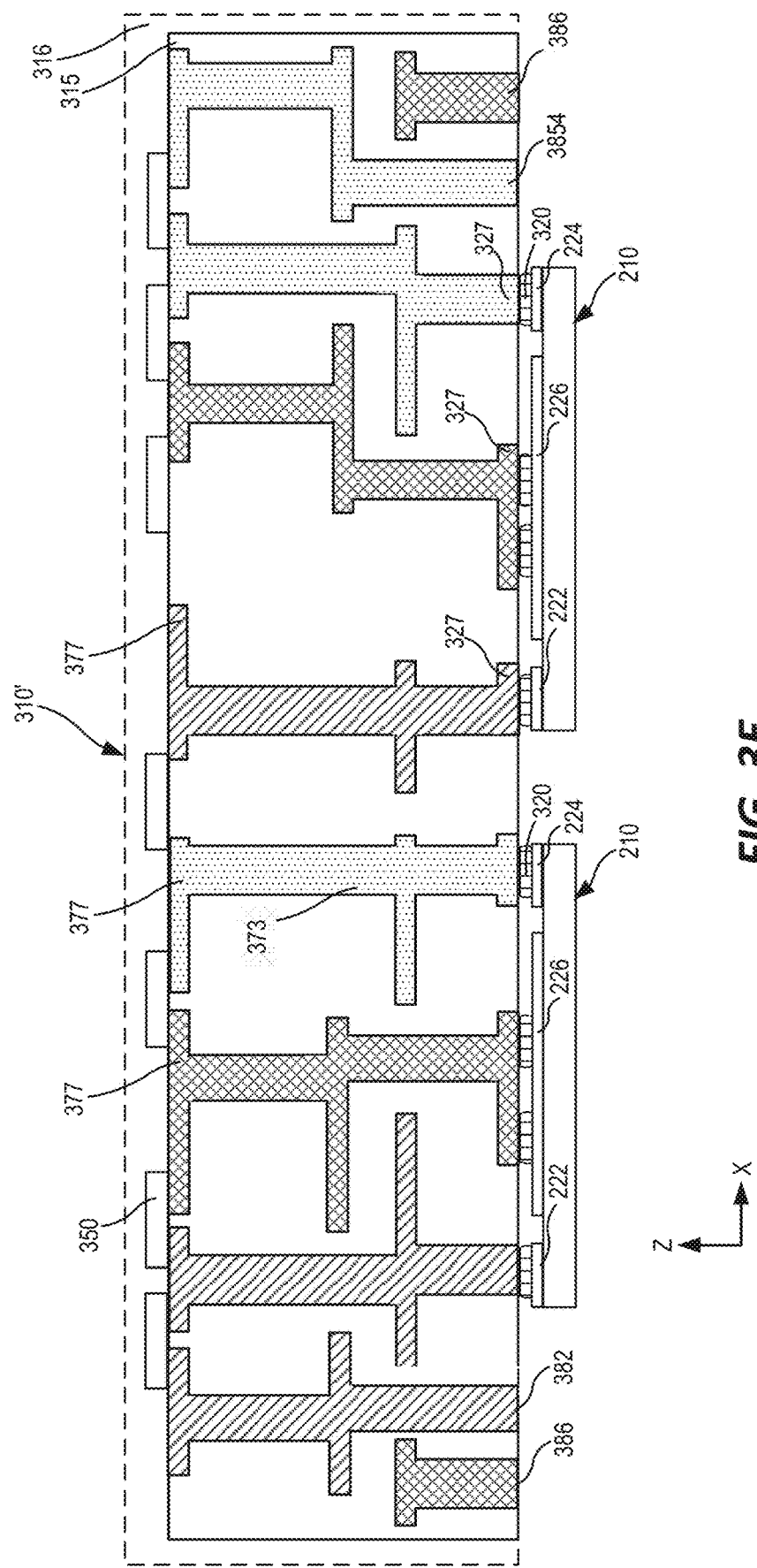
FIG. 3E is a schematic cross-sectional view of a circuitry module coupled to a plurality of RF transistor amplifier dies, according to some embodiments of the present invention.

FIG. 3D is a schematic cross-sectional view of a circuitry module 310' coupled to a plurality of RF transistor amplifiers 200, according to some embodiments of the present invention. FIG. 3E is a schematic cross-sectional view of a circuitry module 310' coupled to a plurality of RF transistor amplifier dies 210, according to some embodiments of the present invention. FIGS. 3E and 3E include elements of a circuitry module 310', circuit elements 350, RF transistor amplifier dies 210, and RF transistor amplifiers 200 that have been previously discussed. As such, the discussion of FIGS. 3D and 3E will focus on those portions of the embodiments that are different from those discussed with respect to the prior figures.

Referring to FIG. 3D, the circuitry module 310' may be configured to couple to more than one RF transistor amplifier 200. FIG. 3D also illustrates that the conductive patterns 373, interconnection pads, and surface connection pads may be modified without deviating from the scope of the invention. For example, the circuitry module 310' may include a plurality of interconnection pads 327. The interconnection pads 327 may be configured to couple to terminals of the plurality of RF transistor amplifiers 200. For example, an interconnection pad 327 of the circuitry module 310' may be configured to couple to a gate connection pad 272, a drain connection pad 274, and/or a source connection pad 276 of one or more of the plurality of RF transistor amplifiers 200.

Similarly, the circuitry module 310' may have surface connection pads 377 coupled to one or more of the interconnection pads 327 via conductive patterns 373. Circuit elements 350 may be coupled to one or more of the surface connection pads 377. By using the conductive patterns 373, interconnection pads 327, surface connection pads 377, and/or circuit elements 350, various circuit connections between the plurality of RF transistor amplifiers 200 may be realized. It will be understood that the configuration illustrated in FIG. 3D is merely a schematic example, and that the routing and connections of the various elements of the circuitry module 310' may be variously modified to generate complex circuits involving the RF transistor amplifiers 200.

In some embodiments, the circuitry module 310' may include one or more gate lead connection pads 382, one or more drain lead connection pads 384, and one or more source lead connection pads 386. Signals provided to the one or more gate lead connection pads 382, one or more drain lead connection pads 384, and one or more source lead connection pads 386 may be distributed through the circuitry module 310' to various ones of the RF transistor amplifiers 200 via the conductive patterns 373.

Though FIG. 3D illustrates an embodiment in which each one of the plurality of RF transistor amplifiers 200 has its own coupling element 270, it will be understood that other configurations are possible. For example, in some embodiments, a single coupling element 270 may be coupled to a plurality of RF transistor amplifier dies 210. The use of a single coupling element 270 may allow for the use of a circuitry module 310' having fewer interconnections to the transistor elements of the circuit.

FIG. 3D illustrates an embodiment in which the circuitry module 310' is coupled to a plurality of RF transistor amplifiers 200 that include coupling element 270. However, the present invention is not limited thereto. In some embodiments, the circuitry module 310' may be directly coupled to a plurality of RF transistor amplifier dies 210, 210' that do not include a coupling element 270. FIG. 3E illustrates an embodiment in which the circuitry module 310' is coupled to a plurality of RF transistor amplifier dies 210. It will be understood that the circuitry module 310' may also be coupled to a plurality of RF transistor amplifier dies 210' (e.g., as illustrated in FIG. 2K) without deviating from the present invention. The circuitry module 310' may be coupled to the RF transistor amplifier die 210, 210' by, for example, bonding element (e.g., solder ball and/or bump) 320. It will be understood that the circuitry module 310 may be coupled to a combination of RF transistor amplifiers 200 that include coupling element 270 and RF transistor amplifier dies 210, 210'.

The circuitry module 310' may be used, for example, to provide interconnections to the RF transistor amplifiers 200 that may be used to implement a multistage and/or multipath amplifier circuit, such as a Doherty amplifier. The conductive patterns 373 may provide the electrical connections of the multistage and/or multipath amplifier circuit, which may be coupled to ones of the circuit elements 350 to provide capacitors, inductors, resistors, and/or other circuit elements used in the multistage and/or multipath amplifier circuit. Thus, the circuitry module 310' may be configured to provide modular interconnections that can be easily coupled to a plurality of RF transistor amplifiers without the use of bond wires.

Though FIGS. 3A to 3E illustrate various combinations of circuitry modules 310, 310', coupling elements 270, and RF transistor amplifier dies 210, 210', it will be understood that the present invention is not limited to the specific combinations illustrated in those figures. As will be understood by one of ordinary skill in the art, the of circuitry modules 310, 310', coupling elements 270, and RF transistor amplifier dies 210, 210' may be combined in multiple variations, including those not specifically illustrated, without deviating from the present invention. For example, embodiments of the present invention include the transistor amplifier die 210, 210' directly coupled to the circuitry module 310, 310'. Some embodiments of the present invention include the transistor amplifier die 210, 210' coupled to the circuitry module 310, 310' via a coupling element 270. The coupling element 270 and/or the circuitry module 310, 310' may include PCB or metal core PCB as well as traces on a patterned dielectric material. In some embodiments, the transistor amplifier die 210' may have conductive patterns such as an RDL at the die level, which may include a fan-in and/or fan-out configuration that may be connected to other structures, such as the coupling element 270 or circuitry module 310, 310'.

Figure 4A:
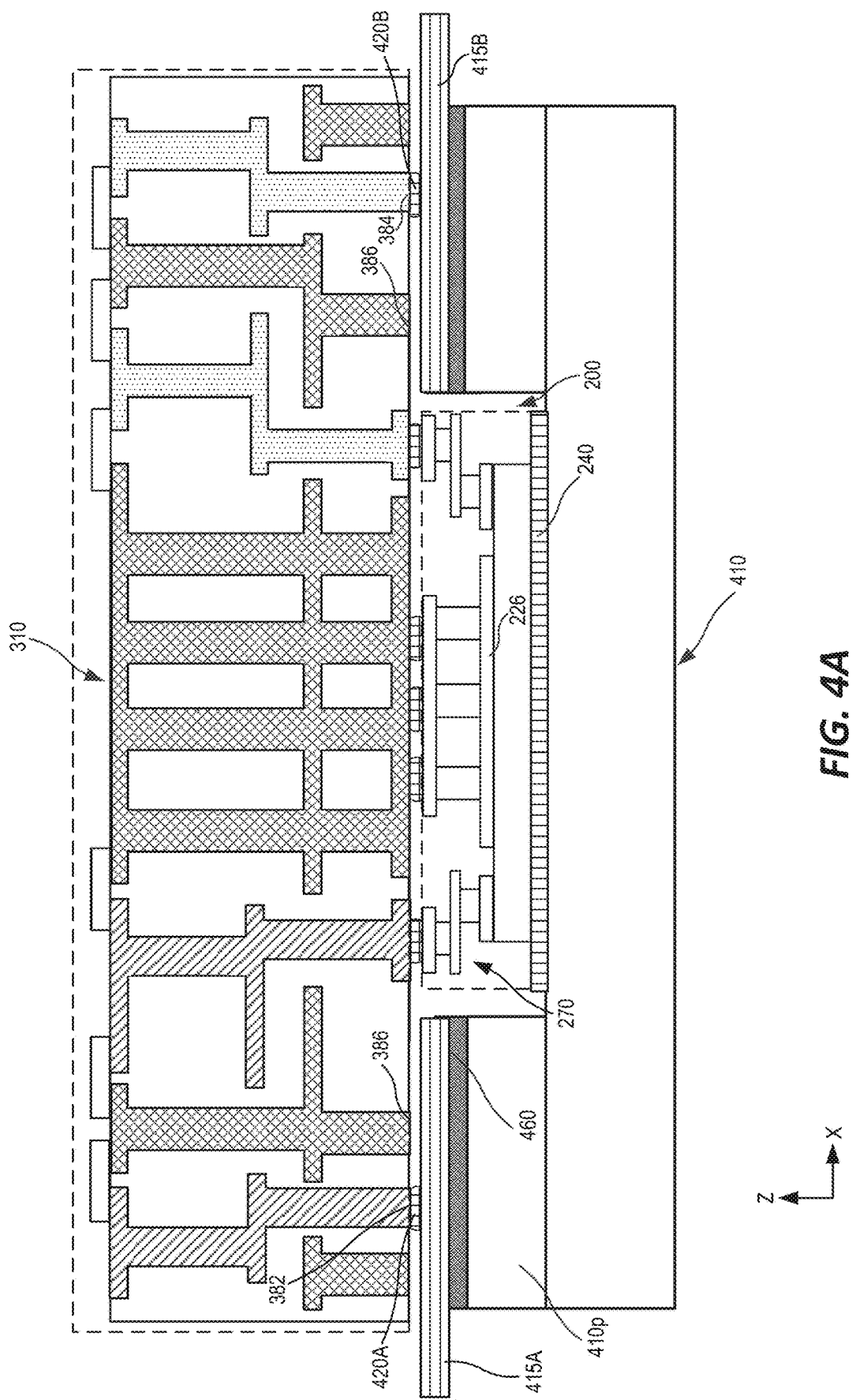
FIG. 4A is a schematic cross-sectional view of an RF transistor amplifier and circuitry module coupled to a carrier substrate, according to some embodiments of the present invention.
Figure 4B:
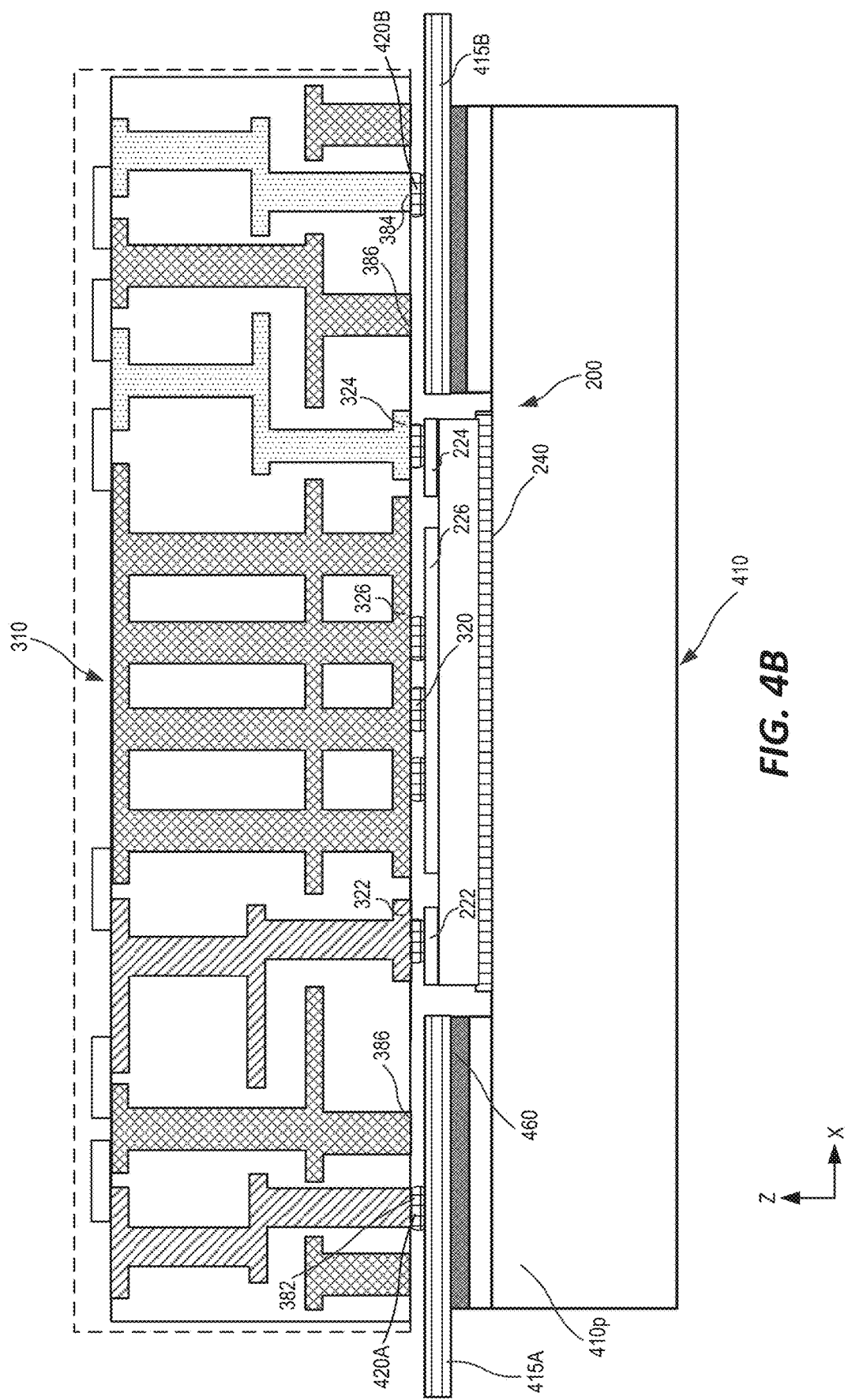
FIG. 4B is a schematic cross-sectional view of an RF transistor amplifier and circuitry module coupled to a carrier substrate without a coupling element, according to some embodiments of the present invention.

FIG. 4A is a schematic cross-sectional view of the RF transistor amplifier 200 and circuitry module 310 coupled to a carrier substrate 410, according to some embodiments of the present invention. FIG. 4B is a schematic cross-sectional view of the RF transistor amplifier 200 coupled to the carrier substrate 410 without a coupling element 270, according to some embodiments of the present invention. FIGS. 4A and 4B include elements of the RF transistor amplifier 200, coupling element 270, and circuitry module 310 that have been previously discussed. As such, the discussion of FIGS. 4A and 4B will focus on those portions of the embodiments that are different from those discussed with respect to the prior figures.

Referring to FIG. 4A, the RF transistor amplifier 200 may be placed upon a carrier substrate 410. The carrier substrate 410 may comprise any structure that provides a suitable mounting surface for the RF transistor amplifier 200. In some embodiments, the carrier substrate 410 may comprise a temperature conductive element such a metal flange. In some embodiments, the carrier substrate 410 may comprise, for example, an RDL laminate structure or a PCB. In some embodiments, the carrier substrate 410 may include copper, molybdenum, and/or combinations thereof. In some embodiments, the carrier substrate 410 may be composed of multiple layers and/or contain vias/interconnections. The carrier substrate 410 may be configured to allow the RF transistor amplifier 200 to be easily packaged. As illustrated in FIG. 4A, a circuitry module 310 may be coupled to the RF transistor amplifier 200 as discussed herein.

In some embodiments, the thermal layer 240 may be placed between the bottom surface of the RF transistor amplifier 200 and the carrier substrate 410. The thermal layer 240 may assist in the transfer of thermal energy from the RF transistor amplifier 200 to the carrier substrate 410. In embodiments in which SiC is utilized as part of the RF transistor amplifier 200, the excellent thermal conductivity of SiC may allow for the carrier substrate 410 to more efficiently dissipate heat of the device. In some embodiments, the thermal layer 240 may include, or be replaced by, a eutectic layer.

One or more leads 415 may be coupled to the one or more gate lead connection pads 382, one or more drain lead connection pads 384, and one or more source lead connection pads 386 of the circuitry module 310. For example, a first input lead 415A may be coupled to the one or more gate lead connection pads 382 (e.g., via bonding layer 420A, such as solder) to provide an input signal to the RF transistor amplifier 200, and a second output lead 415B may be coupled to the one or more drain lead connection pads 384 (e.g., via bonding layer 420B, such as solder) to receive an output signal from the RF transistor amplifier 200, though the present invention is not limited thereto.

The lead connections of FIG. 4A are merely an example and other connection and/or connection pads are possible. For example, in FIG. 4A the one or more source lead connection pads 386 are illustrated as being connected to both of the leads 415A and 415B. However, in some embodiments, the one or more source lead connection pads 386 may not be coupled to the source of the RF transistor amplifier 200 (e.g., through the one or more source terminal(s) 226). For example, in some embodiments, one or more of the circuit elements 350 and/or conductive patterns 373 may be configured to control whether the one or more source lead connection pads 386 are coupled to an input lead 415A, an output lead 415B, or neither. For example, a circuit element 350 may be provided on the circuitry module 310 to connect the source terminal 226 of the RF transistor amplifier 200 to a lead 415. Similarly, the circuitry module 310 may be configured to allow the removal of a circuit element 350 (e.g., a resistor) to disconnect a coupling between a lead 415A or 415B and the source terminal 226 of the RF transistor amplifier 200.

In addition, though FIG. 4A illustrates an embodiment in which there are two leads 415A and 415B, this is merely an example and not intended to limit the invention. In some embodiments, multiple leads may be provided, respective ones of which are coupled to the gate lead connection pads 382, drain lead connection pads 384, source lead connection pads 386, and/or combinations thereof. For example, in some embodiments, an additional lead may be provided that is configured to provide a ground connection to the source lead connection pads 386. In some embodiments, the source lead connections pads 386 may be configured to couple, for example, to a lead of an RF semiconductor package, which may be coupled to ground. As used herein, the combination of the RF transistor amplifier 200, the circuitry module 310, the leads 415A, 415B, and the carrier substrate 410 may be referred to as a packaged RF transistor amplifier, an RF transistor amplifier package, or simply an RF transistor amplifier.

The leads 415A, 415B may be between the circuitry module 310 and the carrier substrate 410, but the present invention is not limited thereto. In some embodiments, the carrier substrate 410 may have pedestals 410p that are under and, in some embodiments, supporting the leads 415A and 415B, though the present invention is not limited thereto. In some embodiments, the pedestals 410p may include an insulating material and/or may be separated from the leads 415A, 415B by an insulating layer 460. In some embodiments, as will be discussed further herein, the leads 415A, 415B may be supported by a portion of the package of the RF transistor amplifier 200.

Though FIG. 4A illustrates the use of coupling element 270, the present invention is not limited thereto. FIG. 4B illustrates an embodiment in which the coupling element is omitted. In the embodiment of FIG. 4B, the circuitry module 310 may have first, second, and third interconnection pads 322, 324, 326 that are spaced apart from one another at distances similar to those of the gate terminal 222, drain terminal 224, and one or more source terminal(s) 226. For example, the first interconnection pad 322 may be connected (e.g., via a bonding elements such as solder ball and/or bump 320) to the gate terminal 222, the second interconnection pad 324 may be connected to the drain terminal 224, and the third interconnection pad 326 may be connected to the source terminal 226. The direct connection to the circuitry module 310 may be useful when an adjustment to the spacing (e.g., via a fan-in or fan-out structure) of the terminals of the RF transistor amplifier 200 is not needed. Thus, in some embodiments, the coupling element 270 is optional in the RF transistor amplifier 200.

Figure 4C:
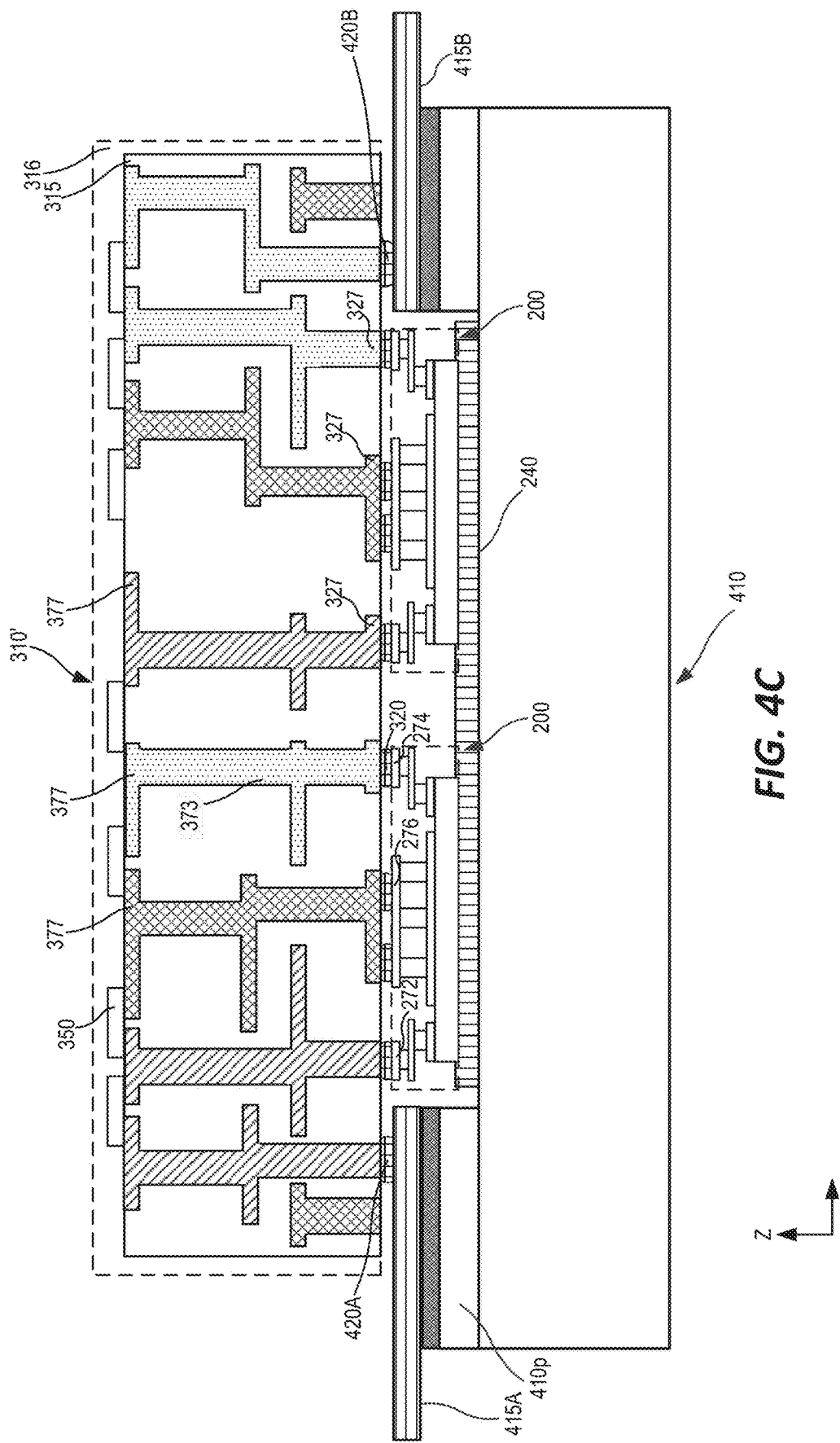
FIG. 4C is a schematic cross-sectional view of a plurality of RF transistor amplifier dies coupled to a circuitry module and placed on a carrier substrate, according to some embodiments of the present invention.

FIG. 4C illustrates an embodiment in which a plurality of RF transistor amplifiers 200 are coupled to a circuitry module 310' and placed on a carrier substrate 410. For example, as discussed herein with respect to FIGS. 3D and 3E, a plurality of RF transistor amplifier dies 210, 210' may be coupled to a circuitry module 310'. The plurality of RF transistor amplifier dies 210, 210' may be coupled to the circuitry module 310' via a coupling element 270 or directly to the circuitry module 310' (as illustrated in FIG. 3E. The RF transistor amplifier dies 210, 210' and/or the circuitry module 310' may be further placed on a carrier substrate 410, with leads 415A and 415B coupled thereto. In some embodiments, a thermal layer 240 may be placed between the RF transistor amplifier dies 210, 210' and the carrier substrate 410.

Though FIGS. 4A to 4C illustrate various combinations of circuitry modules 310, 310', coupling elements 270, and RF transistor amplifier dies 210, 210', it will be understood that the present invention is not limited to the specific combinations illustrated in those figures. As will be understood by one of ordinary skill in the art, the of circuitry modules 310, 310', coupling elements 270, and RF transistor amplifier dies 210, 210' may be combined in multiple variations, including those not specifically illustrated, without deviating from the present invention. Each of these combinations may be placed on a carrier substrate 410, as generally illustrated in FIGS. 4A to 4C, with appropriate leads (e.g., leads 415A, 415B) connected thereto.

Figure 5A:
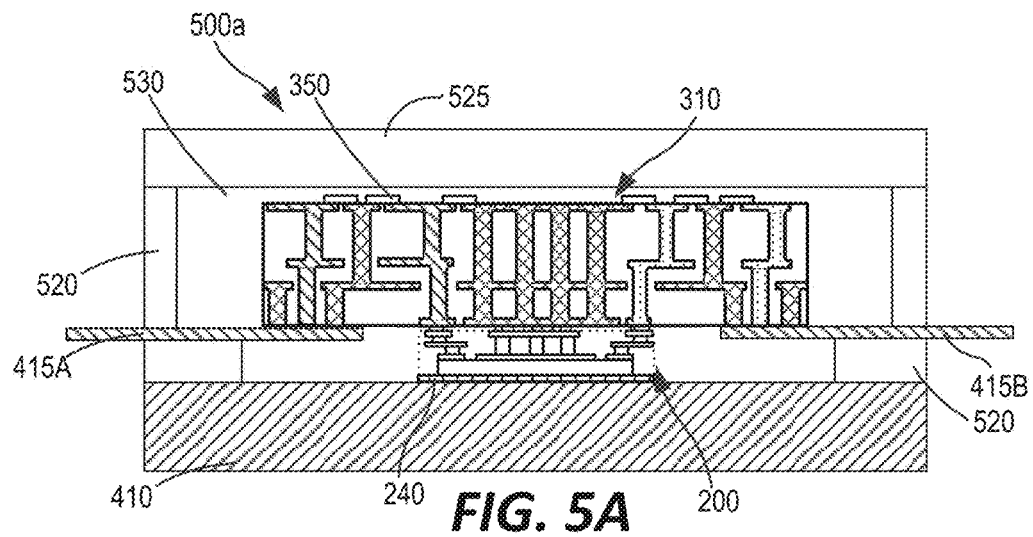
FIGS. 5A to 5C are schematic views of various packaging options of the RF transistor amplifier, according to some embodiments of the present invention.
Figure 5B:
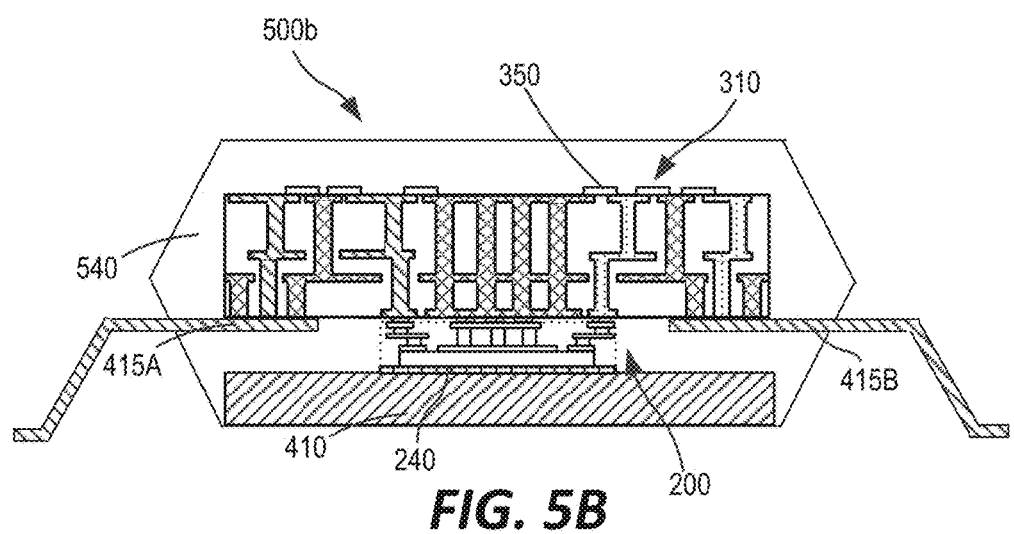
Figure 5C:
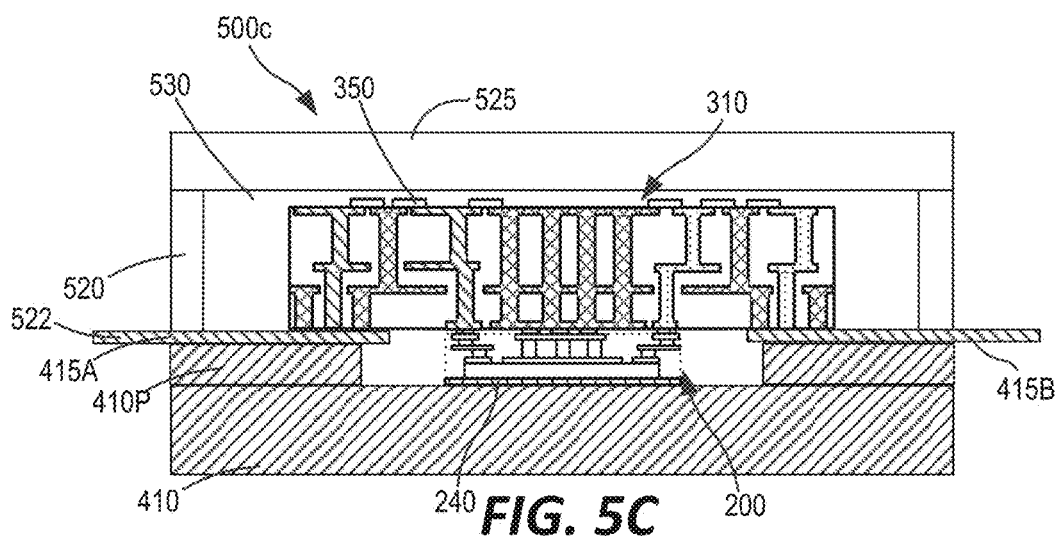

FIGS. 5A to 5C are schematic cross-sectional views of various packaging options 500a, 500b, 500c of the RF transistor amplifier 200, according to some embodiments of the present invention. FIGS. 5A to 5C include elements of the RF transistor amplifier 200, coupling element 270, and circuitry module 310 that have been previously discussed. As such, the discussion of FIGS. 5A to 5C will focus on those portions of the embodiments that are different from those discussed with respect to the prior figures.

Referring to FIG. 5A, a semiconductor package 500a may incorporate the RF transistor amplifier 200 according to some embodiments of the present invention. The semiconductor package 500a may be, for example, an open-air or open-cavity package. The semiconductor package 500a may include a carrier substrate 410, sidewalls 520, and a lid 525. The carrier substrate 410, sidewalls 520, and lid 525 may define an internal cavity 530. The RF transistor amplifier 200 and circuitry module 310 may be disposed inside the internal cavity 530. The term "semiconductor package" is not intended to be limiting. As previously noted, the combination of the RF transistor amplifier 200, the circuitry module 310, the leads 415A, 415B, and the carrier substrate 410 may be referred to as a packaged RF transistor amplifier, a semiconductor package, or simply an RF transistor amplifier.

The carrier substrate 410 may include materials configured to assist with the thermal management of the semiconductor package 500a. For example, the carrier substrate 410 may include copper and/or molybdenum. In some embodiments, the carrier substrate 410 may be composed of multiple layers and/or contain vias/interconnections. In an example embodiment, the carrier substrate 410 may be a multilayer copper/molybdenum/copper metal flange that comprises a core molybdenum layer with copper cladding layers on either major surface thereof. The provided examples of the materials of the carrier substrate 410 are not intended to limit the present invention. In some embodiments, a thermal layer 240 may be between the RF transistor amplifier 200 and the carrier substrate 410.

The sidewalls 520 and/or lid 525 may be formed of or include an insulating material in some embodiments. For example, the sidewalls 520 and/or lid 525 may be formed of or include ceramic and/or a PCB. In some embodiments, the sidewalls 520 and/or lid 525 may be formed of, for example, $Al_2O_3$. The lid 525 may be glued to the sidewalls 520 using an epoxy glue. The sidewalls 520 may be attached to the carrier substrate 410 via, for example, brazing. The leads 415A, 415B may be configured to extend through the sidewalls 520, though the present invention is not limited thereto.

In some embodiments, the RF transistor amplifier 200 may be disposed on the carrier substrate 410 and the leads 415A, 415B, and the circuitry module 310 may be disposed on the RF transistor amplifier 200. The leads 415A, 415B may be coupled to the circuitry module 310 using, for example, a conductive die attach material. In some embodiments, the leads 415A, 415B may extend from the sidewalls 520 to contact the circuitry module 310. As such, in some embodiments, the use of wire bonds to connect the RF transistor amplifier 200 to leads 415A, 415B may be avoided and/or reduced.

Additional circuit elements 350 are mounted on the circuitry module 310. These additional components may include, for example, input matching components and output matching components that are used to impedance match at the fundamental frequency and/or to terminate intermodulation products to ground. These circuit elements 350 may be passive RF components that include resistors, capacitors and/or inductors that are implemented (at least partially) in integrated passive devices or printed circuit boards, for example. Leads 415A, 415B allow the RF transistor amplifier 200 to be connected to external devices/circuits/power sources. In the depicted embodiment, circuitry module 310 is used to connect the conductive leads 415A, 415B to circuit elements 350 on the circuitry module 310. An RF signal input to the RF transistor amplifier 200 on a first lead 415A may be passed through the circuitry module 310 to circuit elements 350 and from there to a gate terminal 222 of the RF transistor amplifier die 210, and the amplified output RF signal may be passed from the drain terminal 224 of the RF transistor amplifier die 210 to the circuit elements 350 and from there through the circuitry module 310 where the RF signal is output through lead 415B.

Referring to FIG. 5B, a semiconductor package 500b may incorporate the RF transistor amplifier 200 according to embodiments of the present invention. The semiconductor package 500b may be, for example, an overmolded plastic (OMP) package. The semiconductor package 500b may include a carrier substrate 410 upon which the RF transistor amplifier 200 is disposed. The circuitry module 310 may be disposed on the RF transistor amplifier 200.

The RF transistor amplifier 200 and the circuitry module 310 may be encased in an overmold material 540. The overmold material 540 may be formed of a plastic or a plastic polymer compound, which is injection molded around RF transistor amplifier 200 and/or the circuitry module 310, thereby providing protection from the outside environment.

Methods of manufacturing an OMP semiconductor package 500b that may be modified to incorporate the RF transistor amplifier 200 and/or the circuitry module 310 are described in U.S. Pat. No. 9,515,011 entitled "Over-mold plastic packaged wide band-gap power transistors and MMICS," to Wood et al., issued Dec. 6, 2016, the disclosure of which is incorporated herein by reference as if set forth fully herein. In the semiconductor package 500b according to the present invention, leads 415A, 415B may extend from outside the semiconductor package 500b and into the overmold material 540 so as to connect to the circuitry module 310. As such, in some embodiments, the use of wire bonds to connect the RF transistor amplifier 200 to leads 415A, 415B may be avoided and/or reduced.

As in semiconductor package 500a, the carrier substrate 410 of semiconductor package 500b may include materials configured to assist with thermal management. For example, the carrier substrate 410 may include copper and/or molybdenum. In some embodiments, the carrier substrate 410 may be composed of multiple layers and/or contain vias/interconnections. In some embodiments, the carrier substrate 410 may include a metal heat sink that is part of a lead frame or metal slug that is at least partially surrounded by a plastic overmold 540. The provided examples of the materials of the carrier substrate 410 are not intended to limit the present invention. In some embodiments, a thermal layer 240 may be between the RF transistor amplifier 200 and the carrier substrate 410.

FIG. 5C is a schematic cross-sectional view of a packaged RF transistor amplifier 500c that includes an RF transistor amplifier die in a printed circuit board based package. The packaged RF transistor amplifier 500c is very similar to the packaged RF transistor amplifier 500a discussed above with reference to FIG. 5A except that the leads 415A, 415B of packaged RF transistor amplifier 500c are replaced with a printed circuit board 522 that includes traces 415A, 415B that act as the input and output leads. The printed circuit board 522 may be attached to the carrier substrate 410 via, for example, a conductive glue. The carrier substrate 410 may include, for example, pedestals 410P. The pedestals 410P may be constructed of an insulating material and/or a metal. The printed circuit board 652 may include a central opening and the circuitry module 310 is mounted within this opening on the carrier substrate (e.g., metal flange) 410. The RF transistor amplifier 200 and the circuit elements 350 are mounted on the circuitry module 310.

Though FIGS. 5A to 5C illustrate the use of an RF transistor amplifier 200 having a coupling element 270, the present invention is not limited thereto. In some embodiments, the semiconductor packages 500a, 500b, 500c may be configured to include a circuitry module 310 that is directly coupled to the RF transistor amplifier die 210 as illustrated within FIGS. 3B, 3C, and 4B. In some embodiments, the semiconductor packages 500a, 550b, and 500c may be configured to include a circuitry module 310 that is coupled to a plurality of RF transistor amplifiers 200, 200' and/or a plurality of RF transistor amplifier dies 210, 210 as illustrated in FIGS. 3D, 3E, and 4C.

It will be appreciated that any of the RF transistor amplifiers according to embodiments of the present invention that are discussed herein may be mounted in packages such as the packages shown in FIGS. 5A through 5C. Thus, the RF transistor amplifier die 210, coupling element 270, and/or circuitry modules 310 shown in FIGS. 5A-5C, may be replaced with the RF transistor amplifier die 210,210', coupling element 270, and/or circuitry modules 310, 310' according to any of the embodiments of the present invention that are discussed herein to provide many further embodiments of packaged RF transistor amplifiers. Depending on the embodiment, the packaged RF transistor amplifier can include a monolithic microwave integrated circuit (MMIC) as the RF transistor amplifier die where the RF transistor amplifier die incorporates multiple discrete circuits in a single integrated die. Additionally and/or alternatively, the package can comprise multiple RF transistor amplifier die in a path that are connected in series to form a multiple stage RF transistor amplifier and/or multiple RF transistor amplifier die that are disposed in multiple paths (e.g., in parallel) to form an RF transistor amplifier with multiple transistor amplifier die and multiple paths, such as in a Doherty amplifier configuration. In some embodiments, the packaged RF transistor amplifier may include RF transistor amplifier die according to embodiments of the present invention that have conducive gate and/or conductive drain vias that provide electrical connections to a back side interconnection structure as well as traditional RF transistor amplifier die that have gate and drain terminals that are connected to other structures via wire bonds.

Though in some embodiments described herein, circuit elements 350 may be placed on a top surface of the circuitry module 310, the embodiments described herein are not limited thereto. FIGS. 6A to 6C are schematic cross-sectional views of additional embodiments of an RF transistor amplifier 200 coupled to a circuitry module 610, according to some embodiments of the present invention. FIGS. 6A to 6C correspond to the cross-section of FIG. 3A. FIGS. 6A to 6C include elements of the RF transistor amplifier 200 that have been previously discussed. As such, the discussion of FIGS. 6A to 6C will focus on those portions of the embodiments that are different from those discussed with respect to the prior figures.

Referring to FIG. 6A, the circuitry module 610 may be configured to couple to the gate connection pad 272, the drain connection pad 274, and the source connection pad 276 of the coupling element 270. The coupling element 270 may be coupled to RF transistor amplifier die 210, as discussed herein with respect to, for example, FIGS. 2A to 2L.

For example, the circuitry module 610 may have exposed interconnection pads 622, 624, 626 that may be configured to be coupled to the gate connection pad 272, the drain connection pad 274, and the source connection pad 276, respectively. In some embodiments, a bonding element (e.g., solder balls and/or bumps 320) may be used to respectively couple the first, second, and third interconnection pads 622, 624, 626 to the gate connection pad 272, the drain connection pad 274, and the source connection pad 276. Though illustrated as a single pad, in some embodiments, one or more of the first, second, and/or third interconnection pads 622, 624, 626 may include a plurality of pads.

The circuitry module 610 may be coupled to the coupling element 270 on a first side 601 of the circuitry module 610. On a second side 602 of the circuitry module 610 that is opposite the first side 601, a plurality of pads may be exposed. For example, a gate lead 682, a drain lead 684, and a source lead 686 may be exposed on the second side 602 of the circuitry module 610. Though only a single gate lead 682, drain lead 684, and source lead 686 are illustrated in FIG. 6A, it will be understood that a plurality of each type of lead may be provided. As will be discussed further herein, the gate lead 682, the drain lead 684, and the source lead 686 may be configured to be respectively coupled to the gate terminal 222, the drain terminal 224, and the source terminal 226 of the RF transistor amplifier die 210. An encapsulating material 625 may be on surfaces of the RF transistor amplifier die 210, the coupling element 270, and/or the circuitry module 610. The encapsulating material 625 may be formed of a plastic or a plastic polymer compound, but the present invention is not limited thereto. In some embodiments, the encapsulating material 625 may be or include a polymer with fillers.

Each of the first, second, and third interconnection pads 622, 624, 626 may be coupled to one or more conductive patterns 673 within the circuitry module 610. The conductive patterns 673 may provide various routing and/or circuitry within the circuitry module 610. For example, the conductive patterns 673 may connect the first interconnection pad 622 to one or more first surface connection pads 672 and the gate lead 682. In some embodiments, the first surface connection pads 672 may be exposed on the first side 601 of the circuitry module 610. In some embodiments, a first circuit element 650a may be coupled to one or more of the first surface connection pads 672 so as to be electrically coupled between the gate lead 682 and the first interconnection pad 622. In some embodiments, the first circuit element 650a may be coupled between the gate lead 682 and the gate terminal 222 of the RF transistor amplifier die 210 (e.g., through the coupling element 270). Consequently, the first circuit element 650a may be electrically coupled between gates of the RF transistor amplifier die 210 and the gate lead 682. In some embodiments, the first circuit element 650a may be coupled to the first side 601 of the circuitry module 610. Thus, the first circuit element 650a may be coupled to a same side (e.g., the first side 601) of the circuitry module 610 as the coupling element 270.

Similarly, the conductive patterns 673 may connect the second interconnection pad 624 to one or more second surface connection pads 674 and the drain lead 684. In some embodiments, a second circuit element 650b may be coupled to one or more of the second surface connection pads 674 so as to be electrically coupled between the drain lead 684 and the second interconnection pad 624. In some embodiments, the second surface connection pads 674 may be exposed on the first side 601 of the circuitry module 610. In some embodiments, the second circuit element 650b may be coupled between the drain lead 684 and the drain terminal 224 of the RF transistor amplifier die 210 (e.g., through the coupling element 270). Consequently, the second circuit element 650b may be electrically coupled between drains of the RF transistor amplifier die 210 and the drain lead 684.

The first circuit element 650a and/or the second circuit element 650b may provide various electronic capabilities to the RF transistor amplifier 200. For example, the first circuit element 650a and/or the second circuit element 650b may comprise impedances (including, for example, resistive, inductive, and capacitive elements) that may be used for impedance matching and/or harmonic termination. In some embodiments, the first circuit element 650*a* and/or the second circuit element 650*b* may be or include surface mount devices. In some embodiments, the first circuit element 650*a* and/or the second circuit element 650*b* may be or include integrated passive devices (IPDs). In some embodiments, the first circuit element 650*a* and/or the second circuit element 650*b* may be or include harmonic and/or input/output impedance matching elements.

For example, the first circuit element 650*a* may be configured to provide input matching capabilities. Due to its location between the gate lead 682 and the RF transistor amplifier die 210, the first circuit element 650*a* may be capable of affecting and/or conditioning a signal provided to the gates of the RF transistor amplifier die 210. Similarly, the second circuit element 650*b* may be configured to provide output matching capabilities. Due to its location between the drain lead 684 and the RF transistor amplifier die 210, the second circuit element 650*b* may be capable of affecting and/or conditioning a signal provided from the drains of the RF transistor amplifier die 210.

By using the circuitry module 610 with the exposed connection pads, such as the first and second surface connection pads 672, 674, surface mount devices can be used to provide circuit elements that may be coupled to the RF transistor amplifier die 210. The surface mount devices can be replaced and/or configured as necessary to provide a more flexible solution. For example, when a different type of input/output matching and/or harmonic termination is needed, the same circuitry module 610 may be used, but the first and/or second circuit elements 650*a*, 650*b* may be swapped to provide different capabilities.

Though the first circuit element 650*a* and the second circuit element 650*b* are each illustrated as a single element, it will be understood that in some embodiments, the first circuit element 650*a* and/or the second circuit element 650*b* may include a plurality of discrete devices. Similarly, the interconnections between the first and second circuit elements 650*a*, 650*b* and the RF transistor amplifier die 210 are merely examples, and different configurations of conductive patterns 673 may be provided without deviation from the present invention.

The conductive patterns 673 may also connect the third interconnection pad 626 to one or more source leads 686. Thus, the source connection pad 276 may be electrically coupled to the one or more source leads 686.

The conductive patterns 673 may be encased in an isolation material 615. In some embodiments, the isolation material 615 may include, for example, silicon oxide, silicon nitride, an oxide of the conductive patterns 673, a polymer, a molding compound, or a combination thereof. In some embodiments, circuitry module 610 may be formed as a printed circuit board (PCB). In a PCB embodiment, the isolation material 615 may be the substrate(s) of the PCB, and the conductive patterns 673 may be traces formed within the substrate(s).

Though FIG. 6A illustrates the use of a circuitry module 610 to couple to a RF transistor amplifier die 210 using a coupling element 270, the present invention is not limited thereto. As illustrated in FIG. 6B, in some embodiments, the RF transistor amplifier die 210 may be directly coupled to the circuitry module 610. For example, the gate terminal 222, drain terminal 224, and source terminal 226 of the RF transistor amplifier die 210 may be respectively coupled to the interconnection pads 622, 624, 626 of the circuitry module 610 using, for example, bonding elements 320.

Similarly, it will be understood that other configurations of the circuitry module 610 and the RF transistor amplifier die 210 are possible, such as those illustrated in FIGS. 3C to 3E. In some embodiments, the circuitry module 610 may be configured to couple to an RF transistor amplifier die 210' incorporating internal conductive patterns, such as that illustrated in FIG. 3C. In some embodiments, the circuitry module 610 may be configured to couple to multiple RF transistor amplifier dies 210, such as that illustrated in FIGS. 3D and 3E.

It will also be appreciated that the RF transistor amplifier die 210 may have a variety of different configurations. For example, while the RF transistor amplifier dies 210 have top side gate, drain and source terminals 222, 224, 226, they may also, in some embodiments, have one or more of back side gate, drain and source terminals 222', 224', 226'. Such a configuration is schematically shown in FIG. 6C, which is a schematic cross-sectional view of an RF transistor amplifier die 210". As shown in FIG. 6C, gate vias 211, drain vias 213 and/or source vias 215 may be formed through the semiconductor layer structure 230 that connect to respective gate, drain and source terminals 222', 224', 226'. As explained, for example, in U.S. Provisional Patent Application Ser. No. 63/004,985, filed Apr. 3, 2020 ("the '985 application"), including gate and drain terminals on the back side of an RF transistor amplifier die may have various advantages, such as allowing for more flexible impedance matching circuit implementations. The entire content of the '985 application is incorporated herein by reference. It will be appreciated that back side gate, drain and source terminals 222', 224', 226' and/or corresponding gate, drain and source vias 211, 213, 215 may be included in any of the RF transistor amplifier dies disclosed herein.

While FIGS. 3A to 3E illustrate embodiments in which a circuit element 350 is on a top surface of the circuitry module 310 (e.g., opposite the circuitry module 310 from the RF transistor amplifier die 210) and FIGS. 6A to 6C illustrate embodiments in which a circuit element 650 is on a bottom surface of the circuitry module 610 (e.g., between the circuitry module 610 and the RF transistor amplifier die 210), it will be understood that other combinations are available. In some embodiments, the circuit elements 350/650 may be on both sides of the circuitry module 310/610. In some embodiments, the circuit elements 350/650 may be on side surfaces of the circuitry module 310/610.

As illustrated in FIGS. 6A-6C, multiple configurations of RF transistor amplifier die 210 and/or RF transistor amplifier 200 may be coupled to a circuitry module 610. In the subsequent figures, discussion will focus on embodiments in which the RF transistor amplifier die 210 is directly coupled to circuitry module 610. However, it will be understood that this convention is merely for ease of description and the subsequent discussion related to the circuitry module 610 may be equally applied to other types of interconnections between the RF transistor amplifier 210 (e.g., using a coupling element 270) and/or RF transistor amplifier 200 without deviating from the present invention.

FIGS. 7A to 7E are schematic diagrams illustrating methods of coupling circuitry modules and RF transistor amplifier dies according to certain embodiments of the present invention. As shown in FIG. 7A, a circuitry module 610 may be provided. The circuitry module 610 may have a first side 601 and a second side 602. In some embodiments, the first side 601 may expose first, second, and third interconnection pads 622, 624, 626 as well as a first and second surface connection pads 672, 674. In some embodiments, the second side 602 may have an exposed gate lead 682, drain lead 684, and source lead 686.

Referring to FIG. 7B, a first circuit element 650a and a second circuit element 650b may be provided on the first side 601 of the circuitry module 610. For example, a bonding element (e.g., solder balls and/or bumps 320) may be used to couple the first circuit element 650a to the first surface connection pad 672. Similarly, a bonding element (e.g., solder balls and/or bumps 320) may be used to couple the second circuit element 650b to the second surface connection pad 674.

Referring to FIG. 7C, an RF transistor amplifier die 210 may be provided on the first side 601 of the circuitry module 610. For example, a bonding element (e.g., solder balls and/or bumps 320) may be used to couple the gate terminal 222, the drain terminal 224, and the source terminal 226 of the RF transistor amplifier die 210 to the first, second, and third interconnection pads 622, 624, 626, respectively. In will be understood that the order of FIGS. 7B and 7C may be reversed such that the RF transistor amplifier die 210 is coupled to the circuitry module 610 before the first and second circuit elements 650a, 650b.

As shown in FIG. 7D, a capillary underfill process may be used to inject encapsulating material 625 between the conductive structures of the RF transistor amplifier die 210, the first and second circuit elements 650a, 650b, and/or the circuitry module 610. The encapsulating material 625 may help prevent short circuits, enhance the structural integrity of the resulting device and provide for proper impedance matching. In some embodiments, the encapsulating material 625 may also encapsulate the RF transistor amplifier die 210 in protective material.

FIG. 7E illustrates an additional optional step in which a thermal layer 240 is placed on the back side of the RF transistor amplifier die 210. In some embodiments, additional thermal management structures 642, such as a metal flange, metal fin, heatsink, or other structure may be provided on the thermal layer 240. In some embodiments, the thermal management structures 642 may be part of a larger semiconductor package (e.g., a carrier substrate), as will be discussed further herein. The thermal layer 240 may be a thermally conductive layer configured to facilitate thermal transfer between the RF transistor amplifier die 210 and the thermal management structure 642 to which the RF transistor amplifier die 210 is mounted. In some embodiments, the thermal layer 240 and/or the thermal management structures 642 may be omitted. In some embodiments, the thermal layer 240 may be a die attach layer, such as a eutectic layer. The thermal layer 240 can be on the transistor amplifier die 210 and/or extend onto the encapsulating material 625 and/or the first and second circuit elements 650a, 650b. The thermal layer 240 can be a metal layer to form a eutectic or other metal bond. In some embodiments, the thermal layer 240 can be a thermal adhesive.

Figure 8A:
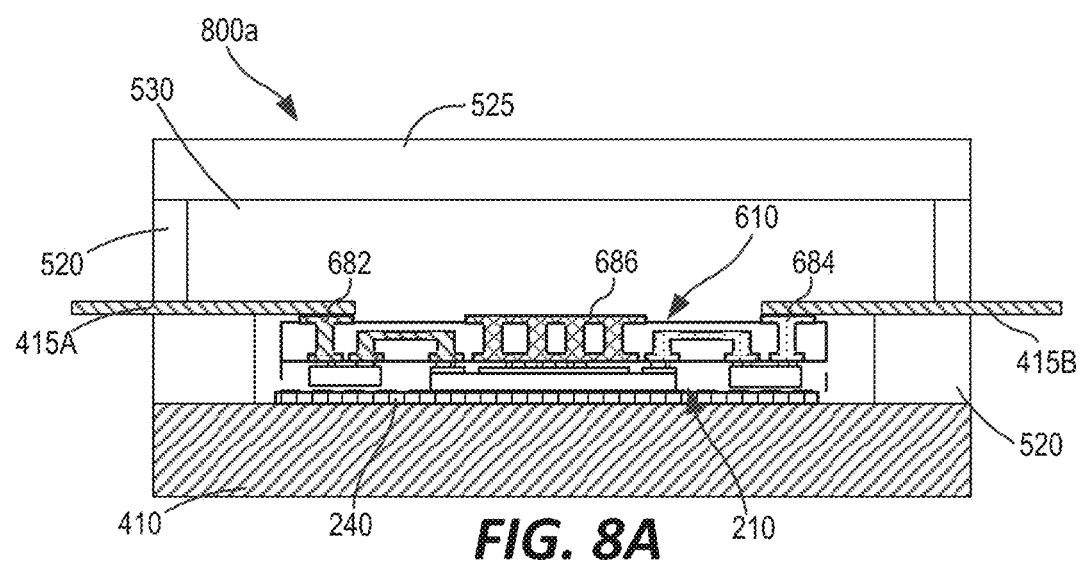
FIGS. 8A and 8B are schematic cross-sectional views of various packaging options of a circuitry module, according to some embodiments of the present invention.
Figure 8B:
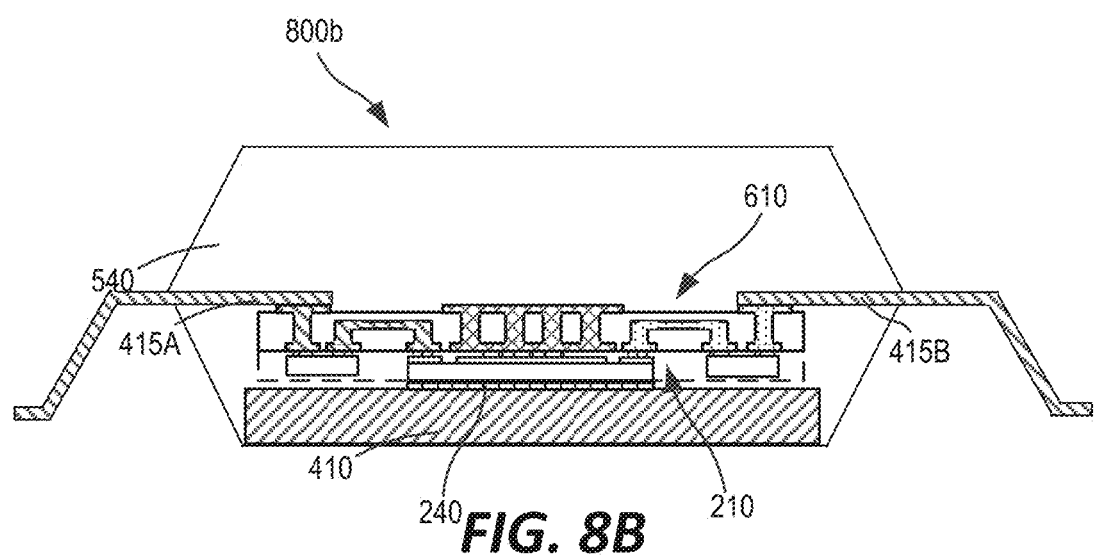

The embodiments of FIGS. 6A to 6C provide a common gate lead 682, drain lead 684, and source lead 686 on a common side (e.g., second side 602) of the circuitry module 610. This may allow for the circuitry module 610 to be attached with the second side 602 up in variety of different configurations. For example, FIGS. 8A and 8B are schematic cross-sectional views of various packaging options 800a, 800b of the circuitry module 610, according to some embodiments of the present invention. FIGS. 8A and 8B include elements of the RF transistor amplifier die 210 and circuitry module 610 that have been previously discussed. As such, the discussion of FIGS. 8A and 8B will focus on those portions of the embodiments that are different from those discussed with respect to the prior figures.

Referring to FIG. 8A, a semiconductor package 800a may be similar to the semiconductor package 500a discussed herein with respect to FIG. 5A, and duplicate descriptions already discussed with respect to that figure will be omitted. The semiconductor package 800a may be, for example, an open-air or open-cavity package. The semiconductor package 800a may include a carrier substrate 410, sidewalls 520, and a lid 525. The carrier substrate 410, sidewalls 520, and lid 525 may define an internal cavity 530. The RF transistor amplifier die 210 and circuitry module 610 may be disposed inside the internal cavity 530. In some embodiments, a thermal layer 240 may be between the RF transistor amplifier die 210 and the carrier substrate 410.

The leads 415A, 415B may be configured to extend through the sidewalls 520, though the present invention is not limited thereto. In some embodiments, the RF transistor amplifier 210 may be disposed on the carrier substrate 410 and the leads 415A, 415B, and the circuitry module 610 may be disposed on the RF transistor amplifier die 210. The leads 415A, 415B may be coupled to the circuitry module 610 using, for example, a conductive die attach material. In some embodiments, the leads 415A, 415B may extend from the sidewalls 520 to contact and/or be connected to the circuitry module 610. For example, the lead 415a may be coupled to gate lead 682 and lead 415b may be coupled to drain lead 684. In some embodiments, an additional lead and/or connection (not shown) may be coupled to source lead 686. As such, in some embodiments, the use of wire bonds to connect the RF transistor amplifier die 210 to leads 415A, 415B may be avoided and/or reduced.

Referring to FIG. 8B, a semiconductor package 800b may incorporate the RF transistor amplifier 210 and circuitry module 610 according to embodiments of the present invention. The semiconductor package 800b may be similar to the semiconductor package 500b discussed herein with respect to FIG. 5B, and duplicate descriptions already discussed with respect to that figure will be omitted. The semiconductor package 800b may be, for example, an overmolded plastic (OMP) package.

In the semiconductor package 800b according to the present invention, leads 415A, 415B may extend from outside the semiconductor package 800b and into the overmold material 540 so as to connect to the circuitry module 610. For example, the lead 415a may be coupled to gate lead 682 and lead 415b may be coupled to drain lead 684. In some embodiments, and additional lead and/or connection (not shown) may be coupled to source lead 686. In some embodiments, a thermal layer 240 may be between the RF transistor amplifier die 210 and a carrier substrate 410 within the semiconductor package 800b.

In addition to semiconductor packages 800a, 800b illustrated with respect to FIGS. 8A and 8B, it will be understood that other packaging configurations are possible without deviating from the present invention. For example, the circuitry module 610 may be utilized with semiconductor packages similar to those of FIG. 5C, as well as other configurations.

Figure 9A:
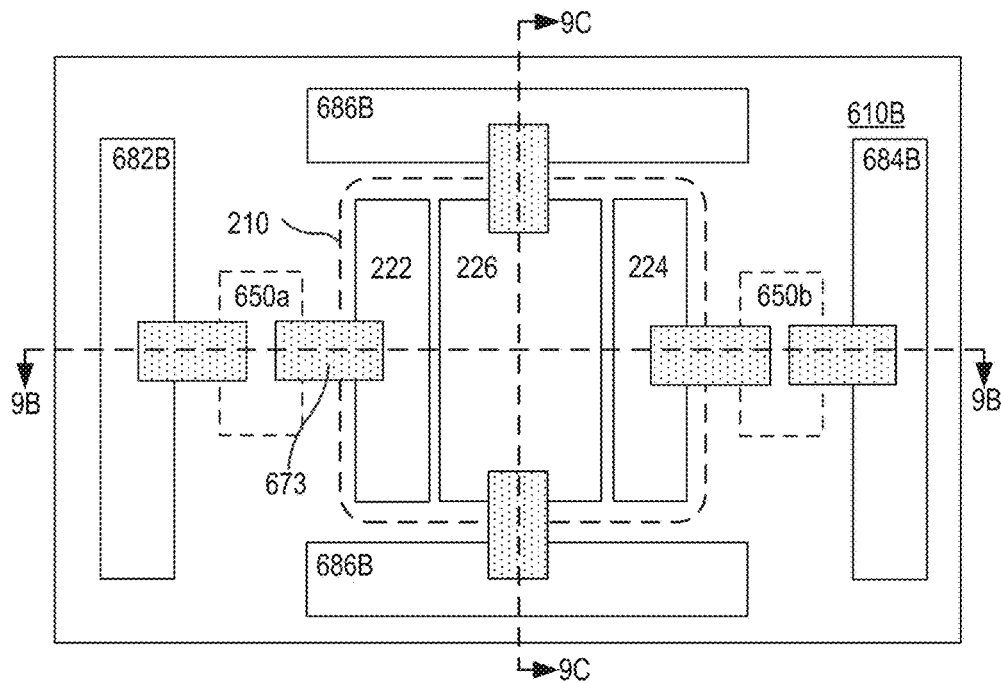
FIG. 9A is a plan view of an embodiment of a circuitry module, according to some embodiments of the present invention.

In FIGS. 6A to 6C, the circuit elements 650a, 650b and RF transistor amplifier die 210 are on the same side of the circuitry module 610, while the gate, drain, and source leads 682, 684, 686 are on an opposite side, but the present embodiments are not limited thereto. FIG. 9A is a plan view of an embodiment of a circuitry module 610B, according to some embodiments of the present invention, in which the leads 682, 684, 686, circuit elements 650a, 650b, and RF transistor amplifier die 210 are all on a same side of the circuitry module 610B. FIG. 9B is a cross-sectional view taken along line 9B-9B of FIG. 9A. FIG. 9C is a cross-sectional view taken along line 9C-9C of FIG. 9A. FIGS. 9A to 9C include elements of the RF transistor amplifier die 210 and circuitry module 610 that have been previously discussed. As such, the discussion of FIGS. 9A to 9C will focus on those portions of the embodiments that are different from those discussed with respect to the prior figures.

Referring to FIGS. 9A to 9C, the circuitry module 610B may be mounted on the RF transistor amplifier die 210. The RF transistor amplifier die 210 is mounted below the circuitry module 610B in the schematic plan view of FIG. 9A, and hence is shown using dashed lines. The circuitry module 610B may be configured to couple to the gate terminal 222, the drain terminal 224, and/or the source terminal 226 of the RF transistor amplifier die 210. Though FIGS. 9A to 9C illustrate that the circuitry module 610B is coupled directly to the RF transistor amplifier die 210, it will be understood that other connection types are possible, such as other configurations of RF transistor amplifier 200, including those illustrated with respect to FIGS. 2A to 2L. For example, a coupling element 270 may be coupled between the circuitry module 610B and the RF transistor amplifier die 210.

For example, the circuitry module 610B may have exposed interconnection pads 622, 624, 626 that may be configured to be respectively coupled to the gate terminal 222, the drain terminal 224, and the source terminal 226 of the RF transistor amplifier die 210. For example, the first interconnection pad 622 may be configured to couple to the gate terminal 222, the second interconnection pad 624 may be configured to couple to the drain terminal 224, and the third interconnection pad 626 may be configured to couple to the source terminal 226. In some embodiments, a bonding element (e.g., solder balls and/or bumps 320) may be used to respectively couple the first, second, and third interconnection pads 622, 624, 626 to the gate terminal 222, the drain terminal 224, and the source terminal 226, respectively. Though illustrated as a single pad, in some embodiments, one or more of the first, second, and/or third interconnection pads 622, 624, 626 may include a plurality of pads.

The circuitry module 610B may be coupled to the RF transistor amplifier die 210 on a first side 601 of the circuitry module 610B. In addition, a gate lead 682B, a drain lead 684B, and a source lead 686B may be exposed on the first side 601 of the circuitry module 610B. As will be discussed further herein, the gate lead 682B, the drain lead 684B, and the source lead 686B may be configured to be respectively coupled to the gate terminal 222, the drain terminal 224, and the source terminal 226 of the RF transistor amplifier die 210. An encapsulating material 625 may be on surfaces of the RF transistor amplifier die 201, and/or the circuitry module 610B.

Each of the first, second, and third interconnection pads 622, 624, 626 may be coupled to one or more conductive patterns 673B within the circuitry module 610B. The conductive patterns 673B may provide various routing and/or circuitry within the circuitry module 610B. For example, the conductive patterns 673B may connect the first interconnection pad 622 to one or more first surface connection pads 672 and the gate lead 682B. In some embodiments, the first surface connection pads 672 may be exposed on the first side 601 of the circuitry module 610B. In some embodiments, a first circuit element 650*a* may be coupled to one or more of the first surface connection pads 672 so as to be electrically coupled between the gate lead 682B and the first interconnection pad 622. In some embodiments, the first circuit element 650*a* may be coupled between the gate lead 682B and the gate terminal 222 of the RF transistor amplifier die 210. Consequently, the first circuit element 650*a* may be electrically coupled between gates of the RF transistor amplifier die 210 and the gate lead 682B. In some embodiments, the first circuit element 650*a* may be coupled to the first side 601 of the circuitry module 610B. Thus, the first circuit element 650*a* may be coupled to a same side (e.g., the first side 601) of the circuitry module 610B as the RF transistor amplifier die 210 and the gate lead 682B.

Similarly, the conductive patterns 673B may connect the second interconnection pad 624 to the drain terminal 224 and the drain lead 684B. In some embodiments, a second circuit element 650*b* may be coupled to one or more of the second surface connection pads 674 so as to be electrically coupled between the drain lead 684B and the second interconnection pad 624. In some embodiments, the second surface connection pads 674 may be exposed on the first side 601 of the circuitry module 610B. In some embodiments, the second circuit element 650*b* may be coupled between the drain lead 684B and the drain terminal 224 of the RF transistor amplifier die 210. Consequently, the second circuit element 650*b* may be electrically coupled between drains of the RF transistor amplifier die 210 and the drain lead 684B.

The conductive patterns 673B may also connect the third interconnection pad 626 to one or more source leads 686B. The source leads 686B may be on the same first side 601 as the third interconnection pad 626 and the RF transistor amplifier die 210. In some embodiments, as illustrated in FIG. 9A, the gate lead 682B and the drain lead 684B may be on two opposite sides of the RF transistor amplifier die 210 and the source leads 686B may be on different sides of the RF transistor amplifier die 210 than the two opposite sides. Stated another way, in some embodiments, the gate lead 682B may be adjacent a first side of the RF transistor amplifier die 210, the drain lead 684B may be adjacent a second side of the RF transistor amplifier die 210, and one or more of the source leads 686B may be adjacent a third side of the RF transistor amplifier die 210 that is different from the first and second sides of the RF transistor amplifier die 210.

The circuitry module 610B of FIGS. 9A to 9C may differ from the circuitry module 610 of FIGS. 6A to 6C in that the circuitry module 610B provides the gate, drain, and source leads 682B, 684B, 686B on a same side of the circuitry module 610B as the RF transistor amplifier die 210. That is to say that the conductive patterns 673 of the circuitry module 610B may be configured to allow the gate, drain, and source leads 682B, 684B, 686B to be exposed on a different portion of the circuitry module 610B. By shifting the side at which the gate, drain, and source leads 682B, 684B, 686B are located, additional packaging options are possible.

Figure 9D:
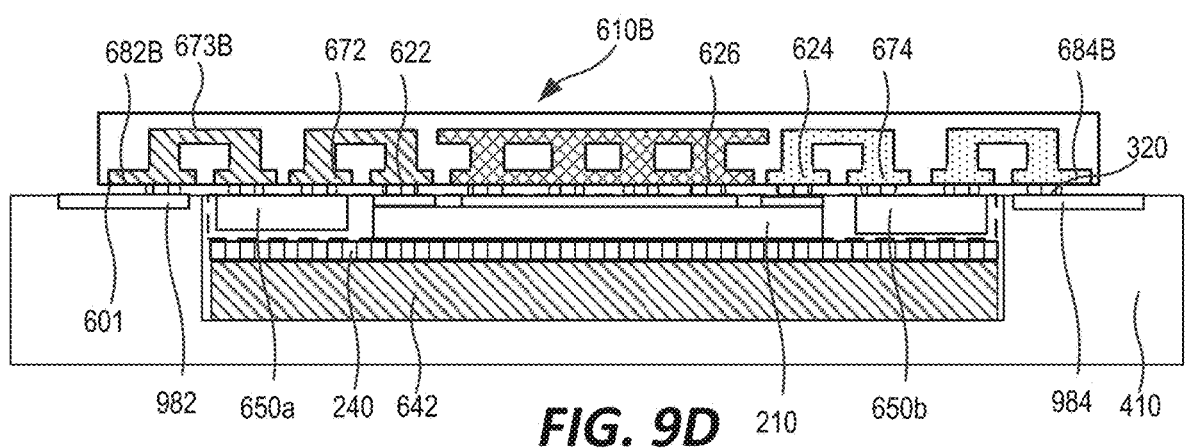
FIG. 9D is a cross-sectional view of the circuitry module of FIG. 9A, mounted on a substrate according to some embodiments of the present invention.
Figure 9B:
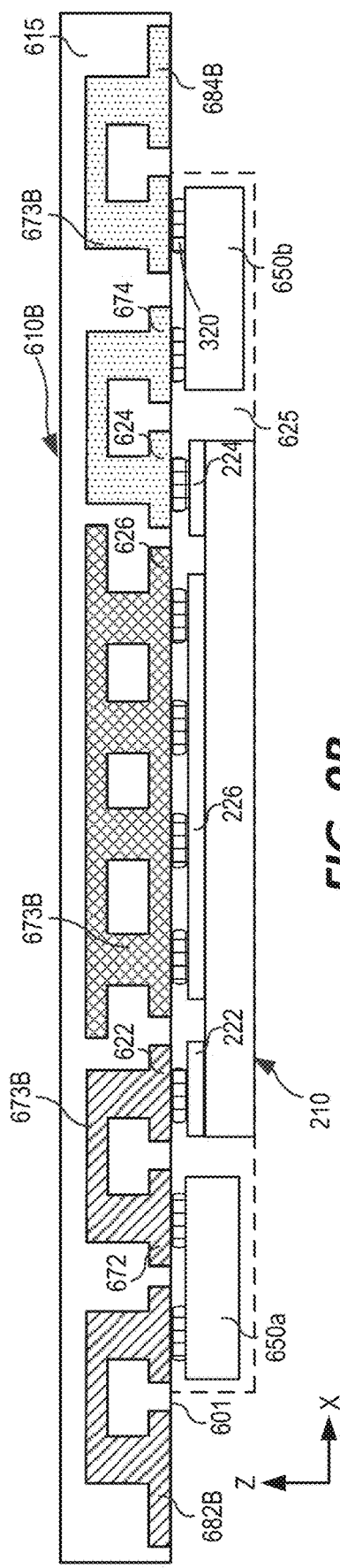
FIG. 9B is a cross-sectional view taken along line 9B-9B of FIG. 9A.
Figure 9C:
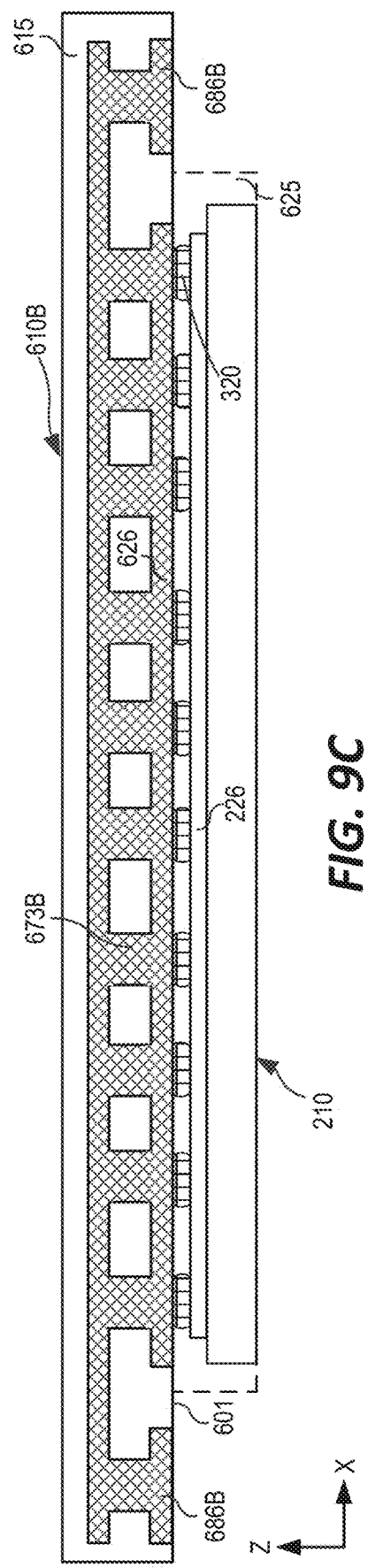
FIG. 9C is a cross-sectional view taken along line 9C-9C of FIG. 9A.

FIG. 9D is a cross-sectional view of the circuitry module 610B of FIG. 9A, mounted on a carrier substrate 410 according to some embodiments of the present invention. As illustrated in FIG. 9D, the circuitry module 610B may be coupled on the RF transistor amplifier die 210, which may be, in turn, on the carrier substrate 410.

In some embodiments, a thermal layer 240 may be between the RF transistor amplifier die 210 and the carrier substrate 410. In some embodiments, an additional thermal management structure 642, such as a metal flange, metal fin, heatsink, or other structure may be provided on the thermal layer 240 and/or between the thermal layer 240 and the carrier substrate 410. The thermal layer 240 may be a thermally conductive layer configured to facilitate thermal transfer between the RF transistor amplifier die 210 and a carrier substrate 410 to which the RF transistor amplifier die 210 is mounted. In some embodiments, the thermal layer 240 and/or the thermal management structure 642 may be omitted. In some embodiments, the thermal layer 240 may be a die attach layer, such as a eutectic layer. The thermal layer 240 can be on the RF transistor amplifier die 210 and/or extend onto the encapsulating material 625 and/or the first and second circuit elements 650a, 650b. The thermal layer 240 can be a metal layer to form a eutective or other metal bond. In some embodiments, the thermal layer 240 can be a thermal adhesive.

In some embodiments additional contacts may be provided in the carrier substrate 410, though the present invention is not limited thereto. For example, a gate connector 982, a drain connector 984, and/or a source connector (not shown) may be provided on and/or in the carrier substrate 410. For example, the gate lead 682B of the circuitry module 610B may be configured to be coupled (e.g., via a bonding element such as solder balls and/or bumps 320) to the gate connector 982, the drain lead 684B may be configured to be coupled to the drain connector 984, and the source lead 686B may be configured to be coupled to a source connector (not shown).

Figure 10A:
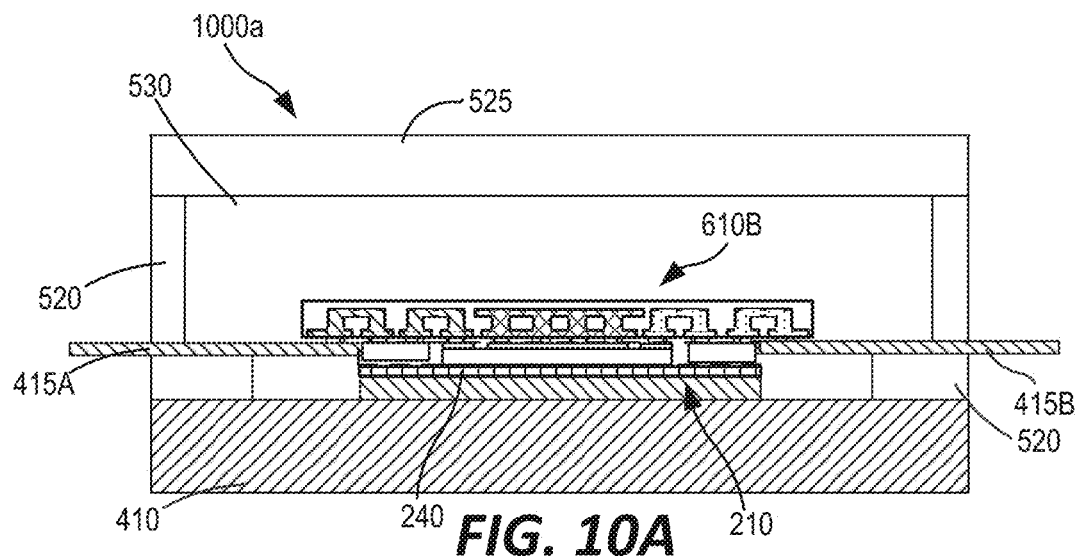
FIGS. 10A and 10B are schematic cross-sectional views of various packaging options of the circuitry module, according to some embodiments of the present invention.
Figure 10B:
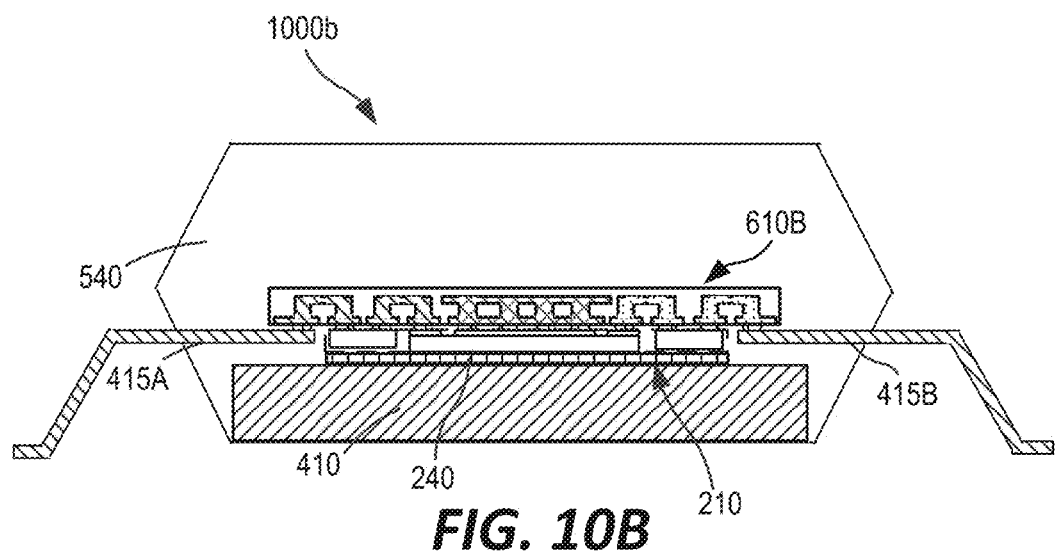

It will be understood that the packaging example of FIG. 9B is merely an example, and the present invention is not limited thereto. In some embodiments, the circuitry module 610B of FIGS. 9A to 9C can be coupled within other semiconductor packages described herein, such as those discussed with respect to FIGS. 5A to 5C and FIGS. 8A and 8B. For example, FIGS. 10A and 10B are schematic cross-sectional views of various packaging options 1000a, 1000b of the circuitry module 610B, according to some embodiments of the present invention. FIGS. 10A and 10B include elements of the RF transistor amplifier die 210 and circuitry module 610B that have been previously discussed. As such, the discussion of FIGS. 10A and 10B will focus on those portions of the embodiments that are different from those discussed with respect to the prior figures.

Referring to FIG. 10A, a semiconductor package 1000a may be similar to the semiconductor packages 500a and 800a discussed herein with respect to FIGS. 5A and 8A, respectively, and duplicate descriptions already discussed with respect to those figures will be omitted. The semiconductor package 1000a may be, for example, an open-air or open-cavity package. The semiconductor package 1000a may include a carrier substrate 410, sidewalls 520, and a lid 525. The carrier substrate 410, sidewalls 520, and lid 525 may define an internal cavity 530. The RF transistor amplifier die 210 and circuitry module 610B may be disposed inside the internal cavity 530. In some embodiments, a thermal layer 240 may be between the RF transistor amplifier die 210 and the carrier substrate 410.

The leads 415A, 415B may be configured to extend through the sidewalls 520, though the present invention is not limited thereto. In some embodiments, the RF transistor amplifier 210 may be disposed on the carrier substrate 410 and the leads 415A, 415B, and the circuitry module 610B may be disposed on the RF transistor amplifier die 210. The leads 415A, 415B may be coupled to the circuitry module 610B using, for example, a conductive die attach material. For example, the lead 415a may be coupled to gate lead 682B and lead 415b may be coupled to drain lead 684B. In some embodiments, an additional lead and/or connection (not shown) may be coupled to source lead 686B. As such, in some embodiments, the use of wire bonds to connect the RF transistor amplifier die 210 to leads 415A, 415B may be avoided and/or reduced.

Referring to FIG. 10B, a semiconductor package 1000b may incorporate the RF transistor amplifier 210 and circuitry module 610B according to embodiments of the present invention. The semiconductor package 1000b may be similar to the semiconductor package 500b and 800b discussed herein with respect to FIGS. 5B and 8B, and duplicate descriptions already discussed with respect to that figure will be omitted. The semiconductor package 1000b may be, for example, an overmolded plastic (OMP) package.

In the semiconductor package 1000b according to the present invention, leads 415A, 415B may extend from outside the semiconductor package 800b and into the overmold material 540 so as to connect to the circuitry module 610B. For example, the lead 415a may be coupled to gate lead 682B and lead 415b may be coupled to drain lead 684B. In some embodiments, an additional lead and/or connection (not shown) may be coupled to source lead 686B.

In addition to semiconductor packages 1000a, 1000b illustrated with respect to FIGS. 10A and 10B, it will be understood that other packaging configurations are possible without deviating from the present invention. For example, the circuitry module 610B may be utilized with semiconductor packages similar to those of FIG. 5C, as well as other configurations.

As discussed herein, circuitry modules may include circuit elements on surfaces of the circuitry modules, but may also include circuit elements within the circuitry module itself. FIGS. 11A to 11D are schematic cross-sectional views of additional embodiments of an RF transistor amplifier die 210 coupled to a circuitry module 610C, according to some embodiments of the present invention. FIGS. 11A to 11D include elements of the RF transistor amplifier die 210 and circuitry module 610C that have been previously discussed. As such, the discussion of FIGS. 11A to 11D will focus on those portions of the embodiments that are different from those discussed with respect to the prior figures.

Figure 11A:
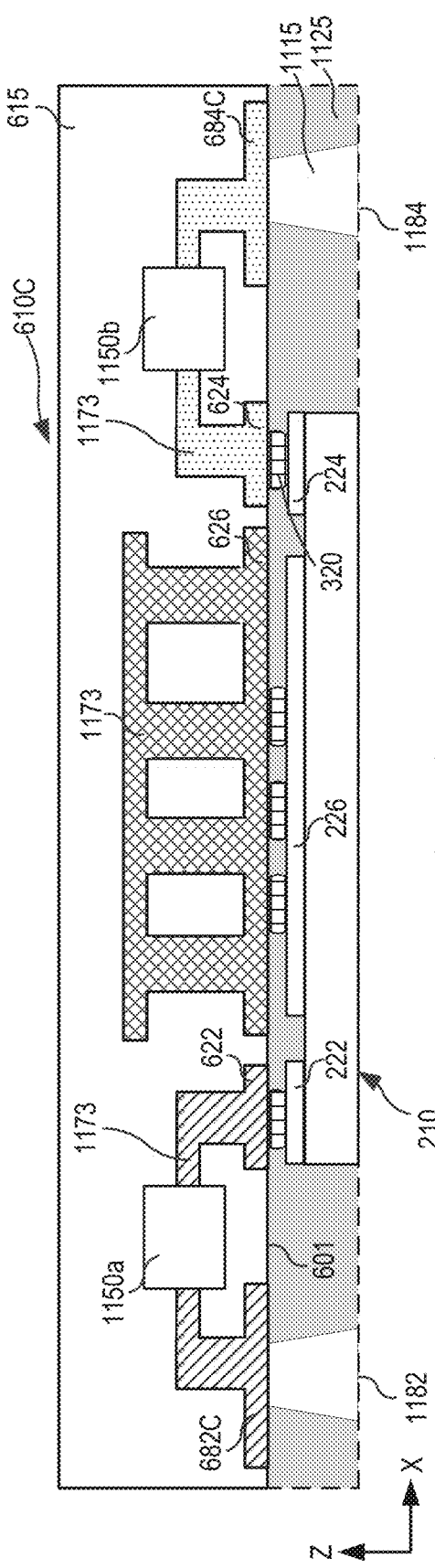
FIGS. 11A to 11D die are schematic cross-sectional views of additional embodiments of an RF transistor amplifier coupled to a circuitry module, according to some embodiments of the present invention.

Referring to FIG. 11A, the circuitry module 610C may be mounted on the RF transistor amplifier die 210. The circuitry module 610C may be configured to couple to the gate terminal 222, the drain terminal 224, and the source terminal 226 of the RF transistor amplifier die 210. Though FIG. 11A illustrates that the circuitry module 610C is coupled directly to the RF transistor amplifier die 210, it will be understood that other connection types are possible, such as other configurations of RF transistor amplifier 200, including those illustrated with respect to FIGS. 2A to 2L. For example, a coupling element 270 may be coupled between the circuitry module 610C and the RF transistor amplifier die 210.

The circuitry module 610C may have exposed interconnection pads 622, 624, 626 that may be configured to be respectively coupled to the gate terminal 222, the drain terminal 224, and the source terminal 226. In some embodiments, a bonding element (e.g., solder balls and/or bumps 320) may be used to respectively couple the first, second, and third interconnection pads 622, 624, 626 to the gate terminal 222, the drain terminal 224, and the source terminal 226. Though illustrated as a single pad, in some embodiments, one or more of the first, second, and/or third interconnection pads 622, 624, 626 may include a plurality of pads.

The circuitry module 610C may be coupled to the RF transistor amplifier die on a first side 601 of the circuitry module 610C. In addition, a gate lead 682C, a drain lead 684C, and/or a source lead (not shown) may be exposed on the first side 601 of the circuitry module 610C. The gate lead 682C, the drain lead 684C, and/or the source lead may be configured to be respectively coupled to the gate terminal 222, the drain terminal 224, and the source terminal 226 of the RF transistor amplifier die 210.

The circuitry module 610C may contain one or more conductive patterns 1173, a first circuit element 1150a, and a second circuit element 1150b. The first and second circuit elements 1150a and 1150b are illustrated schematically in FIG. 11A. The circuitry module 610C may differ from that of circuitry modules 610, 610B described herein in that first and second circuit elements 1150a and 1150b may be incorporated within the structure of the circuitry module 610C. For example, plate capacitors, interdigitated finger capacitors and/or capacitors may be implemented using the conductive patterns 1173 within the circuitry module 610C. Likewise spiral inductors or other inductive elements may also be implemented within the circuitry module 610C. Resistive elements may be formed on or within the circuitry module 610C by, for example, forming trace segments or conductive vias using higher resistance conductive materials.

In some embodiments, the first and second circuit elements 1150a, 1150b and/or the conductive patterns 1173 may be configured to provide at least part of harmonic terminating circuitry, matching circuitry, splitting circuitry, combining circuitry, and/or biasing circuitry. Other configurations of the conductive patterns 1173 and/or other types of circuit elements 1150a, 1150b may be used without deviating from the scope of the present invention. It will also be appreciated that the configuration of the conductive patterns 1173 and circuit elements 1150a, 1150b illustrated in FIG. 11A are merely examples and are not intended to limit embodiments of the present invention.

In some embodiments, the circuitry module 610C may be formed as a PCB module and the first and second circuit elements 1150a, 1150b may be formed from traces within the PCB. In some embodiments, the circuitry module 610C may be formed of an insulating material 615, and the conductive patterns 1173 may be conductive material within the insulating material 615, such as conductive pillars and/or vias (e.g., copper pillars).

Each of the first, second, and third interconnection pads 622, 624, 626 may be coupled to one or more of the conductive patterns 1173 within the circuitry module 610C. The conductive patterns 1173 may provide various routing and/or circuitry within the circuitry module 610C. For example, the conductive patterns 1173 may connect the first interconnection pad 622 to the gate lead 682C via the first circuit element 1150a. The first circuit element 1150a may provide input matching and/or harmonic termination functionality between the gate lead 682C and the first interconnection pad 622.

Similarly, the conductive patterns 1173 may connect the second interconnection pad 624 to the drain lead 684C via the second circuit element 1150b. The second circuit element 1150b may provide output matching and/or harmonic termination functionality between the drain lead 684C and the second interconnection pad 624.

As illustrated in FIG. 11A, in some embodiments, an encapsulating material 1125 may be formed on the RF transistor amplifier die 210, the circuitry module 610C, the gate lead 682C, and/or the drain lead 684C. The encapsulating material 1125 may help prevent short circuits, enhance the structural integrity of the resulting device and provide for proper impedance matching. In some embodiments, the encapsulating material 1125 may also encapsulate the RF transistor amplifier die 210 in protective material.

In some embodiments, through vias 1115 may be formed in the encapsulating material 1125. The through vias 1115 may include conductive material and provide a conductive path to the gate lead 682C and/or drain lead 684C. For example, the through vias 1115 may expose gate connection 1182 and/or drain connection 1184 on a bottom surface of the encapsulating material 1125. The gate connection 1182 and/or drain connection 1184 may provide connection points for the gate lead 682C and the drain lead 684C, respectively.

In some embodiments, the gate connection 1182 and the drain connection 1184 may be approximately coplanar. In some embodiments, the encapsulating material 1125 may be configured to expose a bottom surface of the RF transistor amplifier die 210, and the gate connection 1182 and the drain connection 1184 may also be approximately coplanar with the bottom surface of the RF transistor amplifier die 210, though the present invention is not limited thereto. Though only the gate connection 1182 and the drain connection 1184 are illustrated in FIG. 11A, it will be understood that source connections may also be provided in a similar manner.

Figure 11B:
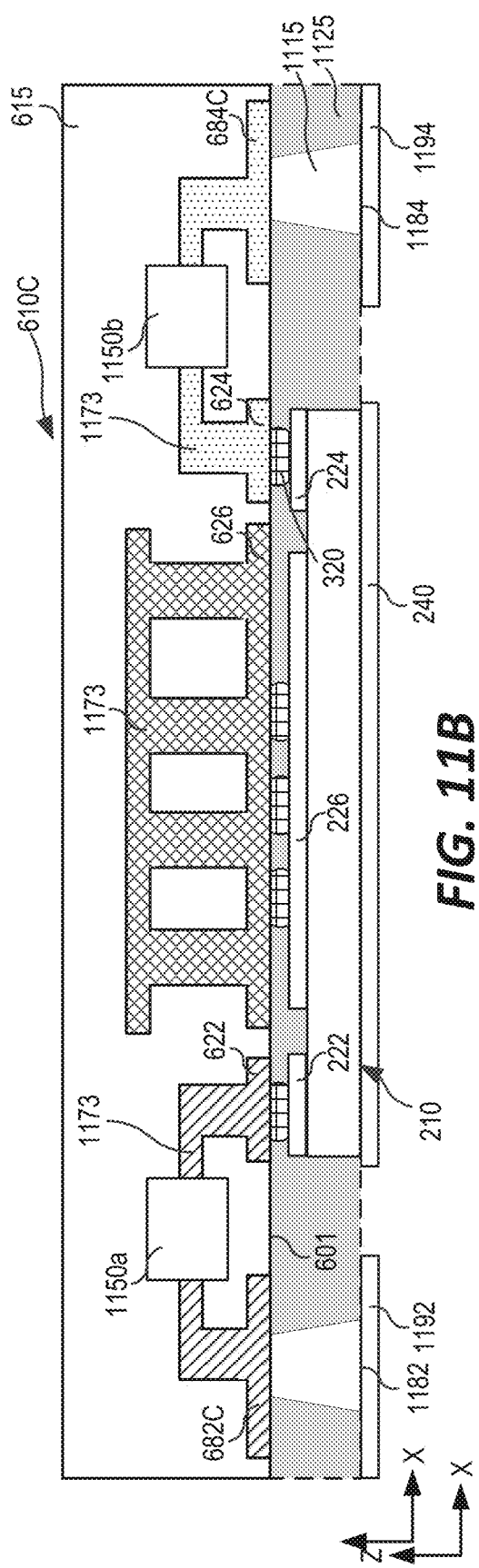

The use of the gate connection 1182 and the drain connection 1184 may allow for the use of direct bonding between the combination of the RF transistor amplifier die 210 and the circuitry module 610C and other pads and/or dies. For example, as illustrated in FIG. 11B, the gate connection 1182 may be coupled to a gate pad 1192 (e.g., via a bonding element such a solder) and the drain connection 1184 may be coupled to a gate pad 1194. In some embodiments, a thermal layer 240 may also be provided beneath the RF transistor amplifier die 210, though the present invention is not limited thereto. In some embodiments, the thermal layer 240 may be omitted. In some embodiments, additional contacts may be provided to connect to the third interconnection pad 626 and/or the source terminal 226 of the RF transistor amplifier die 210.

Figure 11C:
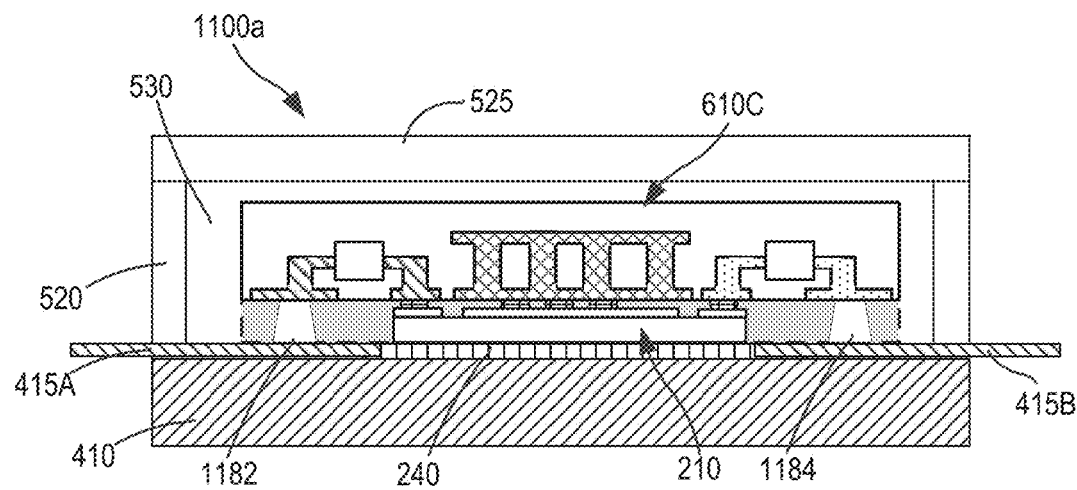
Figure 11D:
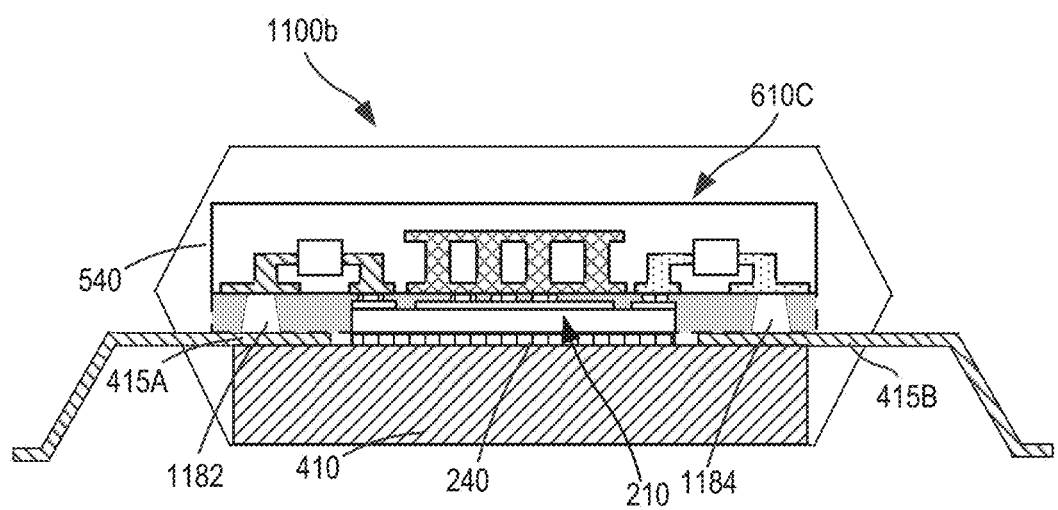

It will be understood that the packaging example of FIG. 11B is merely an example, and the present invention is not limited thereto. FIGS. 11C and 11D illustrate the use of packaging similar to that discussed herein with respect to FIGS. 5A to 5C, 8A, 8B, 10A, and 10B. For example, the circuitry module 610C, the RF transistor amplifier die 210, and the encapsulating material 1125 including the gate and drain connection 1182, 1184 may be placed in an open-cavity semiconductor package 1100a (FIG. 11C) or an OMP package 1100b (FIG. 11D). Elements in FIGS. 11C and 11D of the semiconductor package 1100a and semiconductor package 1100b that are similar to those previously discussed with respect to FIGS. 5A to 5C, 8A, 8B, 10A, and 10B will be omitted for brevity.

In some embodiments, the gate connection 1182 may be coupled to gate lead 415A by a bonding element (e.g., solder balls and/or bumps) and the drain connection 1184 may also be coupled to drain lead 415B. The gate lead 415A and the drain lead 415B may be electrically insulated from the carrier substrate 410 (e.g., by an insulating layer and/or the overmold material 540). In some embodiments, a thermal layer 240 may be between the RF transistor amplifier die 210 and the carrier substrate 410. In some embodiments, the thermal layer 240 may be omitted. In some embodiments, the thermal layer 240 may be a die attach layer, such as a eutectic layer. The thermal layer 240 can be on the transistor amplifier die 210 and/or extend onto the encapsulating material 1125. The thermal layer 240 can be a metal layer to form a eutective or other metal bond. In some embodiments, the thermal layer 240 can be a thermal adhesive. Though not shown in FIGS. 11C and 11D, in some embodiments additional thermal management structures such as those illustrated in FIGS. 7E and 9D may be used.

The packaging embodiments illustrated in FIGS. 11C and 11D are merely examples meant to illustrate how the circuitry module 610C and the RF transistor amplifier die 210 may be coupled within a semiconductor package. It will be understood that multiple other possible configurations and/or orientations of the semiconductor package are possible without deviating from the present invention.

Figure 12C:
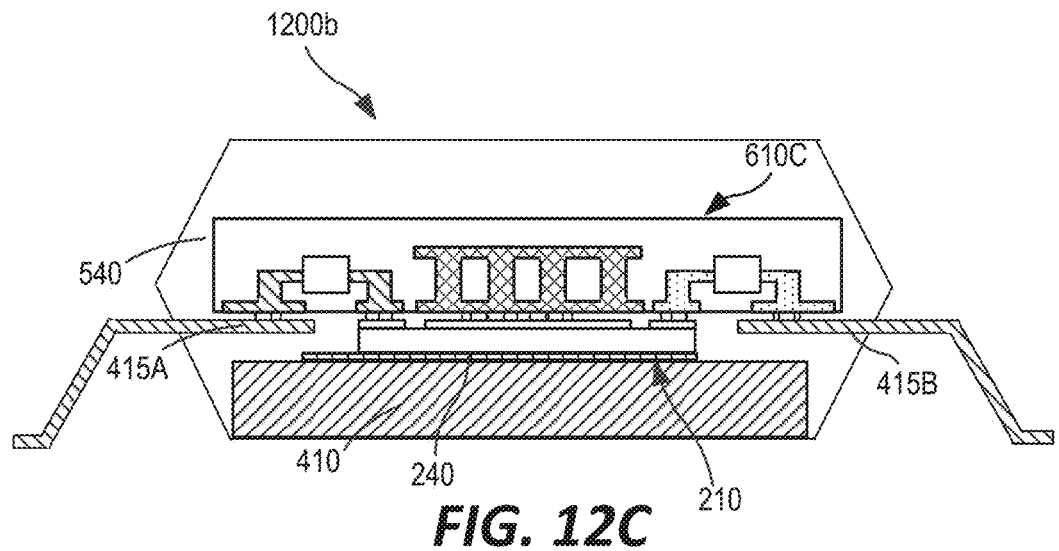

In some embodiments, the through vias 1115 and/or encapsulating material 1125 may be omitted. For example, FIGS. 12A to 12D are schematic cross-sectional views of additional embodiments of RF transistor amplifier die 210 coupled to circuitry module 610C, according to some embodiments of the present invention. As illustrated in FIG. 12A, the circuitry module 610C may be substantially similar to that of FIGS. 11A to 11D and, as such, a duplicate description thereof will be omitted. The embodiment of FIG. 12A, for example, may omit the encapsulating material 1125, through vias 1115, and/or the gate/drain connections 1182, 1184 and directly expose the gate lead 682C and the drain lead 684C. Though FIG. 12A illustrates that all of the encapsulating material 1125 is removed, it will be understood that, in some embodiments, some encapsulating material 1125 may be present. For example, in some embodiments, encapsulating material 1125 may be on portions of the RF transistor amplifier die 210 and the circuitry module 610C, but may expose the gate lead 682C and the drain lead 684C.

The embodiments illustrated in FIG. 12A may be utilized in multiple packaging configurations. FIGS. 12B and 12C illustrate the use of packaging similar to that discussed herein with respect to FIGS. 5A to 5C, 8A, 8B, 10A, and 10B. For example, the circuitry module 610C and the RF transistor amplifier die 210 may be placed in an open-cavity semiconductor package 1200a (FIG. 12B) or an OMP package 1200b (FIG. 12C). Elements in FIGS. 12B and 12C of the semiconductor package 1200a and semiconductor package 1200b that are similar to those previously discussed with respect to FIGS. 5A to 5C, 8A, 8B, 10A, and 10B will be omitted for brevity. In some embodiments, the gate lead 682C may be coupled to gate lead 415A by a bonding element (e.g., solder balls and/or bumps 320) and the drain lead 684C may also be coupled to drain lead 415B. It will be understood that multiple other possible configurations and/or orientations of the semiconductor package are possible without deviating from the present invention.

Figure 12D:
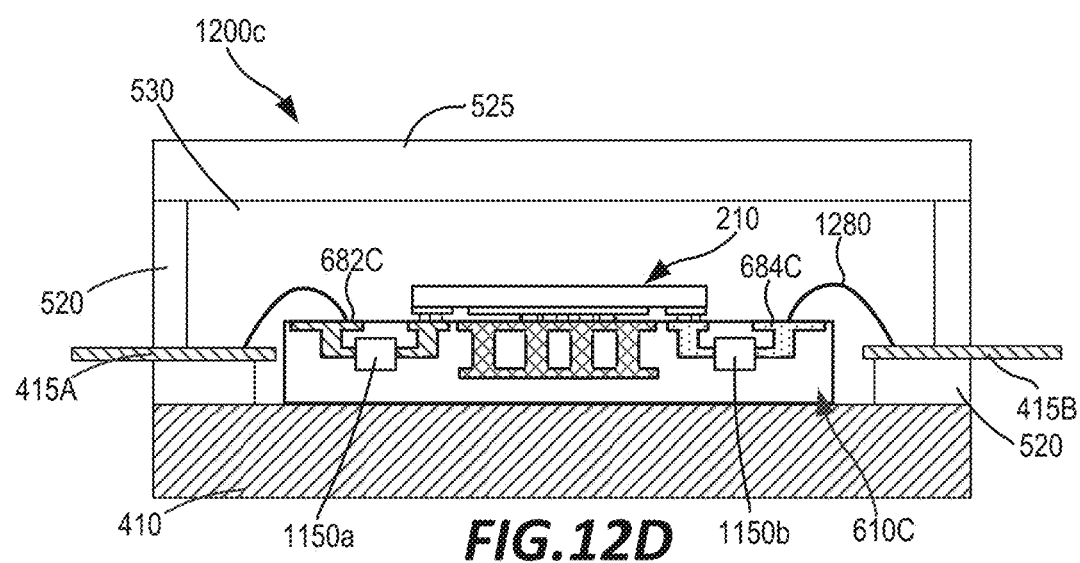

Though many of the embodiments described herein have reduced and/or omitted wire bonds, it will be understood that the present invention may still improve configurations utilizing wire bonds. For example, FIG. 12D illustrates a semiconductor package 1200c utilizing circuitry module 610C that utilizes wire bonds. Referring to FIG. 12D, a semiconductor package 1200c may be, for example, an open-air or open-cavity package. The semiconductor package 1200c may include a carrier substrate 410, sidewalls 520, and a lid 525. The carrier substrate 410, sidewalls 520, and lid 525 may define an internal cavity 530. The RF transistor amplifier die 210 and circuitry module 610C may be disposed inside the internal cavity 530.

The leads 415A, 415B may be configured to extend through the sidewalls 520, though the present invention is not limited thereto. In some embodiments, the circuitry module 610C may be disposed on the carrier substrate 410 and the leads 415A, 415B, and the RF transistor amplifier die 210 may be disposed on the circuitry module 610C. The leads 415A, 415B may be coupled to the circuitry module 610C using, for example, wire bonds 1280. For example, the lead 415a may be coupled to gate lead 682C and lead 415b may be coupled to drain lead 684C. Though the semiconductor package 1200c utilizes wire bonds 1280, it still benefits from the direct connection between the RF transistor amplifier die 210 and the circuitry modules 610C. Moreover, the circuitry module 610C incorporates the first and second circuit elements 1150a, 1150b that may allow for additional internalized functionality, such as harmonic termination and/or input/output impedance matching. In addition, the use of the circuitry modules 610C allows for greater flexibility in that different performance characteristics (e.g., to address harmonics at different frequencies, different impedances, etc.) may be achieved simply by swapping circuitry modules 610C.

While FIG. 12D utilizes the circuitry module 610C, it will be understood that the wire bonds 1280 may be incorporated into other semiconductor packaging configurations utilizing any of the circuitry modules and/or RF transistor amplifiers described herein.

The embodiments described herein provide an improved RF transistor amplifier and improved packaging incorporating such an RF transistor amplifier. By avoiding and/or reducing the use of back side vias, some embodiments of the present invention provide for improved thermal management of a power amplifier. Moreover, by locating the contacts of the power amplifier on a same side of the device, interconnect and circuitry modules may be utilized which may reduce the need for wire bonding. As a result, the RF transistor amplifier and associated package may exhibit improved performance and thermal properties over conventional devices. The benefits of the direct bonding provided by embodiments of the present invention are reduction of form factor, low electrical resistance, as well as improvement of communication speed.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A transistor amplifier, comprising:
a group III-nitride based amplifier die comprising a gate terminal, a drain terminal, and a source terminal on a first surface of the amplifier die; and
an interconnect structure electrically bonded to the gate terminal, drain terminal and source terminal of the amplifier die on the first surface of the amplifier die and electrically bonded to an input path and output path of the transistor amplifier by respective conductive bonding elements that are external to the amplifier die,
wherein the interconnect structure comprises a circuitry module including gate, drain, and source connection pads having respective surfaces that are exposed at a first side of the circuitry module facing the first surface of the amplifier die, and the respective surfaces of the gate, drain, and source connection pads are electrically bonded to the gate, drain, and source terminals, respectively, by the respective conductive bonding elements.

2. The transistor amplifier of claim 1, wherein the circuitry module comprises at least part of harmonic terminating circuitry, matching circuitry, splitting circuitry, combining circuitry, and/or biasing circuitry.

3. The transistor amplifier of claim 2, wherein the transistor amplifier further comprises:
an input connection;
an output connection; and
a ground connection,
wherein the gate connection pad is electrically coupled to the input connection, the drain connection pad is electrically coupled to the output connection, and the source connection pad is electrically coupled to the ground connection.

4. The transistor amplifier of claim 1, wherein the amplifier die further comprises a second surface that is opposite the first surface,
wherein the transistor amplifier further comprises a carrier substrate, and
wherein the amplifier die is thermally coupled to the carrier substrate on the second surface of the amplifier die.

5. The transistor amplifier of claim 1, wherein the circuitry module comprises a second side opposite the first side,
wherein the input path comprises an input metal lead and the output path comprises an output metal lead, and
wherein the input metal lead and the output metal lead are electrically bonded on the first side or the second side of the circuitry module.

6. The transistor amplifier of claim 1, wherein the transistor amplifier is at least partially encapsulated.

7. A radio frequency ("RF") transistor amplifier comprising:
a group III-nitride-based RF transistor amplifier die having a first major surface, the RF transistor amplifier die comprising a gate terminal, a drain terminal and a source terminal on the first major surface;
an interconnect structure comprising a circuitry module electrically bonded to the gate terminal, drain terminal and source terminal on the first major surface of the RF transistor amplifier, the circuitry module comprising a gate lead connection pad, a drain lead connection pad, and a source connection pad having respective surfaces are exposed at a first side of the circuitry module facing the first major surface of the RF transistor amplifier die, wherein the gate lead connection pad is electrically coupled to the gate terminal, the source connection pad is electrically coupled to the source terminal, and the drain lead connection pad is electrically coupled to the drain terminal at the respective surfaces by respective conductive bonding elements that are external to the RF transistor amplifier die;
an input lead extending from outside the RF transistor amplifier and electrically coupled to the gate lead connection pad; and an output lead extending from outside the RF transistor amplifier and electrically coupled to the drain lead connection pad.

8. The RF transistor amplifier of claim 7, wherein the circuitry module comprises a first side adjacent the first major surface of the RF transistor amplifier die and a second side opposite the first side, and
wherein the circuitry module comprises one or more circuit elements that are coupled between the gate terminal and the input lead and/or between the drain terminal and the output lead.

9. The RF transistor amplifier of claim 8, wherein the one or more circuit elements are mounted on the first side and/or the second side of the circuitry module.

10. The RF transistor amplifier of claim 8, wherein the one or more circuit elements are formed within the circuitry module.

11. The RF transistor amplifier of claim 8, wherein the input lead and/or the output lead are coupled to the first side and/or the second side of the circuitry module.

12. The RF transistor amplifier of claim 7, further comprising a coupling element between the RF transistor amplifier die and the circuitry module, the coupling element having a bottom surface adjacent the first major surface of the RF transistor amplifier die and a top surface opposite the bottom surface,
wherein the top surface of the coupling element comprises a gate connection pad configured to be connected to a first interconnection pad of the circuitry module, a drain connection pad configured to be connected to a second interconnection pad of the circuitry module, and a source connection pad configured to be connected to a third interconnection pad of the circuitry module.

13. The RF transistor amplifier of claim 7, wherein the circuitry module comprises an input matching circuit and/or an output matching circuit.

14. The RF transistor amplifier of claim 7, wherein the RF transistor amplifier die comprises a high electron mobility transistor (HEMT) or a laterally-diffused metal-oxide semiconductor (LDMOS) transistor.

15. A transistor amplifier, comprising:
a transistor amplifier die comprising a gate terminal, a drain terminal and a source terminal on a first surface of the transistor amplifier die;
an input lead extending from outside the transistor amplifier die and electrically coupled to the gate terminal;
an output lead extending from outside the transistor amplifier and electrically coupled to the drain terminal; and
a circuitry module external to the transistor amplifier die, the circuitry module comprising gate, drain, and source connection pads having respective surfaces that are exposed at a first side of the circuitry module facing the first surface of the transistor amplifier die, and the respective surfaces of the gate, drain, and source connection pads are electrically bonded to the gate, drain, and source terminals, respectively, by respective conductive bonding elements that are external to the transistor amplifier die,
wherein the input and output leads are electrically coupled to the gate and drain terminals by the circuitry module,
wherein a first electrical path from the input lead to the gate terminal is free of bond wires, and
wherein a second electrical path from the output lead to the drain terminal is free of bond wires.

16. The transistor amplifier of claim 15, further comprising a coupling element that is electrically coupled between the circuitry module and the gate terminal.

17. The transistor amplifier of claim 15, further comprising a bonding layer between the input lead and the circuitry module.

18. The transistor amplifier of claim 15, further comprising a circuit element electrically coupled to the circuitry module,
wherein the circuit element is on a side of the circuitry module that is opposite the transistor amplifier die.

19. The transistor amplifier of claim 15, wherein the transistor amplifier die comprises a plurality of unit cell transistors that are electrically connected in parallel, the unit cell transistors comprising respective gate fingers coupled to a gate manifold, respective drain fingers coupled to a drain manifold, and respective source fingers,
wherein the gate terminal is electrically coupled to the gate manifold, and
wherein the drain terminal is electrically coupled to the gate manifold.

20. The transistor amplifier of claim 19, further comprising a plurality of conductive patterns between the gate manifold and the gate terminal.

21. The transistor amplifier of claim 15, further comprising a carrier substrate, wherein the carrier substrate is on a second surface of the transistor amplifier die.

* * * * *

UNITED STATES PATENT AND TRADEMARK OFFICE
CERTIFICATE OF CORRECTION

| | |
|---|---|
| PATENT NO. | : 11,670,605 B2 |
| APPLICATION NO. | : 16/906610 |
| DATED | : June 6, 2023 |
| INVENTOR(S) | : Noori et al. |

It is certified that error appears in the above-identified patent and that said Letters Patent is hereby corrected as shown below:

In the Specification

Column 18, Line 4: Please correct "AlxGapxN" to read --$Al_xGa_{1-x}N$--

Column 20, Line 23: Please correct "21" to read --2I--

In the Claims

Column 45, Line 66, Claim 1: Please correct "drain terminal and" to read --drain terminal, and--

Column 46, Line 48, Claim 7: Please correct "drain terminal and" to read --drain terminal, and--

Signed and Sealed this
Fifteenth Day of August, 2023

Katherine Kelly Vidal
*Director of the United States Patent and Trademark Office*